United States Patent
Mayer et al.

(10) Patent No.: US 7,947,163 B2
(45) Date of Patent: May 24, 2011

(54) PHOTORESIST-FREE METAL DEPOSITION

(75) Inventors: Steven T. Mayer, Lake Oswego, OR (US); John Stephen Drewery, Santa Clara, CA (US); Eric G. Webb, Tigard, OR (US)

(73) Assignee: Novellus Systems, Inc., San Jose, CA (US)

( * ) Notice: Subject to any disclaimer, the term of this patent is extended or adjusted under 35 U.S.C. 154(b) by 822 days.

(21) Appl. No.: 11/890,541

(22) Filed: Aug. 6, 2007

(65) Prior Publication Data

US 2009/0277801 A1 Nov. 12, 2009

Related U.S. Application Data

(62) Division of application No. 11/827,800, filed on Jul. 13, 2007.

(60) Provisional application No. 60/832,534, filed on Jul. 21, 2006, provisional application No. 60/836,711, filed on Aug. 9, 2006.

(51) Int. Cl.
  *C25F 3/14* (2006.01)
(52) U.S. Cl. .................... 205/667; 205/668
(58) Field of Classification Search .............. 205/667, 205/668
  See application file for complete search history.

(56) References Cited

U.S. PATENT DOCUMENTS

| | | | |
|---|---|---|---|
| 2,540,602 A | 2/1951 | Thomas et al. | |
| 2,708,181 A | 5/1955 | Holmes et al. | |
| 2,965,556 A | 12/1960 | Damgaard | |
| 3,328,273 A | 6/1967 | Creutz et al. | |
| 3,448,023 A | 6/1969 | Bell | |
| 3,637,468 A | 1/1972 | Icxi et al. | |
| 3,779,887 A | 12/1973 | Gildone | |
| 3,833,486 A | 9/1974 | Nobel et al. | |
| 3,959,089 A | 5/1976 | Watts | |
| 4,024,029 A | 5/1977 | Rain et al. | |
| 4,080,513 A | 3/1978 | Cuneo et al. | |
| 4,110,176 A | 8/1978 | Creutz et al. | |
| 4,339,319 A | 7/1982 | Aigo | |
| 4,391,684 A | 7/1983 | Goddard | |
| 4,430,173 A | 2/1984 | Boudot et al. | |
| 4,431,501 A | 2/1984 | Leppänen | |

(Continued)

FOREIGN PATENT DOCUMENTS

CN 1209649 3/1999

(Continued)

OTHER PUBLICATIONS

Contolini et al., "Electrochemical Planarization for Multilevel Metallization," pp. 2503-2510 (Sep. 1994).

(Continued)

*Primary Examiner* — Alexa D. Neckel
*Assistant Examiner* — Nicholas A. Smith
(74) *Attorney, Agent, or Firm* — Knobbe, Martens, Olson & Bear, LLP

(57) ABSTRACT

Selectively accelerated or selectively inhibited metal deposition is performed to form metal structures of an electronic device. A desired pattern of an accelerator or of an inhibitor is applied to the substrate; for example, by stamping the substrate with a patterned stamp or spraying a solution using an inkjet printer. In other embodiments, a global layer of accelerator or inhibitor is applied to a substrate and selectively modified in a desired pattern. Thereafter, selective metal deposition is performed.

21 Claims, 25 Drawing Sheets

U.S. PATENT DOCUMENTS

| | | |
|---|---|---|
| 4,466,864 A | 8/1984 | Bacon et al. |
| 4,609,450 A | 9/1986 | Seimiya et al. |
| 4,610,772 A | 9/1986 | Palnik |
| 4,713,149 A | 12/1987 | Hoshino |
| 4,948,474 A | 8/1990 | Miljkovic |
| 4,954,142 A | 9/1990 | Carr et al. |
| 4,975,159 A | 12/1990 | Dahms |
| 5,024,735 A | 6/1991 | Kadija |
| 5,055,425 A | 10/1991 | Leibovitz et al. |
| 5,084,071 A | 1/1992 | Nenadic et al. |
| 5,096,550 A | 3/1992 | Mayer et al. |
| 5,151,168 A | 9/1992 | Gilton et al. |
| 5,158,860 A | 10/1992 | Gulla et al. |
| 5,171,412 A | 12/1992 | Talieh et al. |
| 5,174,886 A | 12/1992 | King et al. |
| 5,236,574 A | 8/1993 | Oshima et al. |
| 5,256,565 A | 10/1993 | Bernhardt et al. |
| 5,270,279 A | 12/1993 | Shiraishi et al. |
| 5,292,399 A | 3/1994 | Lee et al. |
| 5,316,974 A | 5/1994 | Crank |
| 5,354,490 A | 10/1994 | Yu et al. |
| 5,429,733 A | 7/1995 | Ishida |
| 5,436,504 A | 7/1995 | Chakravorty et al. |
| 5,466,161 A | 11/1995 | Yumibe et al. |
| 5,472,592 A | 12/1995 | Lowery |
| 5,486,234 A | 1/1996 | Contolini et al. |
| 5,486,282 A | 1/1996 | Datta et al. |
| 5,516,412 A | 5/1996 | Andricacos et al. |
| 5,558,568 A | 9/1996 | Talieh et al. |
| 5,567,300 A | 10/1996 | Datta et al. |
| 5,575,206 A | 11/1996 | Szyszko |
| 5,575,706 A | 11/1996 | Tsai et al. |
| 5,605,637 A | 2/1997 | Shan et al. |
| 5,681,215 A | 10/1997 | Sherwood et al. |
| 5,692,947 A | 12/1997 | Talieh et al. |
| 5,700,366 A | 12/1997 | Steblianko et al. |
| 5,714,707 A | 2/1998 | Ruia |
| 5,723,387 A | 3/1998 | Chen |
| 5,755,859 A | 5/1998 | Brusic et al. |
| 5,762,544 A | 6/1998 | Zuniga et al. |
| 5,770,095 A | 6/1998 | Sasaki et al. |
| 5,772,833 A | 6/1998 | Inazawa et al. |
| 5,773,364 A | 6/1998 | Farkas et al. |
| 5,793,272 A | 8/1998 | Burghartz et al. |
| 5,795,215 A | 8/1998 | Guthrie et al. |
| 5,807,165 A | 9/1998 | Uzoh et al. |
| 5,833,820 A | 11/1998 | Dublin |
| 5,840,629 A | 11/1998 | Carpio |
| 5,846,335 A | 12/1998 | Maekawa et al. |
| 5,858,813 A | 1/1999 | Scherber et al. |
| 5,862,605 A | 1/1999 | Horie et al. |
| 5,863,412 A | 1/1999 | Ichinose et al. |
| 5,884,990 A | 3/1999 | Burghartz et al. |
| 5,897,375 A | 4/1999 | Watts et al. |
| 5,911,619 A | 6/1999 | Uzoh et al. |
| 5,922,091 A | 7/1999 | Tsai et al. |
| 5,930,669 A | 7/1999 | Uzoh |
| 5,933,753 A | 8/1999 | Simon et al. |
| 5,954,997 A | 9/1999 | Kaufman et al. |
| 5,968,333 A | 10/1999 | Nogami et al. |
| 5,976,331 A | 11/1999 | Chang et al. |
| 5,985,123 A | 11/1999 | Koon |
| 6,001,235 A | 12/1999 | Arken et al. |
| 6,004,880 A | 12/1999 | Liu et al. |
| 6,027,631 A | 2/2000 | Broadbent |
| 6,063,506 A | 5/2000 | Andricacos et al. |
| 6,066,030 A | 5/2000 | Uzoh |
| 6,071,388 A | 6/2000 | Uzoh |
| 6,074,544 A | 6/2000 | Reid et al. |
| 6,074,546 A | 6/2000 | Sun et al. |
| 6,090,239 A | 7/2000 | Liu et al. |
| 6,103,085 A | 8/2000 | Woo et al. |
| 6,107,186 A | 8/2000 | Erb |
| 6,121,141 A | 9/2000 | Woo et al. |
| 6,132,587 A | 10/2000 | Jorné et al. |
| 6,136,163 A | 10/2000 | Cheung et al. |
| 6,140,234 A | 10/2000 | Uzoh et al. |
| 6,143,155 A | 11/2000 | Adams et al. |
| 6,153,064 A | 11/2000 | Condra et al. |
| 6,156,167 A | 12/2000 | Patton et al. |
| 6,159,354 A | 12/2000 | Contolini et al. |
| 6,162,344 A | 12/2000 | Reid et al. |
| 6,162,728 A | 12/2000 | Tsao et al. |
| 6,176,992 B1 | 1/2001 | Talieh |
| 6,187,152 B1 | 2/2001 | Ting et al. |
| 6,210,554 B1 | 4/2001 | Kosaki et al. |
| 6,217,734 B1 | 4/2001 | Uzoh |
| 6,224,737 B1 | 5/2001 | Tsai et al. |
| 6,228,231 B1 | 5/2001 | Uzoh |
| 6,245,676 B1 | 6/2001 | Ueno |
| 6,251,235 B1 | 6/2001 | Talieh et al. |
| 6,251,236 B1 | 6/2001 | Stevens |
| 6,261,426 B1 | 7/2001 | Uzoh et al. |
| 6,270,646 B1 | 8/2001 | Walton et al. |
| 6,270,647 B1 | 8/2001 | Graham et al. |
| 6,284,121 B1 | 9/2001 | Reid |
| 6,287,968 B1 | 9/2001 | Yu et al. |
| 6,297,140 B1 | 10/2001 | Uzoh et al. |
| 6,300,250 B1 | 10/2001 | Tsai |
| 6,303,014 B1 | 10/2001 | Taylor et al. |
| 6,315,883 B1 | 11/2001 | Mayer et al. |
| 6,334,937 B1 | 1/2002 | Batz, Jr. et al. |
| 6,346,479 B1 | 2/2002 | Woo et al. |
| 6,353,623 B1 | 3/2002 | Munks et al. |
| 6,354,916 B1 | 3/2002 | Uzoh et al. |
| 6,355,153 B1 | 3/2002 | Uzoh et al. |
| 6,368,484 B1 | 4/2002 | Volant et al. |
| 6,375,823 B1 | 4/2002 | Matsuda et al. |
| 6,395,163 B1 | 5/2002 | Schneider et al. |
| 6,402,925 B2 | 6/2002 | Talieh |
| 6,413,388 B1 | 7/2002 | Uzoh |
| 6,413,403 B1 | 7/2002 | Lindquist et al. |
| 6,436,267 B1 | 8/2002 | Carl et al. |
| 6,440,295 B1 | 8/2002 | Wang |
| 6,444,110 B2 | 9/2002 | Barstad et al. |
| 6,471,847 B2 | 10/2002 | Talieh et al. |
| 6,482,307 B2 | 11/2002 | Ashjaee et al. |
| 6,482,656 B1 | 11/2002 | Lopatin |
| 6,497,800 B1 | 12/2002 | Talieh et al. |
| 6,506,103 B1 | 1/2003 | Ohmori et al. |
| 6,534,116 B2 | 3/2003 | Basol |
| 6,537,133 B1 | 3/2003 | Birang et al. |
| 6,600,229 B2 | 7/2003 | Mukherjee et al. |
| 6,610,190 B2 | 8/2003 | Basol et al. |
| 6,630,059 B1 | 10/2003 | Uzoh et al. |
| 6,638,411 B1 | 10/2003 | Mishima et al. |
| 6,653,226 B1 | 11/2003 | Reid |
| 6,676,822 B1 | 1/2004 | Talieh |
| 6,709,565 B2 | 3/2004 | Mayer et al. |
| 6,756,307 B1 | 6/2004 | Kelly et al. |
| 6,793,796 B2 | 9/2004 | Reid et al. |
| 6,833,063 B2 | 12/2004 | Basol |
| 6,848,970 B2 | 2/2005 | Manens et al. |
| 6,858,121 B2 | 2/2005 | Basol |
| 6,867,136 B2 | 3/2005 | Basol et al. |
| 6,869,515 B2 | 3/2005 | Cohen |
| 6,902,659 B2 | 6/2005 | Talieh |
| 6,905,588 B2 | 6/2005 | Uzoh et al. |
| 6,921,551 B2 | 7/2005 | Basol |
| 6,936,154 B2 | 8/2005 | Basol et al. |
| 6,942,780 B2 | 9/2005 | Basol et al. |
| 6,958,114 B2 | 10/2005 | Talieh et al. |
| 7,059,948 B2 | 6/2006 | Li |
| 7,090,763 B2 * | 8/2006 | Gottschling et al. .......... 205/667 |
| 7,147,766 B2 | 12/2006 | Uzoh et al. |
| 7,182,677 B2 | 2/2007 | Donohue et al. |
| 7,189,647 B2 | 3/2007 | Patton et al. |
| 7,211,174 B2 | 5/2007 | Basol et al. |
| 7,211,186 B2 | 5/2007 | Basol et al. |
| 7,220,166 B2 | 5/2007 | Lee et al. |
| 7,244,347 B2 | 7/2007 | Basol et al. |
| 7,282,124 B2 | 10/2007 | Talieh et al. |
| 7,309,413 B2 | 12/2007 | Talieh et al. |
| 7,311,811 B2 | 12/2007 | Talieh et al. |
| 7,329,335 B2 | 2/2008 | Talieh et al. |
| 7,341,649 B2 | 3/2008 | Talieh et al. |
| 7,404,886 B2 | 7/2008 | Basol |

| | | | |
|---|---|---|---|
| 7,405,163 B1 | 7/2008 | Drewery et al. | |
| 7,416,975 B2 | 8/2008 | Uzoh et al. | |
| 7,449,098 B1 | 11/2008 | Mayer et al. | |
| 7,449,099 B1 | 11/2008 | Mayer et al. | |
| 7,491,308 B2 | 2/2009 | Talieh et al. | |
| 7,517,444 B2 | 4/2009 | Basol | |
| 7,531,079 B1 | 5/2009 | Mayer et al. | |
| 7,531,463 B2 | 5/2009 | Koos et al. | |
| 7,550,070 B2 | 6/2009 | Basol et al. | |
| 7,560,016 B1 | 7/2009 | Mayer et al. | |
| 7,691,250 B2 * | 4/2010 | Mazur et al. | 205/668 |
| 2002/0130034 A1 | 9/2002 | Uzoh et al. | |
| 2003/0070930 A1 | 4/2003 | Talieh et al. | |
| 2003/0116440 A1 | 6/2003 | Guldi et al. | |
| 2003/0146089 A1 | 8/2003 | Basol | |
| 2004/0163950 A1 | 8/2004 | Emesh | |
| 2005/0126919 A1 * | 6/2005 | Kubota et al. | 205/125 |
| 2005/0279641 A1 | 12/2005 | Basol | |
| 2006/0006060 A1 | 1/2006 | Basol et al. | |
| 2006/0070885 A1 | 4/2006 | Uzoh et al. | |
| 2007/0141818 A1 | 6/2007 | Basol | |
| 2008/0003485 A1 * | 1/2008 | Krishnan et al. | 429/44 |
| 2008/0102251 A1 | 5/2008 | Basol | |
| 2009/0277867 A1 | 11/2009 | Mayer et al. | |
| 2009/0280243 A1 | 11/2009 | Mayer et al. | |
| 2009/0283499 A1 | 11/2009 | Mayer et al. | |

FOREIGN PATENT DOCUMENTS

| | | |
|---|---|---|
| DE | 2008664 | 9/1971 |
| DE | 4324330 | 2/1994 |
| EP | 751567 | 1/1997 |
| EP | 881673 | 12/1998 |
| EP | 930647 | 7/1999 |
| EP | 933812 | 8/1999 |
| EP | 1037263 | 9/2000 |
| EP | 1063696 | 12/2000 |
| EP | 1122987 | 8/2001 |
| EP | 1122989 | 8/2001 |
| FR | 2276395 | 1/1976 |
| JP | 11-238703 | 8/1999 |
| JP | 2000/208443 | 7/2000 |
| JP | 2001/291954 | 10/2001 |
| WO | WO 98/27585 | 6/1998 |
| WO | WO 00/26443 | 5/2000 |
| WO | WO 01/32362 | 5/2001 |

OTHER PUBLICATIONS

Kelly et al., "Leveling and Microstructural Effects of Additives for Copper Electrodeposition," Journal of Electrochemical Society, 146(7), pp. 2540-2545 (1999).

Madore et al., "Blocking Inhibitors in Catholic Leveling," I. Theoretical Analysis, pp. 3927-3942 (Dec. 1996).

Mikkola et al., "Investigation of the Roles of the Additive Components for Second Generation Copper Electroplating Chemistries Used for Advanced Interconnect Metalization," 2000 IEEE, IEEE Electron Devices Society, pp. 117-119 (Jun. 2000).

Reid et al., "Factors influencing damascene feature fill using copper PVD and electroplating," Solid State Technology, 7 pages (Jul. 2000).

Rubinstein et al., "Tampongalvanisieren in der Praxis, Teil 1," Galvanotechnik, vol. 79, No. 10, pp. 3263-3270 (1998).

Steigerwald et al., "Chemical Mechanical Planarization of Microelectronic Materials," A Wiley-Interscience Publication by John Wiley & Sons, pp. 212-222 (1997).

Steigerwald et al., "Pattern Geometry Effects in the Chemical-Mechanical Polishing of Inlaid Copper Structures," pp. 2842-2848 (Oct. 1994).

West et al., "Pulse Reverse Copper Electrodeposition in High Aspect Ratio Trenches and Vias," pp. 3070-3074 (Sep. 1998).

U.S. Appl. No. 09/671,800.

U.S. Appl. No. 11/544,957.

U.S. Appl. No. 11/893,374.

U.S. Appl. No. 12/785,976.

* cited by examiner

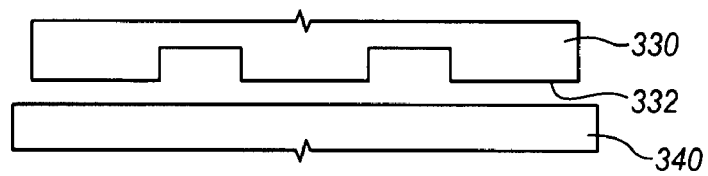
FIG. 8A
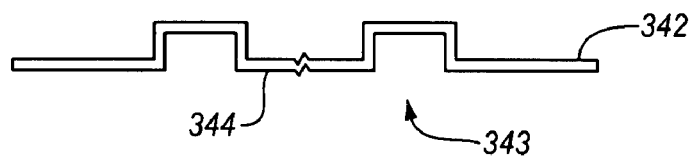
FIG. 8B
FIG. 9
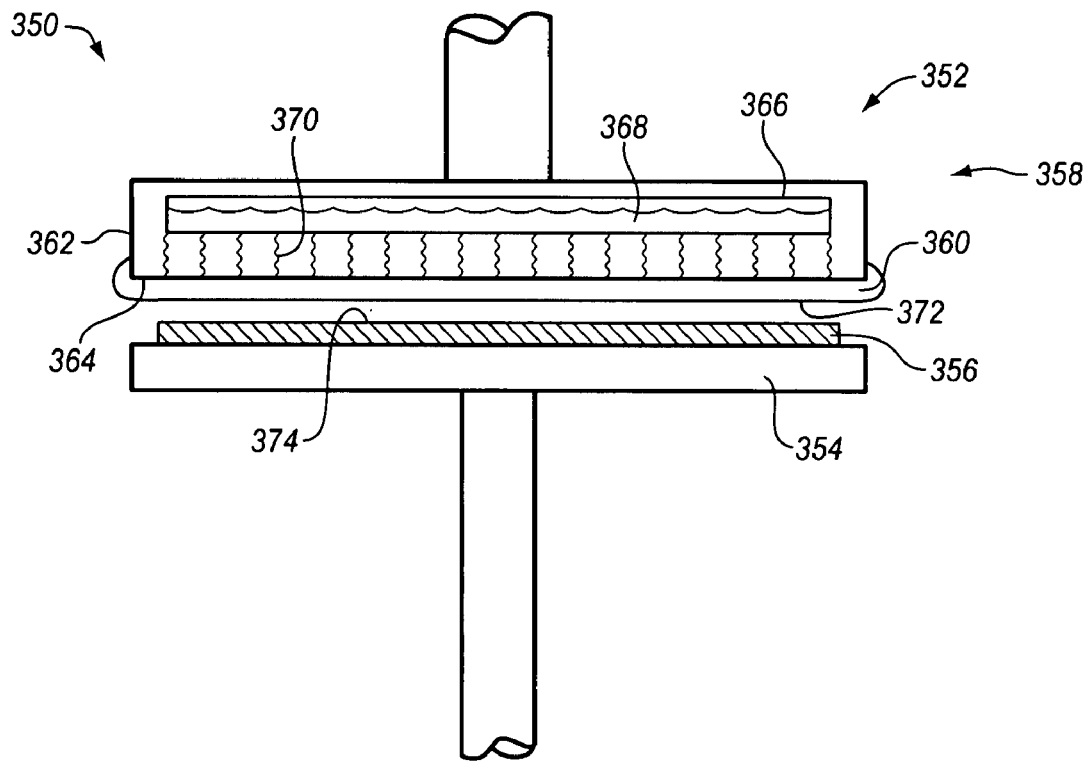

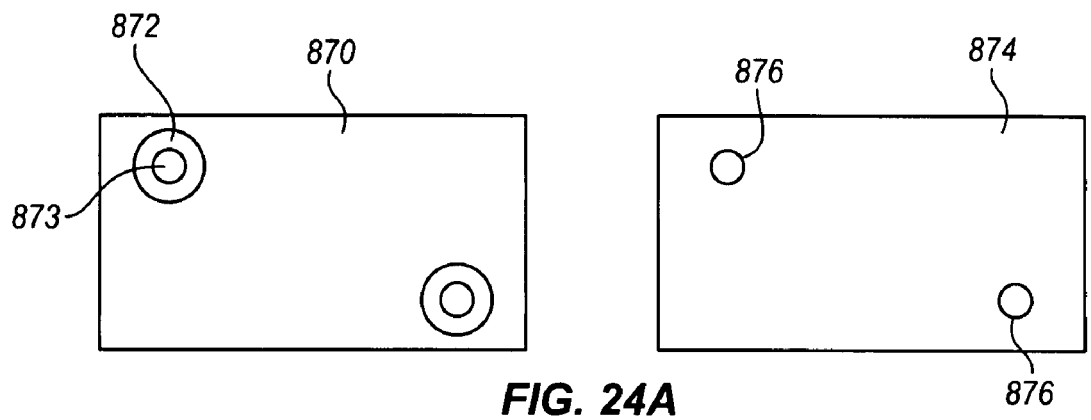
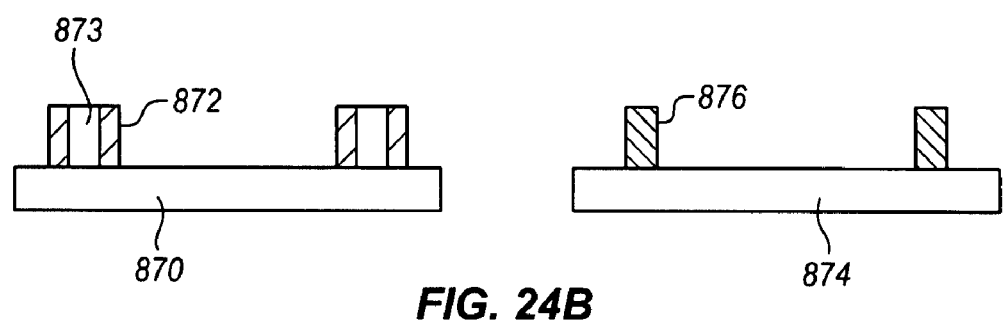
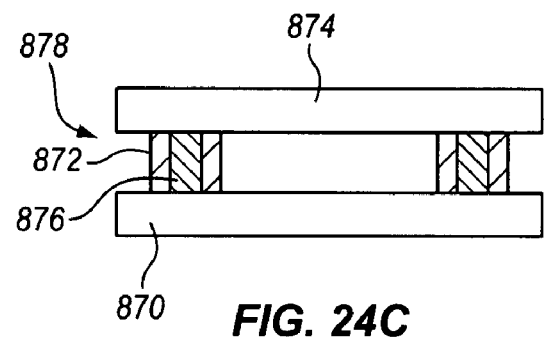

PHOTORESIST-FREE METAL DEPOSITION

RELATED APPLICATIONS

This application is a divisional application, claiming priority under 35 USC §120 and 37 CFR 1.53(b) of co-owned and co-pending U.S. patent application Ser. No. 11/827,800, filed Jul. 13, 2007, by Mayer et al., which claims the benefit under 35 USC 119 (e) of U.S. Provisional Application Ser. No. 60/832,534, filed Jul. 21, 2006, by Mayer et al., titled "Photoresist-Free Metal Deposition", and U.S. Provisional Application Ser. No. 60/836,711, filed Aug. 9, 2006, by Mayer et al., titled "Photoresist-Free Metal Deposition".

FIELD OF THE INVENTION

The invention relates in general to methods and systems for depositing material in patterns to form structures in electronic equipment, particularly for forming metal features in electronic equipment, and more particularly to the plating of metal wiring in integrated circuits, printed wiring boards and semiconductor packaging as well as to creating relevant structures for micro- and nano- electro-mechanical systems (MEMS and NEMS)

BACKGROUND OF THE INVENTION

Integrated circuits are formed on wafers by well-known processes and materials. These processes typically include the deposition of thin film layers by sputtering, organo-metallic decomposition, chemical vapor deposition, plasma vapor deposition, electrodeposition (electroplating) and other techniques. These layers are further processed by a variety of well-known etching technologies and subsequent deposition and polishing steps to provide a completed integrated circuit.

A crucial component of integrated circuits is the various wiring or metallization layers that interconnect the individual circuits. Conventional metal deposition techniques include physical vapor deposition, sputtering and evaporation, and chemical vapor deposition techniques. Also, integrated circuit and equipment manufacturers have developed electrochemical deposition techniques, (including electroless and electrolytic plating) to deposit primary conductor films on various semiconductors (e.g., Si, GaAs), ceramics, printed circuit boards and a variety of other suitable substrates.

Integrated circuit wiring layers traditionally contained aluminum and a plurality of other metal layers that are compatible with the aluminum. In 1997, IBM was the first to introduce copper damascene and dual damascene technology that facilitated a transition from aluminum to copper wiring layers. This technology demanded corresponding changes in process architecture, as well as new process technologies. Today, damascene processing is commonly used not only in the manufacture of integrated circuits, but also in memory fabrication; it is even displacing a variety of other back-end packaging applications, such as in printed circuit board manufacture.

For damascene integrated circuit and memory applications (where wiring is relatively close to the copper-sensitive silicon substrate), the conductive layers are typically deposited on a dielectric layer and typically comprise metals such as tantalum (Ta), tungsten (W), titanium (Ti), aluminum (Al), copper (Cu), and alloys thereof, and semiconductors, such as doped silicon (Si), doped polysilicon, and refractory metal silicides. The three dimensional structure consist of multiple dielectric layers with openings, or feature cavities, (vias and trenches) that are filled with conductive material that provide circuit paths through dielectric material within and between the various layers and and eventually to transistor circuit devices. After the deposition of metal at each level, the conductive layer is typically polished, and only the conductive material filling the feature cavities remains in the dielectric layer.

A typical damascene or dual damascene process flow scheme for fabricating copper interconnects, such as copper lines and vias, typically includes: forming a trench pattern on a layer dielectric layer using an etch-resistant photoresist; etching a trench pattern; removing the photoresist; forming a via pattern on a dielectric material using etch resistant photoresist; etching vias; removing resist; depositing a barrier (e.g., tantalum, tantalum nitride, combinations of these) and a copper seed layer (e.g., using plasma vapor deposition, PVD); electroplating copper to fill the etched feature cavities; and polishing copper and barrier off the wafer face leaving copper-filled electrically isolated interconnect circuitry.

As the number of levels in an interconnect technology increases, the stacking of additional layers produces more rugged and complex topography. Compounding this problem, electroplating bath additives are now commonly utilized to promote rapid "bottom-up" filling of high aspect-ratio features in damascene copper electroplating processes to ensure complete void-free metal fill of high aspect ratio features (features deeper than they are wide). Baths with good "bottom-up" filling characteristics fill high aspect ratio features more rapidly and without creating voids or seams when compared to baths with less effective combinations of such additives. While the action of plating bath additives is still a subject of active investigation, it is now generally accepted that bottom-up filling of high aspect ratio features is controlled by the geometrical concentration of a strongly adsorbed plating bath "accelerator" bound within and on the walls of the feature. As a metal film within the feature grows, the surface area decreases within the feature and concentrates the adsorbate, lowering the resistance to charge transfer in the feature compared to the flatter exposed regions of the surface, thereby creating an "acceleration" of the plating rate within the recessed feature region. (See, for example, J. Osterwald and J. Schulz-Harder, Galvanotechnik, 66, 360 (1975), J. Osterwald, Oberflache-Surface, 17, 89, (1976), J. Reid and S. Mayer, in Advanced Metallization Conference, 1999, M. E. Gross, T. Gessner, N. Kobayashi, and Y. Yauda, Editors, pg 53, MRS, Warrendale, Pa. (2000), A. C. West, S. Mayer, and J. Reid, Electrochem. Solid-State Letters, 4, C50, (2001), T. P. Moffat, D. Wheeler, and D. Josell, "Superfilling and the Curvature Enhanced Accelerator Coverage Mechanism, The Electrochemical Society Interface, Winter, 2004). Therefore, baths with good "bottom-up" filling characteristics typically fill smaller (higher aspect ratio) features more rapidly than larger (lower aspect ratio) features because their surface to volume ratio is larger. In some cases (e.g., plating baths with superior bottom-up filling characteristics and little or no leveling additives), plating continues at an accelerated rate after completing the small-feature filling stage. When many high-aspect ratio features are located in close proximity, the amount of adsorbed accelerator originally associated with the high surface area of that region remains after the features have filled. Hence, growth continues at an accelerated rate beyond the point of features-fill and into a period in which metal between the features has merged. When this happens, a macroscopic raised area forms over the entire region of underlying high aspect ratio features, initially as a series of thicker metallized bumps, and after they merge, as a raised plateau. This formation of raised topography is also termed "feature overplating" or "momentum plating".

The use of advanced "bottom-up" electrofilling techniques with wafers having low and high aspect-ratio features has created a problem of deposited metal surfaces with a wide range of topography, that is, topography containing a large range or aspect ratios of both recessed and raised areas. Commonly, features vary in width by two to three orders of magnitude on a single layer. As a specific example, a 0.5 µm-deep (thick dielectric) level can have feature widths of from 0.1 µm to 100 µm. Therefore, while electroplating is the preferred method of metallization, various aspects of improved plating regimens create challenging topography for subsequent planarization A principal objective of damascene circuit interconnect fabrication is to create metal isolated by and embedded in a dielectric medium. The preferential filling of recessed features in modern bottom-up electroplating techniques requires careful control of process conditions. U.S. Pat. No. 6,946,065, titled "Process for Electroplating Metal into Microscopic Recessed Features", issued Sep. 20, 2005 to Mayer et. al., which is hereby incorporated by reference for all purposes, teaches techniques for reducing or mitigating the formation of seams and/or voids in electroplating the interior regions of microscopic recessed features. For the most part, prior processes are largely isotropic and do not preferentially fill and planarize low-aspect-ratio features and therefore they require significant excess metal deposition ("overburden.") Overburden is the additional copper deposited on the substrate to ensure that all low-aspect-ratio features are completely filled (essentially in an isotropic fashion) to the plane of a base layer, that is, to the plane of the isolating dielectric surface (the "field"). Since the preferential "bottom-up" filling generally does not occur in low-aspect-ratio features, the surface of the overburden above low-aspect-ratio features typically follows the contours within the dielectric and of the underlying low-aspect-ratio features. In most cases, the overburden on field regions is slightly thicker than the thickness of the damascene dielectric layer, typically on the order of 1.2 times the depth of the deepest feature. So, for example, a damascene structure that has 0.5 micrometers (µm) deep features typically requires an overburden of at least approximately 0.7 to 0.8 micrometers.

Overburden is undesirable for a number of reasons. It requires deposition of considerable amounts of excess copper over the field that is essentially wasted andit requires extra effort associated with removing the overburden material. Thus, overburden represents additional materials costs (excess copper deposited and removed), as well as decreased throughput and productivity. In current processes, overburden is removed by a planarization technique such as chemical mechanical polishing (CMP), electrochemical chemical polishing (eCMP), or electropolishing. CMP and eCMP are particularly expensive processes that generally use corrosive chemical and slurry formulations on large (wafer scale or larger) pads to polish the surface of the integrated circuit substrate. Such pad-rubbing processes are often difficult to control and the polishing end-point can be difficult to detect. The high equipment cost, waste handling cost, and low throughput contribute to the overall expense of CMP and eCMP. Also, with the introduction of porous low-k dielectrics in semiconductor devices, modification of traditional CMP and even eCMP processes is required, as current methods can crack and/or delaminate low-k materials, which typically have a very low compression strength and extreme fragility. Furthermore, none of these techniques achieve perfect planarization at all length scales.

Relatively large copper lines in electronic equipment, for example, in a printed wiring board ("PWB"), are typically formed by a process including lamination, photolithography, screen-printing, and wet etching.

Another method of patterning copper lines, which was also commonly used for making small lines until the invention of the damascene process, is through-resist plating. In this technique, a metal seed layer is first deposited to cover completely a base plane substrate, resist is applied over the seed layer, and areas to be plated-up are optically exposed and developed (wherein the resist is removed to expose copper seed at the base). Thereafter, during electroplating, metal is deposited only in the exposed and developed areas. In such a technique, copper can be plated controllably only to the thickness of the resist. If additional copper is plated, it is no longer confined by the walls of the lines defined by the resist, and will tend to grow laterally and encroach into other lines due to the loss of confinement and due to plating both upwards and sideways. Also, in such techniques, the plating solution contacts the resist. As a result of leaching of organic electroactive contamination from the resist, the lifetime of the plating solution is often reduced, adding cost to the overall process. A damascene process is well suited for producing lines of small depth (or height or thickness) in features having high aspect ratio, but is prohibitively expensive for thick copper layers due to the high cost of removing copper from the insulating dielectric surface ("field"). In a damascene process, copper plates onto the field area to a thickness corresponding to the desired height (or thickness) of the wiring line, and all of this excess copper must be removed by chemical mechanical planarization in order to form the copper line.

FIGS. 1A-1F depict schematically a sequence of process phases of a generalized method of forming a metal feature embedded in a dielectric layer using conventional photoresist techniques of the prior art. FIG. 1A depicts a cross-sectional view 10 of substrate section 12 including base dielectric layer 14 covered by photoresist layer 16. FIG. 1B depicts an intermediate stage 20 of fabrication after patterning and etching of photoresist 16 to expose surface portion 22 of dielectric layer 14. FIG. 1C depicts an intermediate stage 30 after etching of exposed area 22 (FIG. 1B) to form recessed cavity 32 in dielectric layer 14. FIG. 1D depicts further intermediate stage 40 in which the remnants of resist layer 16 have been removed from substrate section 12 prior to metallization processes. It is understood that in some methods, metallization processes are conducted without removing resist. FIG. 1E depicts further intermediate stage 50 in which metal seed layer 52 and electroplated copper layer 54 have been deposited on substrate section 12 using techniques known in the art. FIG. 1F depicts process stage 60 in which field metal has been etched and polished from substrate section 12 resulting in metal feature 62 embedded in base dielectric layer 14.

None of the techniques described is ideally suited to the production of small or large metal features, such as copper lines, interlevel connections, metal pads, and device connectors, and each technique incurs considerable costs associated with consumed material and waste disposal. Therefore, it would be desirable to have a technique for depositing copper or other metal wiring that would create the desired wiring without the need to add, pattern and remove dielectric or photoresist layers, and without the need to remove a large amount of copper (or other metal), and that would avoid electrolyte contamination associated with through-resist plating, allowing for longer plating bath lifetimes. Preferably, a technique for forming large copper lines would not have to be defined through etching of vias and trenches in a dielectric.

Osterwald et al., in "Wirkung von Badzusatzen bei der kathodischen Metallabscheidung", *Galvanotechnik*, 66, Nr. 5, pp. 360-365 (1975), Leuze Verlag, Saulgau, Germany, and "Leveling and Roughening by Inhibitors and Catalysts" Oberfläche-Surface, 17, 89, (1976), teach an additive in solution that absorbs onto a cathode surface. The absorbed additive acts as a catalyst of metal deposition thereby increasing a metal deposition rate. The relative catalytic effect is related to the surface concentration of the adsorbate. Due to geometrical considerations, when the catalyzing additive is absorbed onto a surface having a recess, the surface concentration of catalyzing additive in the recess increases compared to its concentration in non-recessed areas as metal deposition proceeds. As a result, the rate of metal deposition in the recess becomes greater than the metal deposition rate at non-recessed areas. This leads to relative planarization of the deposited metal compared to topography resulting from metal plating on a substrate without adsorbed catalyzing additive. Later, others confirmed that specific chemical additives exhibit this behavior, and this behavior is conceptually useful in interpreting, modeling and controlling preferential filling of small damascene features. (See, for example, J. Reid and S. Mayer, in *Advance Metallization Conference Proceedings*, 1999, p. 53; A. C. West, S. Mayer, and J. Reid, *Electrochem. Solid-State Lett.*, 4, C50, [2001]; T. P. Moffat, D. Wheeler, W. H. Huber, and D. Josell, *Electrochem Solid State Lett*, 4, C26, [2001]; and T. P. Moffat, D. Wheeler, and D. Josell, *Electrochemical Society Interface*, p. 46, Winter 2004). U.S. patent application Ser. No. 10/739,822, filed Dec. 17, 2003, by Mayer et al., having the title "Method for Planar.Electroplating", teaches a method of selectively attaching a plating accelerator to recessed regions of the dielectric layer before electroplating to achieve selectively accelerated plating (SAP) of metal in the recessed regions.

There exists a need for improved technology for depositing conductive wiring embedded in dielectric substrates having varying feature sizes, particularly having both very narrow (submicron) and very wide (on the order of 100 μm) feature widths.

SUMMARY OF THE INVENTION

The invention helps to solve some of the problems mentioned above by providing systems, apparatuses and methods for depositing metal during fabrication of electronic devices; for example, integrated circuit wiring and back-end metallization. Embodiments in accordance with the invention utilize one or more techniques, such as selective application of a deposition accelerator or deposition inhibitor, selective accelerator removal (SAR) or selective inhibitor removal, selectively inhibited plating, selectively accelerated plating (SAP), and selective anodic dissolution of a substrate surface to produce an intermediate structure characterized by a metal layer having an "embossed" structure; that is, a metal layer with metal protrusions. The metal protrusions in some embodiments preferably have substantially the same height. Thereafter, the metal is partially removed (preferably isotropically) to isolate metal features and form a desired metal pattern on a dielectric base layer.

Embodiments in accordance with the invention reduce or eliminate standard repetitive surface patterning processing, such as photoresist processing, thereby reducing or eliminating the associated material and equipment expenses, processing time, and environmental costs.

Some embodiments in accordance with the invention utilize membrane-mediated elements to achieve electrochemical oxidization and planarization. Membrane-mediated elements also help to avoid well-known terminal effect phenomena (ohmic-resistance current distribution problems in thin metal layers).

Methods in accordance with the invention allow use of relatively simple, low-cost wet-etching techniques after metal plating that selectively remove remains of metal (e.g., copper) and typically stop at a dielectric or a barrier/etch-stop layer. One basic embodiment of a method in accordance with the invention of forming a metal structure on a substrate comprises applying selectively a pre-deposition agent to the substrate to form a pattern of the pre-deposition agent, while simultaneously attaching substantially none of the pre-deposition agent to the substrate outside of the pattern. This forms a treated pattern region containing the pre-deposition agent and a non-treated region outside of the pattern. Thereafter, metal is deposited on the substrate. The pre-deposition agent in the treated pattern region causes a treated metal-deposition rate in the treated pattern region to be different from a non-treated metal-deposition rate in the non-treated region.

In some embodiments, the substrate is initially substantially smooth during the step of selectively applying pre-deposition agent to form the pattern. In some embodiments, applying selectively the pre-deposition agent includes physically contacting the substrate with a stamp. The stamp has a contact surface of the pattern and contains the pre-deposition agent at its stamping surface. In some embodiments, selectively applying pre-deposition agent to form the pattern includes applying the pre-deposition agent to the substrate using inkjet printing. In some embodiments, the substrate comprises a metal layer above a dielectric base layer, and pre-deposition agent is selectively applied to the metal layer.

In some embodiments, the pre-deposition agent is selected from a group including a deposition accelerator and a deposition accelerator precursor, and the treated pattern region comprises an accelerated pattern region. Some embodiments utilizing a deposition accelerator precursor further include activating the deposition accelerator precursor in the treated pattern region before depositing metal. Typically, embodiments having an accelerated pattern region further comprise steps of continuing depositing metal until a thickness of deposited metal in the accelerated pattern region is thicker than a thickness of metal in the non-treated region. Thereafter, removing metal from the non-treated region forms a desired metal pattern. In some embodiments, removing metal from the non-treated region results in isolating raised metal portions in the accelerated pattern region to form a desired metal structure. In some embodiments, removing metal from the non-treated region comprises isotropically removing metal from the substrate. In some embodiments, isotropically removing metal from the substrate comprises wet etching.

In some embodiments, the pre-deposition agent comprises a pre-deposition agent selected from the group consisting of a deposition inhibitor and a deposition inhibitor precursor, and the treated pattern region comprises an inhibited pattern region. Some embodiments utilizing a deposition inhibitor precursor further include activating the deposition inhibitor precursor in the treated pattern region before depositing metal. Typically, embodiments having an inhibited pattern region further comprise continuing depositing metal until a thickness of deposited metal in the non-treated region is thicker than a thickness of metal in the inhibited pattern region. Thereafter, removing metal from the inhibited pattern region forms a desired metal pattern. In some embodiments, removing metal from the inhibited pattern region results in isolating raised metal portions in the non-treated region to form a desired metal pattern. In some embodiments, removing metal from the inhibited pattern region comprises isotropically removing metal from the substrate. In some embodiments, isotropically removing metal from the substrate comprises wet etching.

Another basic embodiment of a method in accordance with the invention is useful to form a metal structure on an initially smooth substrate includes steps of: applying globally a pre-deposition agent to an intially smooth substrate to form a global layer of pre-deposition agent; modifying a portion of the global layer of pre-deposition agent in a modifying pattern to form a treated pattern region and a non-treated region outside of the pattern; and thereafter depositing metal on the substrate. A treated metal-deposition rate in the treated pattern region is different from a non-treated metal-deposition rate in the non-treated region.

In some embodiments, the intially smooth substrate comprises a metal layer above a dielectric base layer, and the pre-deposition agent is globally applied to the metal layer. Some embodiments further comprise activating the pre-deposition agent before depositing metal.

In some embodiments, the steps of applying globally a pre-deposition agent and modifying a portion of the global layer of pre-deposition agent include a combination of steps selected from a group including: applying a global accelerator precursor layer and thereafter activating a portion of the global accelerator precursor layer to form an accelerated pattern region; applying a global accelerator layer and thereafter deactivating a portion of the global accelerator layer to form an accelerated pattern region; applying a global inhibitor precursor layer and thereafter activating a portion of the global inhibitor precursor layer to form an inhibited pattern region; and applying a global inhibitor layer and thereafter deactivating a portion of the global inhibitor layer to form an inhibited pattern region. In some embodiments, activating or deactivating or other modifying species are applied to a substrate before (rather than after) applying a global layer of pre-deposition agent.

It is understood that various embodiments in accordance with the invention include intervening steps and processes between the process steps described and claimed herein.

For example, in some embodiments, after applying a global accelerator precursor layer, a substrate is annealed and rinsed, and thereafter, a portion of the global accelerator layer is deactivated.

In some embodiments, modifying a portion of the global layer of pre-deposition agent in a pattern to form a treated pattern region comprises applying selectively a pre-deposition modifier to the global layer to form a modification pattern, while attaching relatively little or none of the pre-deposition modifier to the global layer outside of the modification pattern. In some embodiments, a modification pattern is a positive pattern of a desired metal pattern of a device or structure. In some embodiments, a modification pattern is a negative pattern of a desired metal pattern of a device or structure. In some embodiments, a pre-deposition modifier is applied to the substrate before applying a global layer of pre-deposition agent to the substrate.

In some embodiments, applying selectively a pre-deposition modifier to the global layer includes physically contacting the global layer with a stamp. The stamp comprises a contact surface of the modification pattern, and the stamp contains pre-deposition modifier at its stamping surface. In some embodiments, applying selectively a pre-deposition modifier to the global layer includes using inkjet printing. Some embodiments further comprise activating a pre-deposition modifier before depositing metal.

In some embodiments, applying a pre-deposition modifier to the global layer comprises applying a pre-deposition modifier selected from the group including an accelerator precursor activator, an accelerator deactivator, an inhibitor precursor activator, and an inhibitor deactivator.

In some embodiments, modifying a portion of the global layer of pre-deposition agent in a pattern to form a treated pattern region comprises applying radiation to the global layer of pre-deposition agent. Examples include applying radiation through a patterned mask, applying radiation using a focused light source, and applying radiation using computer-controlled scanning.

In some embodiments, modifying a portion of the global layer of pre-deposition agent in a pattern to form a treated pattern region comprises selectively removing portions of the global layer, thereby forming a treated pattern region containing the pre-deposition agent and a non-treated region outside of the pattern. An example of a technique for selectively removing portions of a global layer includes laser ablation.

In some embodiments in accordance with the invention, the initially smooth substrate comprises a metal layer above a dielectric base layer. A pre-deposition agent is applied globally above the metal layer. Selectively removing portions of the global layer comprises removing portions of the global layer and portions of the metal layer to form the treated pattern region. In some embodiments, selectively removing portions of the global layer includes performing selective anodic dissolution. In some embodiments, selectively removing portions of the global layer comprises performing selective non-electrolytic chemical oxidation.

In some embodiments, the treated pattern region comprises a region selected from the group including an accelerated pattern region and a non-inhibited region. Depositing metal is continued until a thickness of deposited metal in the treated pattern region is thicker than a thickness of metal in the non-treated region. Then, metal is removed from the non-treated region to form a desired metal pattern. In some embodiments, removing metal from the non-treated region comprises isolating raised metal portions in the treated pattern region to form a desired metal pattern. In some embodiments, removing metal from the non-treated region comprises isotropically removing metal from the substrate. In some embodiments, isotropically removing metal from the substrate comprises wet etching.

In some embodiments, the treated pattern region comprises a region selected from the group including an inhibited region and a non-accelerated region. Metal deposition is continued until a thickness of deposited metal in the non-treated region is thicker than a thickness of metal in the treated pattern region. Then, metal is removed from the treated pattern region after the processes of depositing metal to form a desired metal pattern. In some embodiments, removing metal from the treated pattern region comprises isolating raised metal portions in the non-treated region to form a desired metal pattern. In some embodiments, removing metal from the treated pattern region comprises isotropically removing metal from the substrate.

Methods in accordance with the invention are generally useful to deposit a material on a substrate during fabrication of electronic equipment. Exemplary embodiments include electroplating metal on a substrate. Methods in accordance with the invention are also useful with other metal depostion techniques, including electroless metal plating, physical vapor deposition, and chemical vapor deposition. A feature of embodiments in accordance with the invention is the ability to form metal structures on a substrate without photoresist processing, patterning an etch resist layer, or etching a resist layer.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which:

FIGS. 8A-8B depict schematically a sequence of process phases of a generalized method of using a stamp die as a positive to impress a stamp blank and thereby fabricate a stamp for selectively applying a substrate-treating species to a substrate surface;

FIG. 9 depicts schematically a system that is operable to use a stamp in accordance with the invention to apply selectively a substrate-treating species to a substrate surface, particularly to apply a species that regulates metal deposition on a substrate surface in a positive or a negative of a desired metal pattern;

FIGS. 24A-24C depict schematically several views of electronic devices having electrical rod-shaped connectors formed using one or more techniques in accordance with the invention, typically without using photoresist processes;

DESCRIPTION OF THE INVENTION

Figure 1A:
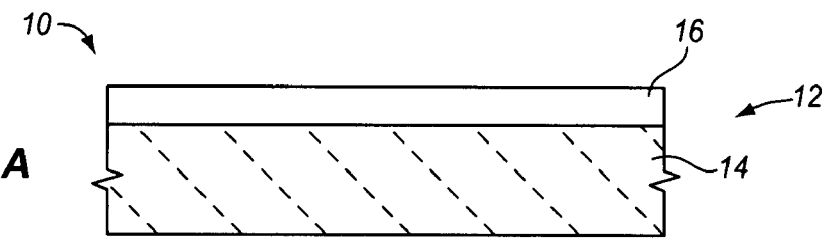
FIGS. 1A-1F depict schematically a sequence of process phases of a generalized method of forming a metal feature embedded in a dielectric layer using conventional photoresist techniques of the prior art.
Figure 1B:
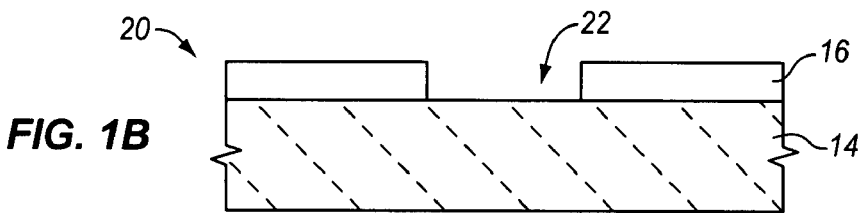
Figure 1C:
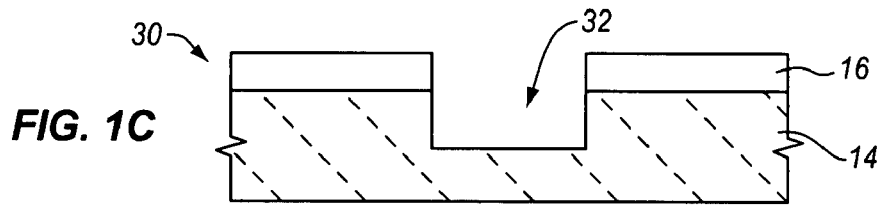

The invention is described herein with reference to FIGS. 2-27. It should be understood that the structures and systems depicted schematically in FIGS. 2-24 serve explanatory purposes and are not precise depictions of actual structures, apparatuses, and systems in accordance with the invention. Furthermore, the embodiments described herein are exemplary and are not intended to limit the scope of the invention, which is defined in the claims below. For the sake of clarity, parts and elements of various embodiments having similar structure and function are identified using the same reference numerals in the figures below.

The word "substrate" herein can mean an entire workpiece, an underlying material on which another material is deposited or from which material is removed, and generally any object on which some treatment is performed. In this disclosure, the terms "substrate", "substrate surface" and related terms generally mean the surface of the workpiece as it exists at a particular phase of fabrication and on which a particular fabrication process is being conducted. The terms "substrate", "workpiece" and related terms are often used interchangably. The terms "substrate", "workpiece" and related terms generally refer to a whole substrate and its surface area or to a substantial (macroscopic) portion of the substrate.

In this specification, terms of orientation, such as "face-up", "above", "below", "up", "down", "top", "bottom", and "vertical" used to describe embodiments relate to the relative directions in FIGS. 2-24, in which a substrate or dielectric base layer defines a substantially horizontal plane. It is understood, however, that the spatial orientation of substrates and apparatuses in embodiments in accordance with the invention are not confined to those depicted in the drawings The terms "accelerator", "accelerant", "accelerated", "accelerator species" and related terms are used interchangeably in this specification to designate a chemical condition of a workpiece, as well as associated chemical species that interact with the surface of a workpiece and enable a greater rate of metal deposition than in areas with less or no accelerator. Often the acceleration occurs in association with the simultaneous use of other chemicals, for example, a plating bath "suppressor", and acceleration is relative to the behavior prevalent in the absence of the accelerant compared to behavior in the presence of the other chemical of chemicals. The terms "accelerator precursor", "accelerator precursor species" and related terms designate a chemical species that transforms during a method in accordance with the invention into another species that produces a greater rate of metal deposition at the surface of a workpiece. The terms "accelerator", "accelerator precursor", "accelerating species" and related terms are often used in this specification interchangeably. Their meanings are clear from the context in which they are used. The term "species" is used broadly to include an atom, a molecule, a molecular fragment or group, and their combinations and complexes. The terms "accelerator", "accelerator film" and related terms are also used broadly to designate both accelerator species and also a formulation that includes accelerator species, but which can also include other materials, such as liquid or dried solvent, precursor compounds of accelerator species, and formulation materials. While the term "accelerator solution" is used broadly here to mean any material suitable for use as an accelerator (without restriction to its physical state or to its being a dissolved compound in another material), it is perhaps easier to understand the concepts presented by considering an accelerator solution in accordance with the invention as typically comprising a known amount of accelerator molecules dissolved in a liquid solvent. It is understood, however, that an accelerator can be attached to the workpiece via a vapor or solid phase interaction, negating the need for forming a liquid accelerator solution. In such embodiments, accelerator is applied to the surface from an accelerator gas or gas mixture, or by physical contact with a transferring material, from which accelerator is transferred directly to the substrate surface and/or by diffusion of accelerator from within the solid transferring material. Furthermore, pure chemicals or a solution of accelerator in a supercritical state (fluids at pressures and temperatures about the critical point) are also useful. The meaning of the various terms as used is clear from their context. While not being bound to a particular theory or mechanism, it is believed that accelerators referred to in the specification provide accelerator species that are strongly adsorbed (typically chemisorbed) on a workpiece surface, which accelerator species activate the surface. Generally, when the accelerator is a molecule, a portion of the molecule is functional in binding the molecule strongly to the surface, while one or more other portions of the molecule are effective in catalyzing (or mitigating suppression of) the deposition process. Exemplary accelerators in accordance with the invention are described in co-owned and co-pending U.S. patent application Ser. Nos. 10/739,822, filed Dec. 17, 2003, by Mayer et al., and Ser. No. 10/824,069, filed Apr. 13, 2004, by Drewery et al., which are incorporated by reference. Exemplary embodiments of accelerator molecules suitable for making an electroplating accelerator solution in accordance with the invention include, among others: 2-mercaptoethane sulfonic acid (MESA), 3-mercapto-1-propane sulfonic acid (MPSA), mercaptopyruvate, 3-mercapto-2-butanol, 1-thioglycerol, dimercaptopropane sulfonic acid (DMPSA), dimercaptoethane sulfonic acid (DMESA), and salts thereof. Derivatives of these compounds having the same functional groups are also suitable accelerators (e.g., 5-mercapto-1-pentane-sulphonic acid). These are typically used in aqueous solutions having a concentration in a range of about 1 ppm to 1000 ppm. With the exception of the dimercaptides listed above (that are believed to be converted to the monomer under electrochemical reduction), these and similar accelerators have been found to adsorb strongly to a workpiece surface (e.g., to copper metal seed layer) upon simple contact by spraying or immersion. In some cases, the accelerators acting alone show slight inhibitory (polarizing) influence when compared to plating from a simple bath (e.g., metal ions; pH and conductivity adjusting acids; bases or salts in the absence of other, typically organic, surface-kinetics-influencing chemicals),and do not interfere substantially with the kinetics of an overall electrochemical charge transfer process. In some embodiments, accelerators are used in plating baths containing strongly specifically adsorbing species, such as halides (commonly either chloride or bromide anions in a 20 ppm to 100 ppm concentration range) and organic suppressors (e.g., polyethylene oxide, polyproplene oxide, and their copolymers). In such embodiments, the addition of the halide/suppressor components to a plating bath substantially increases plating resistance compared to baths without these components, and the accelerator substantially removes the combined polarizing effect of the halide/suppressor combination. Various accelerator and inhibitor molecules are suitable for use in accordance with the invention. Preferred accelerators in accordance with the invention have some of the following attributes: They can be adsorbed (or otherwise attached) onto a workpiece surface or region; are able to be removed selectively from exposed regions (e.g., using a technique such as: non-electrochemical reaction and dissolution, anodic electrochemical dissolution of underlying metal, laser ablation); are able to increase substantially the metal deposition rate in a plating bath over a rate observed without the accelerator; and have long sustained influence (e.g., as a result of not being significantly incorporated into the deposited metal during the deposition process) and hence remain accelerating throughout a metal deposition process. Preferred solvents for dissolving accelerators include deionized water, alcohols and ketones. Accelerators with more organic/hydrophobic character (e.g., long chain organic mercapto-sulphonates) may be more suitably dissolved in non-polar/organic solvents. Although the presence of accelerator on a substrate is depicted for clarity in the drawings in this specification as having relatively substantial thickness, it is believed that only a very thin film, often as thin as a monolayer or submonolayer of accelerator species, is actually required to achieve an accelerating effect.

The accelerating effect of certain accelerator species in accordance with the invention is long lived. The accelerating effect persists even when surfaces (and associated metal atoms) on which the accelerator was initially deposited/attached have been embedded deep inside a growing plated film. The accelerator appears to "float" on the metal surface and avoids being buried in the deposited metal. Because the accelerator avoids substantial incorporation into a deposited metal film, the accelerating effect on film growth does not significantly diminish during subsequent deposition of metal atoms. Without being bound to a particular theory, it is assumed for purposes of explanation that an accelerator remains on the surface throughout the deposition process unless removed (e.g., removed by laser ablation).

On the one hand, the terms "accelerated region", "activated accelerator" and related terms and, on the other hand, the terms "non-accelerated region", "inhibited area", "inhibited region" and similar terms are relative terms. The terms accelerated region and related terms (non-inhibited region) refer to a region or area comprising a higher concentration of attached accelerator species (or a lower concentration of inhibitor species) relative to a non-accelerated (or inhibiteded region), and the higher concentration of accelerator species in an accelerated region (or lower concentration of inhibitor species in a non-inhibited region) is able to cause a faster rate of metal deposition than in a non-accelerated (or inhibited) region.

The terms "inhibitor", "inhibitor species" and related terms are used interchangeably in this specification to designate chemical species that diminish, resist, impede, obstruct or suppress the deposition (e.g., by electroplating) of metal onto the surface of a workpiece and cause (often in association with the simultaneous use of other chemicals, e.g., in a plating bath) a slower rate of metal deposition than in areas with less or no inhibitor. The terms "inhibitor precursor" and "inhibitor precursor species" and related terms designate a chemical species that transforms during a method in accordance with the invention into another species that inhibits, diminishes, impedes, obstructs, resists, or slows metal plating at the surface of a workpiece. The terms "inhibitor", "inhibitor precursor", "inhibitor species" and related terms are often used in this specification interchangeably. Their meanings are clear from the context in which they are used. The term "species" is used broadly to include an atom, a molecule, a molecular fragment or group, and their combinations and complexes. The terms "inhibitor", "inhibitor film" and related terms are also used broadly to designate both inhibitor species and also a formulation that includes inhibitor species, but which can also include other materials, such as liquid or dried solvent, precursor compounds of inhibitor species, and formulation materials. While the term "inhibitor solution" is used broadly here to mean any material suitable for use as an inhibitor, (without restriction to its physical state or being a dissolved compound in another material), it is perhaps easier to understand the concepts presented by considering an inhibitor solution in accordance with the invention typically comprising a known amount of inhibitor molecules dissolved in a liquid solvent. It is understood that, alternatively, the inhibitor can be attached to the workpiece via a vapor phase or solid interaction, negating the need for forming a liquid inhibitor solution. In such a case, the inhibitor is applied to the surface from an inhibitor gas or gas mixture or by physical contact and transfer and/or diffusion from the surface of the solid or from within the solid. Furthermore, pure inhibitor species or a solution of inhibitors in a supercritical state (fluid at pressures and temperatures about the critical point) are also useful in accordance with the invention.

The word "inhibitor" and related terms used herein should not be confused with the word "suppressor" (sometimes called "carrier") and related terms as often used in the art of electroplating. Suppressor molecules differ from inhibitors fundamentally by (1) their relative strength of adsorption to the metal surface and (2) their method of utilization in a metal plating process. While both inhibitors and suppressors inhibit metal depostion and add kinetic resistance (surface overpotential or overvoltage) to the plating process, not all suppressors are useful as inhibitors in accordance with the invention. The meaning of the various terms will also be clear from their context. While not being bound to a particular theory or mechanism, suppressors mentioned in the specification provide suppressor species that can be considered weakly bound and weakly physically adsorbed to a workpiece surface. In contrast, inhibitor species in accordance with the invention are strongly bound or strongly chemisorbed. When a suppressor is in a plating bath, it tends to suppress plating and increase polarization by mechanisms such as blocking molecular transport to the interface and interfering with the charge transfer of depositing species, or otherwise retarding plating at the surface. Suppressors are generally easily removed from the surface and, therefore, able to move over the surface and disconnect from the surface in a dynamic fashion under normal operating conditions (temperature, pressures, pH). As a result, they are able to maintain the suppressing effect, typically a required component of a plating baths. Also, suppressors are typically not substantially incorporated into the electrodeposit.

Although an inhibitor on a substrate is depicted for clarity in the drawings in this specification having relatively substantial thickness, it is believed that only a fractional monoloayer to a few monolayers of inhibitor species is actually adsorbed to a workpiece surface (e.g., to a seed layer).

Similar to accelerators in their affinity for a substrate surface, inhibitors are generally not free to move across the surface or re-dissolve into a plating bath. Also, the inhibiting effect of certain inhibitor species in accordance with the invention is long lived. The inhibition persists even when surfaces on which the inhibitor was initially deposited have not received additional inhibitor and the metal atoms onto which the inhibitor was originally attached have been embedded inside a growing plated film. The inhibitor can be viewed as strongly attached to the surface, unable to move laterally substantially, but able to "float" on the metal surface as the metal film is deposited, and not be substantially incorporated into the film during the film growth process (at least not to an extent of significantly diminishing the inhibiting effect). Without being bound to a particular theory, it is assumed for purposes of explanation that the inhibitor remains on the surface throughout the deposition process unless removed (e.g., removed by laser ablation). In embodiments in which the inhibitor is a large molecule, it may have two different functional and spatially separated elements, one that reacts with the surface and attaches the molecule to the surface, and another portion that inhibits the deposition process. Although not being bound to a particular theory, one or more possible inhibition mechanisms include: interacting with another species in the electrolyte; blocking the transport of certain species necessary for the deposition process from reaching the surface; and interfering with an intermediate deposition atom or complex.

Some chemicals useful as inhibitors have been utilized in the past as "levelers" in electroplating baths. Like "suppressor", the term "leveler" is also quite colloquial and requires some explanation. In generally, levelers are plating bath additives used to diminish plating and polarize the surface at targeted surface regions; primarily raised regions and corners that would otherwise see amplified growth due to their exposure to the supply of chemicals and to an electric field. Not all conventional levelers are effective as inhibitors. For example, some levelers' primary mode of action is by diffusion-limited transport in combination with direct incorporation (consumption) into the electrodeposit. On the other hand, other levelers, useful as inhibitors, are strongly attached to the surface, are strongly polarizing, but are not significantly incorporated into the deposit during electrodeposition. Some inhibitors act in tandum with accelerators and/or suppressors to achieve their useful effect. For example, in some embodiments, an inhibitor acts as a deactivator of an accelerator by being more strongly reacting and attached to the surface than the accelerator molecule, effectively displacing the chemisorbed accelerator. Therefore, a combination of various types of species, such accelerators, inhibitors, and suppressors, is utilized in some embodiments and is within the scope of this invention.

The terms "accelerator", "suppressor", "leveler", "inhibitor" and related terms are also used in this specification to designate certain additives used in plating solutions, such as additives in electroplating solutions used in the art for bottom-up filling of high-aspect ratio features. Co-owned U.S. Pat. No. 7,232,513, issued Jun. 19, 2007, to Webb et al, entitled "Electroplating Bath Containing Wetting Agent For Defect Reduction", which is hereby incorporated by reference, further describes additives used to control plating characteristics of electroplating solutions. In summary, often, species useful as additives in electroplating solutions are also useful as accelerator or inhibitors in accordance with the present invention. When used in accordance with the invention, however, an accelerator and an inhibitor are directly applied globally or selectively to specific regions of a substrate surface, in contrast to being merely dissolved in a plating bath The terms "deactivator", "deactivating species", "pre-deposition agent poison" and related terms in this specification refer to a species suitable for deactivating a pre-deposition agent or removing it from the surface. An examplary deactivator of an accelerator functions by reacting with an accelerator to convert the accelerator to a species that is non-accelerating or less accelerating than the accelerator species, or by weakening the accelerator-to-surface bond to facilitate its release from the surface. Typically, an accelerator-deactivator is applied in a modifying pattern that is a negative of a desired metal pattern to a substrate that has been previously globally treated with an accelerator. In some embodiments, a deactivating species adheres to a substrate surface to mask or to smother an accelerator, rather than to react chemically with the accelerator. In still other embodiments, a deactivating species adsorbed to an accelerated surface interferes with metal deposition directly, virtually preventing deposition of metal onto the negative pattern of deactivating species. In still other embodiments, a deactivating species is applied to a substrate before the accelerator. The deactivator adsorbed to a substrate surface interferes selectively with subsequent global application of an accelerator species to the substrate, ultimately preventing deposition of metal onto the negative pattern of deactivating species. In summary, a deactivating species in accordance with the invention results in less deposition of metal on deactivated surfaces compared to deposition of metal on accelerated surfaces. An exemplary accelerator solution for globally accelerating a substrate surface is a solution of 100 ppm MPSA in ethanol. An exemplary deactivating material suitable for deactivating MPSA is any reactant that converts the acid to an alcohol.

A deactivator of an inhibitor selectively applied in a modifying pattern to a substrate modifies a global layer of inhibitor or inhibitor precursor. In some embodiments, inhibitor-deactivator is applied onto a previously applied global layer of inhibitor species. In some embodiments, a modifying pattern of inhibitor-deactivator is applied to the substrate first, and then a global layer of inhibitor species is applied above the deactivator. A deactivator of an inhibitor is applied in a modifying pattern that is a positive of a desired metal pattern. The deactivation of the inhibitor causes the rate of metal deposition to be faster than in inhibited regions.

Figure 25:
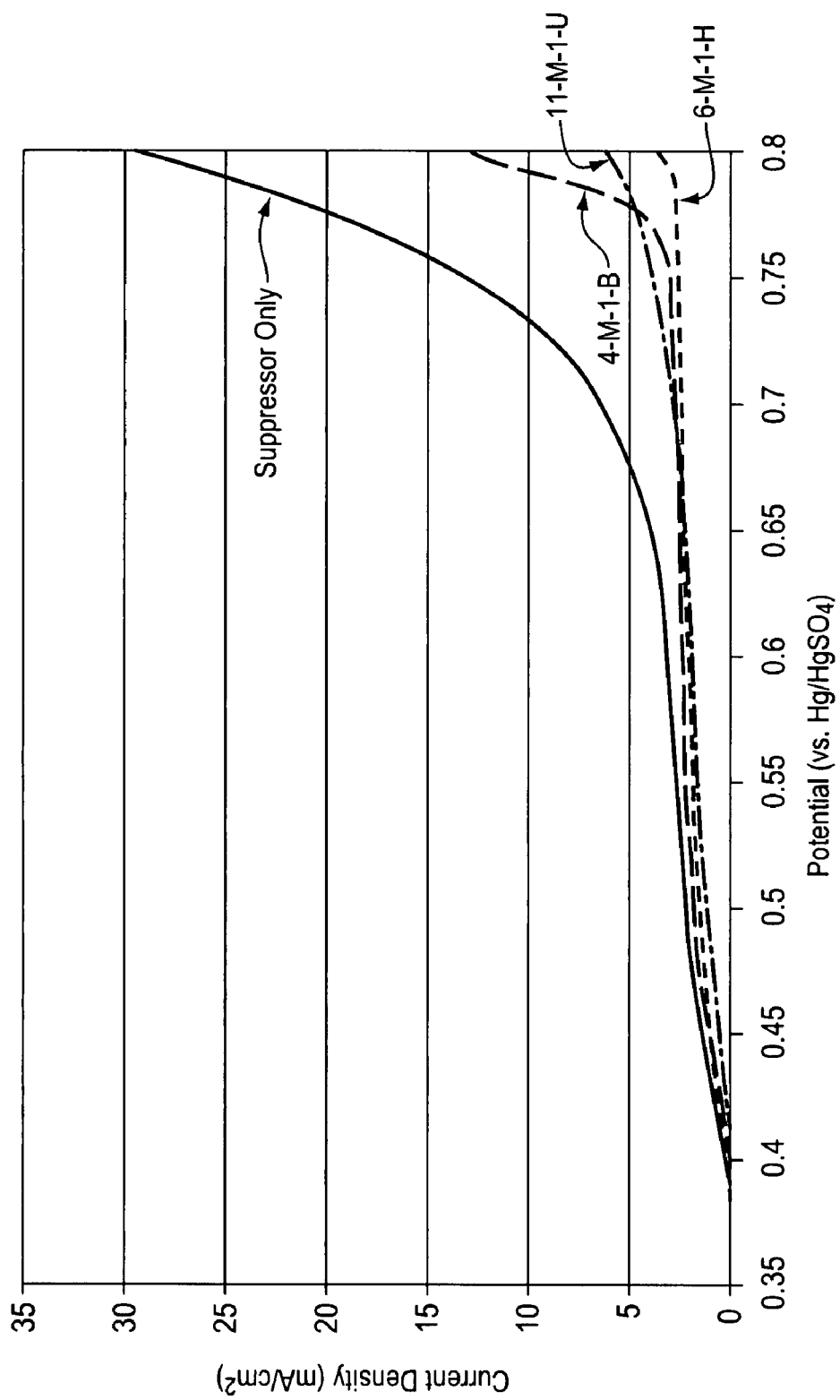
FIG. 25 contains a graph in which current density during plating is plotted as a function of potential during plating with organic plating solutions of various compositions.
Figure 26:
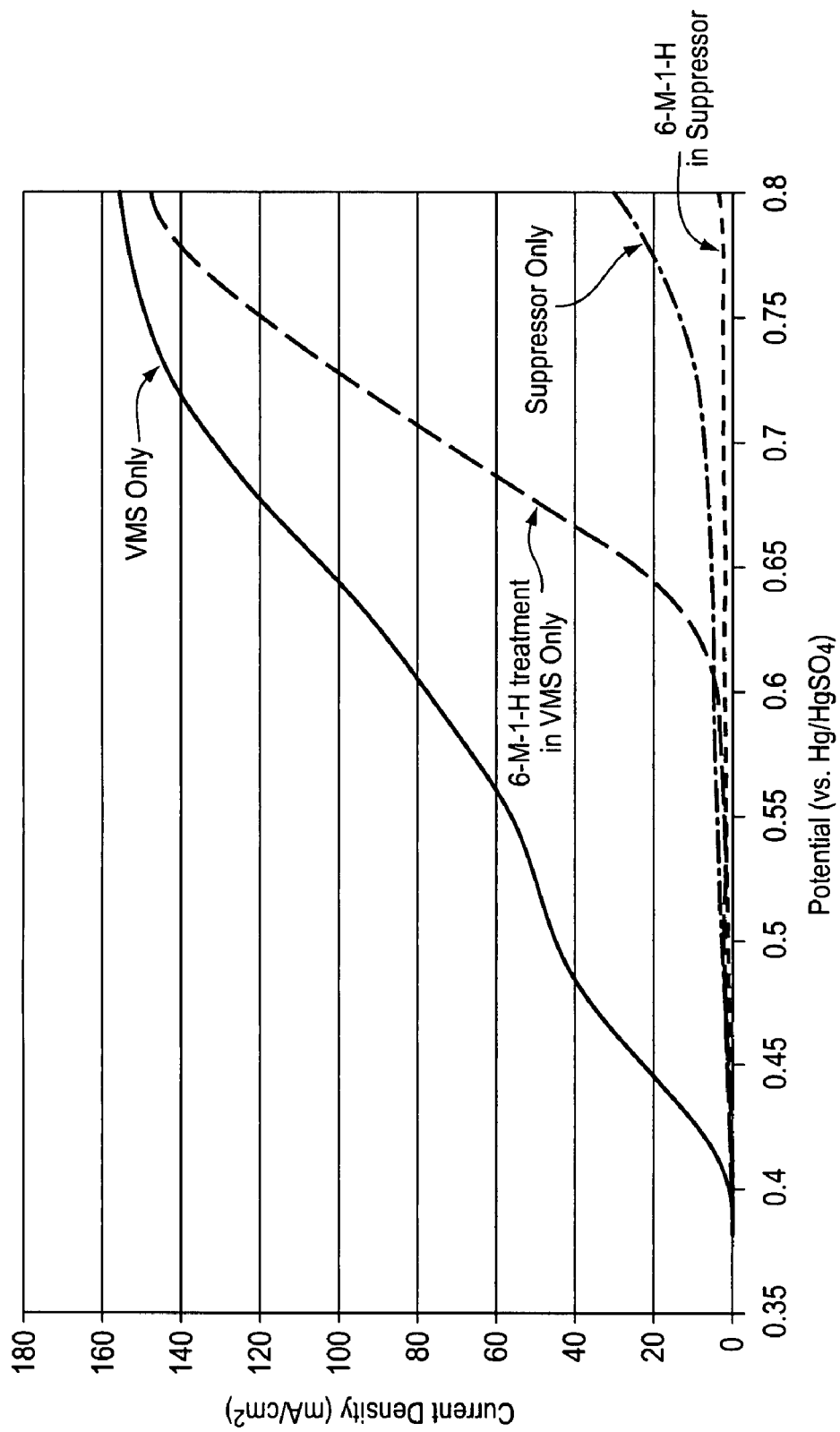
FIG. 26 contains a graph in which current density during plating is plotted as a function of potential during plating with various plating solutions, the curves showing the effect of primary alcohol 6-M-1-H in inorganic and inorganic plating solutions.
Figure 27:
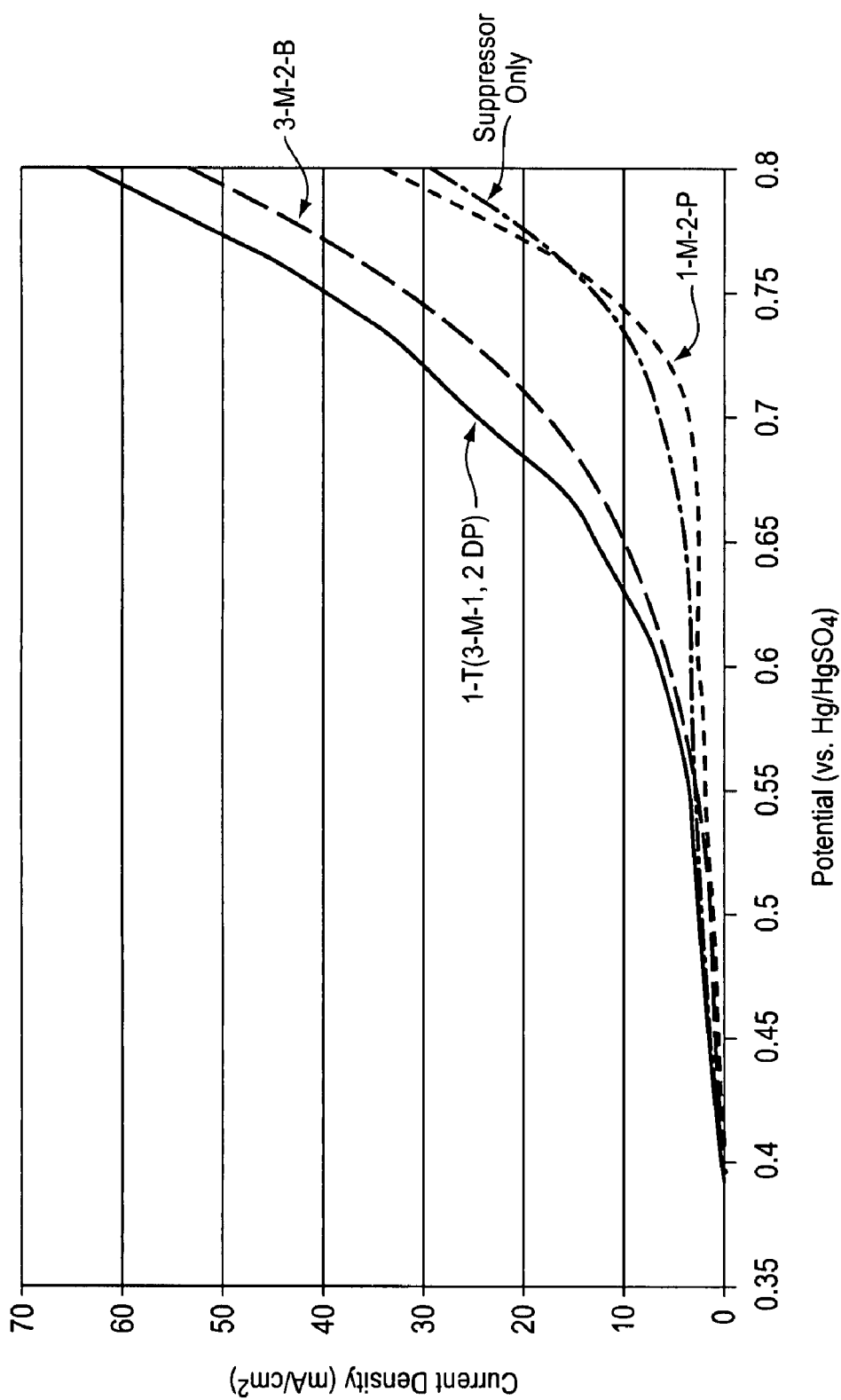
FIG. 27 contains a graph in which current density during plating is plotted as a function of potential during plating with various plating solutions, showing the effect of secondary mercapto-alcohols.

Some essentially organic compounds that are used as suppressor additives in conventional bottom-up filling plating solutions actually act as plating accelerators in accordance with the invention when present on a substrate that is being plated using an inorganic plating solution without organic additives (such as levelers, suppressors, accelerators). FIG. 25 contains a graph in which current density during plating is plotted as a function of potential during plating with organic plating solutions of various compositions. As shown in the graph of FIG. 25, when any of primary mercapto-alcohols 4-mercapto-1-butanol (4-M-1-B), 11-mercapto-1-undecanol (11-M-1-U) and 6-mercapto-1-hexanol (6-M-1-H) are added to an organic (bottom-up filling) solution, it acts as a suppressor of plating. In contrast, shown by the curves in the graph of FIG. 26, when primary alcohol 6-M-1-H is added to an inorganic plating solution ("VMS") not containing usual bottom-up filling organic additives, then 6-M-1-H actually acts as an accelerator in accordance with the invention. The curves on the graph of FIG. 27 show that secondary mercapto-alcohols (1-mercapto-2-propanol (1-M-2-P), 3-mercapto-2-butanol (3-M-2-B)) and di-mercapto-alcohols (1-thioglycerol(3-mercapto-1,2 dipropanol (1-T(3-M-1,2 DP)) are weak accelerators in accordance with the invention.

When a mercapto-alcohol is used an accelerator in accordance with the invention, it can be deactivated by reacting the molecule with sulfuric acid to turn the alcohol into its acid form.

The term "liquid" is used broadly herein to include not only liquids, but also combinations of liquids and solids, such as slurries and suspensions.

The term "substrate-treating species" and similar terms are used in this specification to refer broadly to species that effect, directly or indirectly, a rate of deposition of a material onto a substrate. The term "pre-deposition agent" refers to a type of substrate-treating species that is applied to a substrate and that, either in its applied form or in a modified form, directly affects a rate of material deposition onto a substrate. Examples of a pre-deposition agent in accordance with the invention include an accelerator species, an accelerator precursor, an inhibitor, and an inhibitor precursor. The term "pre-deposition modifier" is another type of substrate-treating species that is applied to a substrate and that modifies in some way the behavior of a pre-deposition agent. Typically, a pre-deposition modifier is applied selectively to a substrate above a previously applied global layer of pre-deposition agent. In some embodiments, a pre-deposition modifier is applied selectively to a substrate before application of a global layer of pre-deposition agent. Examples of a pre-deposition modifier in accordance with the example include an activator of an accelerator precursor, a deactivator of an accelerator, and activator of an inhibitor, and a deactivator of an inhibitor. Implicitly included among deactivators are a deactivator of an accelerator precursor and a deactivator of an inhibitor precursor. Relative terms such as "substantially none", "relatively little" and similar terms are sometimes used in the specification to denote the relative absence of a substrate-treating species within or outside a pattern region of a substrate compared to the presence of a substrate treating species in a different region of the substrate. The difference in the amount of a substrate-treating species between a treated region and a non-treated region is sufficient to cause a substantial difference in metal deposition rates between the regions in accordance with the invention.

Some embodiments in accordance with the invention involve imprinting (or stamping) a substrate to apply selectively a substrate-treating species in a pattern corresponding to a positive or a negative image of a desired metal pattern. Selection criteria of stamp materials of composition include, among others: stamp material hardness, compliance and flexibility; substrate flexibility; stamp material absorption properties for a particular substrate-treating species (e.g., accelerator species and solvent; deactivating species and solvent); relative adsorption affinities of selected substrate-treating species to the stamping material and to substrate material; size of pattern lines; applied pressure between the imprinting element and the substrate; desired throughput (stamping rate); stamp life (total number of useful imprints without loss of line-defining desired resolution) and other characteristics. In some embodiments, a stamp 104 (FIG. 2B) is designed to absorb accelerating solution (or other substrate-treating species, such as an inhibitor or a deactivating solution). In some embodiments, stamp material covers the mounting surface of a stamp assembly, and the stamp assembly includes a delivery system for delivering substrate-treating species to the stamp contact surface. Exemplary materials of composition of stamps in accordance with the invention for stamping a substrate include: various carbon and silicon based polymer/plastics (e.g., polyethylene, polyproprylene, polyvylidene difluoride, polytetrafluroethlene, polyvinyl alcohol and PFA-F, polyvinylchloride); plastics with incorporated plasticizers (e.g., material with physical properties similar to the resilient tubing material TYGON®); various elastic materials (EDPM, natural rubber, polybutadiene and various silicon rubbers); micro and nanoporous materials (silicon and organic areogels); hydrogel polymers and ionoomers (NAFION®).

The term "anodizing" herein means establishing on a conductive material an electrical bias that is positive relative to some reference material, such as electroplating liquid or a negatively-biased cathode. Similarly, the term "cathodizing" means establishing on a conductive material an electrical bias that is negative relative to some reference material, such as electroplating liquid or a positively-biased conductive material (e.g., an anode). The terms "cathodic plating", "electrochemical deposition" and related terms are used synonymously in this specification. The terms "anodic dissolution", "electrochemical dissolution" and related terms are used synonymously in this specification. The terms "unbiased", "electrically unbiased" and related terms imply that there is substantially no electrical or ionic current. The term "nonconductive" means electronically nonconductive or ionically nonconductive or both.

The word "area" is used in this specification generally to refer to an area on a substrate surface. The term "nominal area" refers to the area of surface that would be measured if the surface were smooth, without embedded features, raised areas, and other area-increasing topography. The word "region" used in this specification refers generally to a three-dimensional region of a substrate.

Etching is used to describe a process in which metal is removed without an imposed external power supply and is generally facilitated by the presence of an oxidizer (a chemical that is reduced to oxidize the metal). Examples of oxidizers for the etching of copper include oxygen, chlorine, bromine, various peroxides (e.g., hydrogen peroxide), permanganate, and persulfate. The term "isotropic etching", "isotropic removal" and related terms are used in this specification in their usual sense to designate an etching process or other type of material removal operation in which the rate of the etching reaction or other material removal technique is the same in any direction. The term "kinetically-controlled isotropic removal", "surface-kinetics-controlled isotropic etching" and related terms relate to metal removal techniques in which the material removal rate from a substrate surface is apparently controlled by the reaction kinetics of etching reactions rather than by diffusion processes to or from the surface. Kinetics-controlled etching is characteristically different from diffusion-controlled etching in that kinetics-controlled etching is generally independent of transport phenomena (fluid agitation), and results in an etching rate that is largely independent of feature size, feature separation, feature density, position within a feature and other geometric factors. In some embodiments, kinetics-controlled isotropic etching is more desirable than diffusion-controlled isotropic etching.

The term "topography" and related terms used in the specification refer principally to the topographic relief of a substrate, that is, to characteristics of surface relief such as surface contours, protrusions, planar field areas, feature cavities and recesses. This is in contrast to other uses of the word "topography" in the semiconductor arts that are related to the circuit patterns and their material compositions in integrated circuits.

The terms "smooth surface", "initially smooth" and related terms are used in the specification to refer to a substrate surface that is substantially free of recesses and raised features on at least a portion of the surface on which a metal structure is to be formed in accordance with the invention. A characteristic feature of some embodiments in accordance with the invention is that metal is plated or otherwise deposited onto an initially substantially smooth surface. This is in contrast with the prior art in which metal is commonly plated into a recessed cavity (e.g., a gap or trench) or between raised features of a substrate. The term "global treatment", "global etching", "global removal" and related terms are used in this specification to refer to a substrate treatment process conducted over the whole or a substantial portion of a substrate surface at a given time. The term "localized treating", "localized etching", "local removal" and related terms refer to a treatment or process that is conducted in a relatively small portion of a substrate surface at any given time. It is understood that a series of sequential operations involving localized treatment typically result in treatment of a substantial portion or of the whole of a substrate surface.

Methods in accordance with the invention for forming metal features in electronic devices through selective substrate treatment and selective acceleration or inhibition of metal deposition are described herein with reference to FIGS. 2-24. It is understood that some methods in accordance with the invention and resulting structures do not necessarily include all of the processes and structures represented and discussed with reference to FIGS. 2-24. For example, in FIGS. 2-5, 10-12, 14-19, a substrate base layer comprises dielectric material on which metal features are formed. Nevertheless, methods in accordance with the invention are also suitable for forming metal structures on base layers that are not dielectric. It is also understood that some methods in accordance with the invention and resulting structures may also include processes and structures not represented or discussed with reference to FIGS. 2-24. Also, methods in accordance with the invention for forming metal features in electronic devices are described herein mainly with reference to electroplating techniques. It is understood, however, that methods involving selective acceleration or inhibition of metal deposition by other techniques, such as electrolesss plating and physical vapor deposition (PVD), are also included within the scope of the invention. Furthermore, generalized methods in accordance with the invention involving selective acceleration or selective inhibition of a substrate are also suitable for depositing non-metal materials, such as dielectric materials.

Figure 2A:
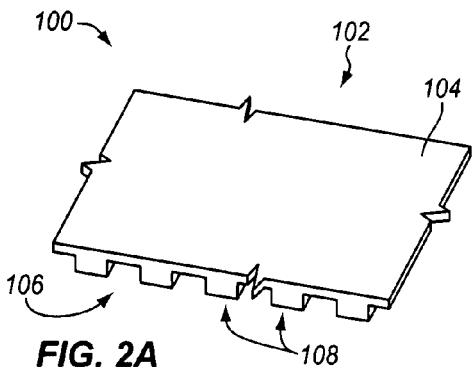
FIGS. 2A-2G depict schematically a sequence of process phases of a basic embodiment in accordance with the invention, in which plating accelerator is selectively applied to a substrate in a pattern corresponding to a desired metal wiring pattern using a stamp having an embossed pattern, thereafter selective electroplating is conducted, followed by metal removal to isolate conductive metal features on the substrate.

As described herein with reference to FIGS. 2A-2G, in a first basic embodiment in accordance with the invention, a pre-deposition agent comprising plating accelerator is selectively applied to a substrate in a desired metal wiring pattern to form an accelerated pattern region, thereafter selective electroplating is conducted, followed by metal removal to isolate conductive metal features on the substrate. Preferably, the metal removal to isolate conductive metal features includes isotropic metal removal; for example, isotropic wet etching. FIG. 2A depicts schematically a perspective view 100 of a section 102 of stamp 104 in accordance with the invention that is operable to apply a desired pattern of accelerator onto a substrate surface. The stamp 104 includes contact surface 106 having an embossed pattern 108 corresponding to a desired metal wiring pattern of a substrate. The stamp 104 comprises materials selected for a particular use.

Figure 2B:
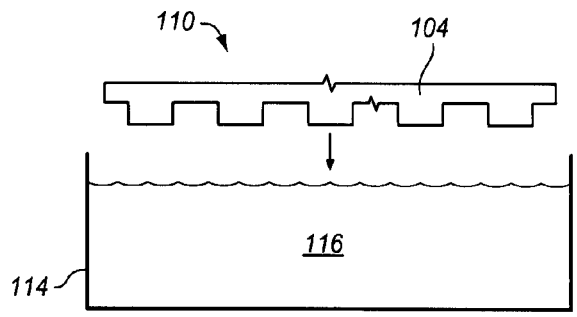
Figure 2C:
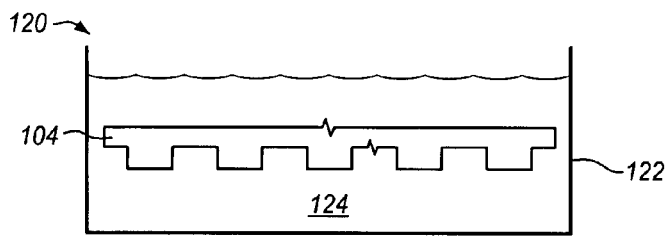
Figure 2D:
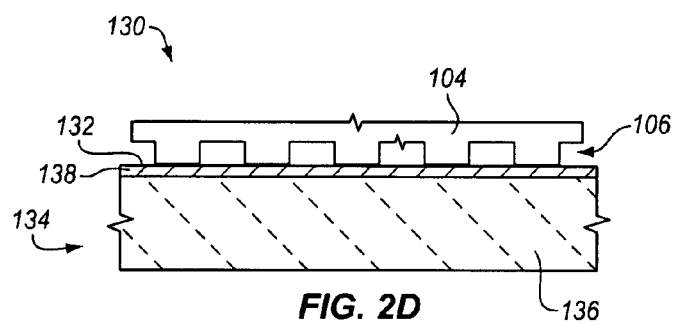
Figure 2E:
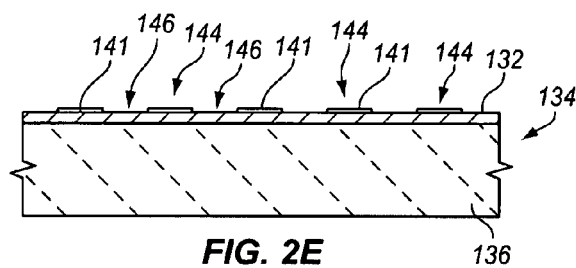
Figure 2F:
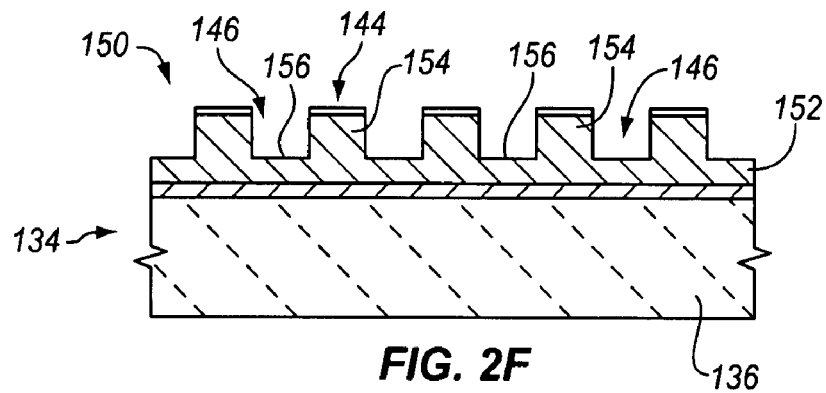

FIG. 2B depicts cross-sectional view 110 of stamp 104 and accelerator bath 114 containing accelerator solution 116; for example, a solution of 20 ppm 3-mercapto-1-propane sulfonic acid (MPSA) in ethanol solvent. In some embodiments of methods in accordance with the invention, stamp 104 is immersed in accelerator solution 116 to absorb accelerator solution. FIG. 2C depicts schematically cross-sectional view 120 of stamp 104 immersed in rinsing bath 122. Rinsing bath 122 contains rinsing liquid 124, typically containing deionized water or solvent without accelerator. Rinsing of stamp 104 serves to remove excess entrained accelerator solution from surfaces of stamp 104 to prevent undesired, inadvertent application of accelerator species onto a substrate during stamping processes. In some cases it may be necessary to remove excess accelerator (inhibitor) solution and/or rinsate from the stamp prior to proceeding; for example by blowing off excess fluid with an impinging gas spray. FIG. 2D depicts cross-sectional view 130 of contact surface 106 of stamp 104 in contact with top surface 132 of substrate section 134. Typically, top surface 132 of substrate section 134 is substantially smooth, without a recessed or a raised feature. In some embodiments, the stamp is flexible and it accommodates curved substrate surfaces. As a result, embodiments in accordance with the invention are not limited to creating features only on flat substrates. As depicted in FIG. 2D, substrate 134 includes dielectric base layer 136 (which is shown substantially smooth, having no curvature or recessed or raised features) and metal seed layer 138 (which is substantially smooth, having no curvature, recessed or raised features). In accordance with the invention, stamp 104 selectively applies plating accelerator to substrate surface 132 in a pattern corresponding to a desired metal pattern. A suitable contact time of stamp 104 to substrate surface 132 is in a range of about from 1 to 120 seconds, and depends on the material from which the stamp is constructed, its porosity, pore size and tortuousity (if porous), the concentration of accelerator/inhibitor in the stamp, and other parameters associated with the transfer of the chemical from one medium to the substrate surface. FIG. 2E depicts substrate 134 on which plating accelerator 141 has been selectively applied in a pattern in accordance with the invention, thereby forming desired accelerated (treated) pattern region 144 on substrate surface 132. Non-accelerated (non-treated) regions 146 of substrate 134 are located on portions of substrate surface 132 where no accelerator was applied by stamp 104. FIG. 2F shows cross-sectional view 150 of substrate section 134 after selective accelerated plating in accordance with the invention. Co-owned and co-pending U.S. patent application Ser. No. 10/739,822, filed Dec. 17, 2003, by Mayer et al., having the title "Method for Planar Electroplating", and co-owned and co-pending U.S. patent application Ser. No. 10/824,069, filed Apr. 13, 2004, by Drewery et al., having the title "Selectively Accelerated Plating of Metal Features", which are incorporated by reference, teach methods suitable for electroplating copper in accelerated regions of a substrate in accordance with the invention.

Figure 2G:
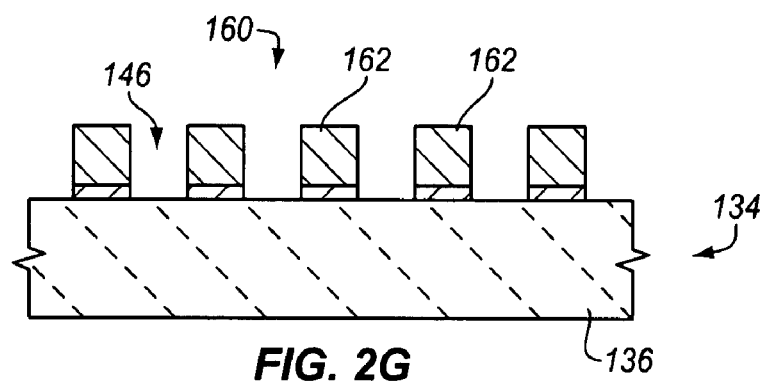

As depicted in FIG. 2F, accelerator selectively attached in accelerated pattern regions 144 increased the rate of metal plating in accelerated pattern regions144 relative to the rate of metal plating in non-accelerated regions 146. As a result, deposited metal 152 on substrate 134 has an embossed topography, with metal protrusions 154 corresponding to accelerated regions 144 of FIG. 2E. Compared to metal protrusions 154, the thickness of the thinly deposited metal 156 in non-accelerated regions 146 is relatively thin. Depending on the choice of accelerator, amount of accelerator adsorbed, plating bath composition, and other parameters, the relative rates of deposition between these two regions may differ by more than a factor of ten. FIG. 2G depicts cross-sectional view 160 after metal has been removed from non-accelerated regions 146 of substrate 134, resulting in isolation of metal features 162 on dielectric layer 136 and a desired metal wiring pattern. In some embodiments, an isotropic, kinetically-controlled wet-etching technique is used to remove some deposited metal (152 in FIG. 2F) substantially uniformly from both accelerated regions 144 and non-accelerated regions 146, thereby forming metal structures 162 (FIG. 2G) in accordance with the invention. Preferably, isotropic removal is used because such a process does not substantially increase in rate after a feature has become isolated, nor will it increase surface roughness or attack metal grain structure. U.S. patent application Ser. No. 10/690,084, filed Oct. 20, 2003, by Koos et al., titled "Method For Fabrication Of Semiconductor Interconnect Structure With Reduced Capacitance, Leakage Current, And Improved Breakdown Voltage", which is incorporated by reference, teaches methods and compositions useful for surface-reaction-kinetics-controlled isotropic wet etching of copper from a substrate surface in accordance with the invention. Modification of the etch formulation (pH and ratio of complexing agent concentration to oxidizing agent concentration), enables a high rate of isotropic removal without substantial increases in roughness, while maintaining surface control and isotropic removal. In some embodiments, separate oxidizing and oxide etching solutions are employed in sequence. In some embodiments, an etching solution in accordance with the invention includes both an oxidizing agent and a metal-oxide-etching agent. An exemplary etching solution contains peroxide at a concentration in a range of about from 0.5% to 20% peroxide by weight and glycine at a concentration in a range of about from 0.05% to 15% by weight, and has a solution pH in a range of about from 5 to 12. Such an etching solution is typically about 100 times more selective to copper than to conductive TaN barrier material, so that etching is effectively stopped at a conductive barrier, leaving it intact. The barrier layer (e.g., Ta, TaN, Ti, W, TiW) can be removed selectively with respect to the metal used to create the wiring structure (e.g., copper) by exposing the surface to a strongly alkaline solution (e.g., 10-30% KOH) at elevated temperatures (e.g., 50°-86° C.), leaving the conductive lines completely electrically isolated. An exemplary isotropic copper etching solution comprises about 3% by weight $H_2O_2$ and about 1% by weight glycine, and a pH in a range of about 9.0. Preferably, the single solution includes a buffering agent like glycine or ammonia that maintains the pH at a specific value. Other buffering agents, such as acetate, carbonate, or phosphate, are suitable, depending on the desired pH value. The pH can be adjusted by the addition of an appropriate agent such as an alkali metal or tetra-alkyl ammonium hydroxide. By controlling the ratio of copper oxidizing agent and copper oxide etchant in such solutions, one controls the amount of oxidation and depth of the intermediate copper oxide film that is formed on the surface of the substrate. An important parameter affecting performance is the availability of the specific form of the chelating agents associated with complexing with the metal ion, which changes with solution proton concentration (pH). The aim of isotropic etching techniques is to effect substantially equal rates of metal removal from all exposed metal surfaces independent of feature location, size, density or other geometric parameters.

In contrast to conventional techniques known in the art, metal wirings 162 shown in FIG. 2G are formed without using photoresist processes.

Figure 2H:
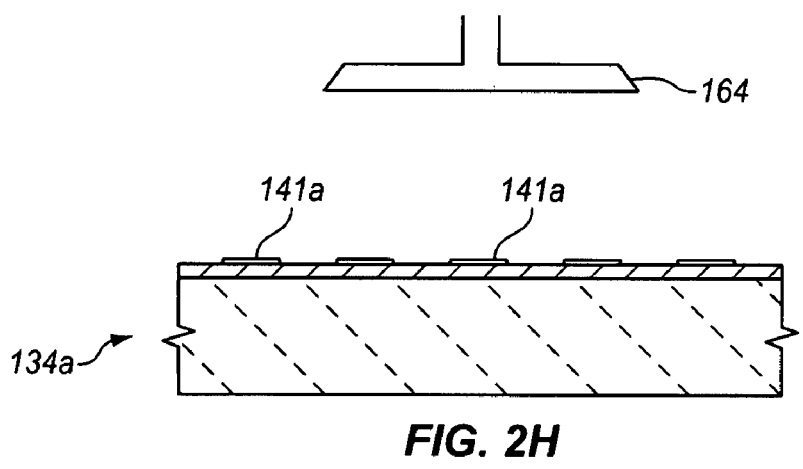
FIG. 2H depicts schematically an embodiment in which a selectively patterned accelerator precursor deposited on the top surface of a substrate is converted to accelerator by radiant energy directed from a lamp.

A variation of an embodiment described with reference to FIGS. 2A-2G involves selective patterning of a substrate with accelerator precursor, followed by activation of the precursor to make an accelerator species. Typically, activation of an accelerator precursor is conducted by exposing the accelerator precursor to another chemical that transforms it through chemical reaction to an active accelerator form, or, for example, by applying heat, radiation (microwaves, UV light, X-rays) or some other form of energy to convert/decompose the accelerator precursor to an accelerator species. Alternatively, combinations of an additional chemical species and directed energy can be utilized. FIG. 2H depicts schematically selectively patterned accelerator precursor 141 a deposited on the top surface of substrate 134a. In accordance with the invention, accelerator precursor 141 a is converted to accelerator 141 (FIG. 2E) by radiant energy directed from lamp 164 at substrate 134a.

Figure 3A:
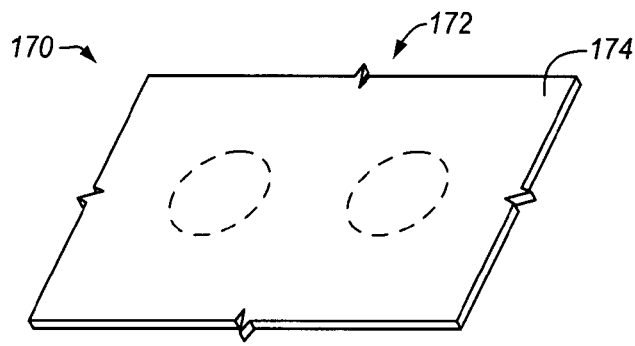
FIGS. 3A-3E depict schematically a sequence of process phases of a basic embodiment in accordance with the invention, in which plating accelerator is selectively applied to a substrate in a pattern corresponding to a desired metal wiring pattern using a stamp having an embossed pattern, thereafter selective electroplating is conducted, followed by metal removal to isolate conductive metal features on the substrate.
Figure 3B:
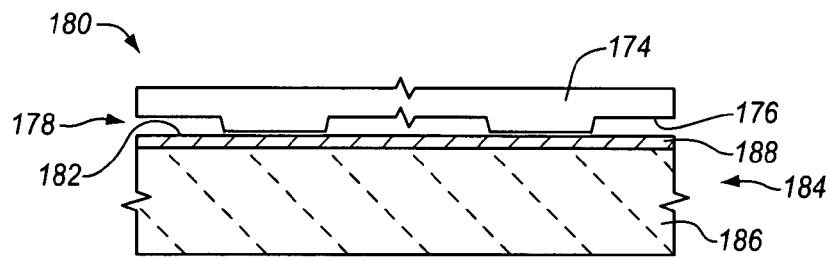
Figure 3C:
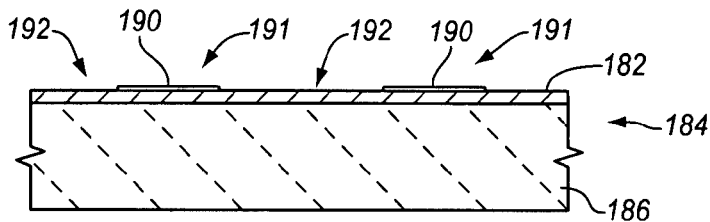
Figure 3D:
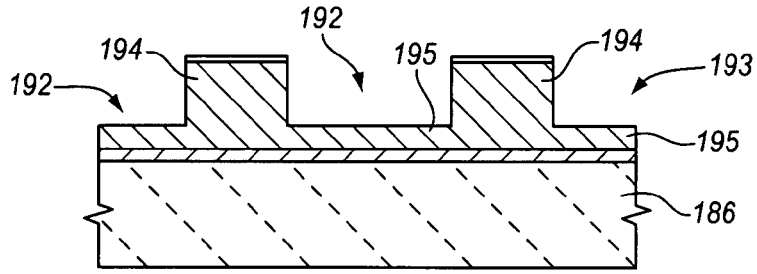
Figure 3E:
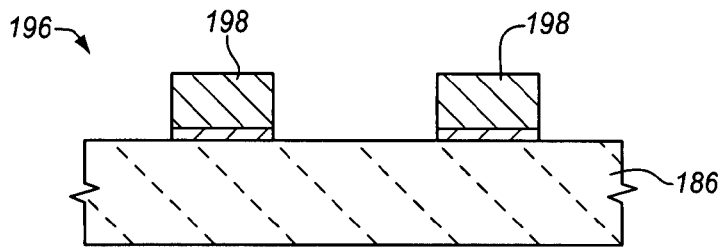

FIG. 3A depicts a perspective view 170 of the stamping surface of a section 172 of stamp 174 in accordance with the invention that is operable to apply a desired pattern of adsorbed accelerator onto a substrate surface. As depicted in FIG. 3B, stamp 174 includes contact surface 176 having an embossed pattern 178 corresponding to a desired metal pattern of a substrate. FIG. 3B depicts cross-sectional view 180 of contact surface 176 of stamp 174 in contact with top surface 182 of substrate section 184. Substrate 184 includes dielectric base layer 186 and metal seed layer 188. In accordance with the invention, stamp 174 selectively applies plating accelerator to substrate surface 182 in a pattern corresponding to a desired metal pattern. FIG. 3C depicts substrate 184 on which plating accelerator 190 has been selectively applied using stamp 174 in a pattern in accordance with the invention, thereby forming desired accelerated (treated) pattern regions 191 on substrate surface 182. Non-accelerated (non-treated) regions 192 of substrate 184 are located on portions of substrate surface 182 where substantially no accelerator was applied by stamp 174. FIG. 3D shows a cross-sectional view of substrate section 184 after selective accelerated plating in accordance with the invention. As depicted in FIG. 3D, accelerator selectively attached in accelerated regions 191 increased a rate of metal plating in accelerated pattern region 191 relative to a rate of metal plating in non-accelerated regions 192. As a result, deposited metal 193 on substrate 184 has an embossed topography, with metal protrusions 194 corresponding to accelerated regions 191 of FIG. 3C. Compared to metal protrusions 194, the thickness of the thinly deposited metal 195 in non-accelerated regions 192 is relatively thin. FIG. 3E depicts cross-sectional view 196 after metal has been removed from non-accelerated regions 192 of substrate 184, resulting in isolation of metal features 198 (e.g., conductive plugs) on dielectric layer 186 having a desired metal pattern (e.g., conductive plugs 198). In some embodiments, an isotropic, kinetically-controlled wet-etching technique is used to remove deposited metal (FIG. 3D) substantially completely from non-accelerated regions 192, thereby forming metal structures 198 (FIG. 3E) in accordance with the invention. In contrast to conventional techniques known in the art, metal wirings 198 were formed without using photoresist processes.

Figure 4A:
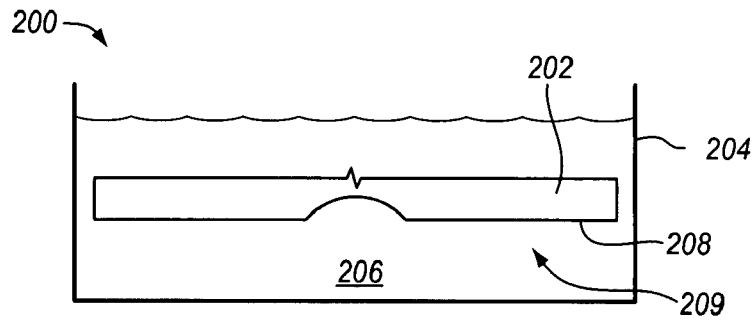
FIGS. 4A-4E depict schematically a sequence of process phases of another basic embodiment in accordance with the invention in which plating accelerator is globally applied to a substrate surface (e.g., by a sequence of a spraying application followed by a rinsing and drying step), thereafter a deactivating species is selectively applied by a stamp in a negative of a pattern corresponding to a desired metal wiring pattern, thereafter selective electroplating is conducted, followed by isotropic metal removal to isolate conductive metal features on the substrate.

As described herein with reference to FIGS. 4A-4E, in another basic embodiment in accordance with the invention, plating accelerator is globally applied to a substrate surface (e.g., by a sequence of a spraying application followed by a rinsing and drying step), thereafter a deactivating species (a pre-deposition modifier) is selectively applied by a stamp in a modification pattern, which is a negative of a desired metal pattern. Thereafter, selective electroplating is conducted, followed by isotropic metal removal to isolate conductive metal features on the substrate. FIG. 4A depicts schematically a cross-sectional view 200 of a section 202 of a stamp in accordance with the invention that is operable to apply accelerator-deactivating species to accelerator globally present on a substrate surface.

Figure 4B:
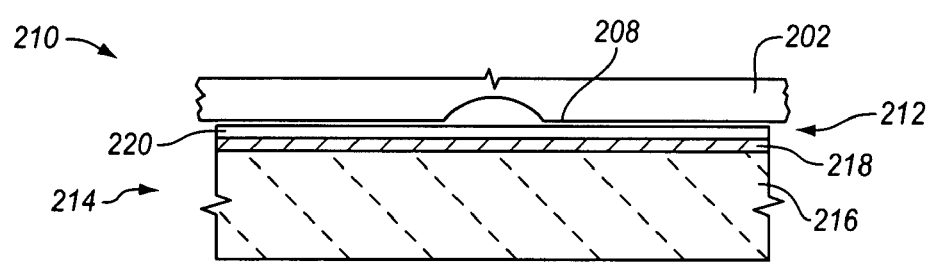
Figure 4C:
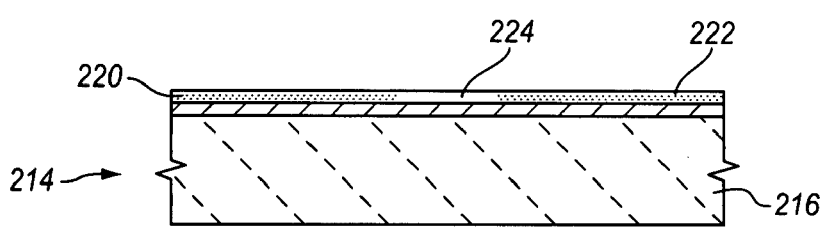
Figure 4D:
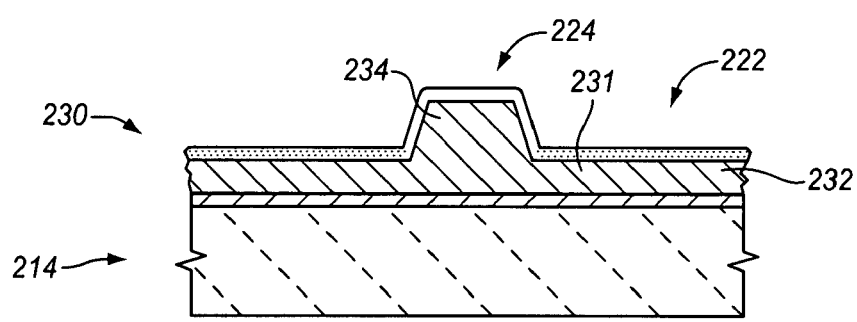
Figure 4E:
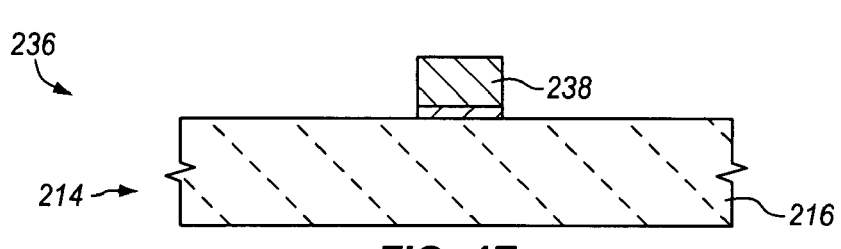

FIG. 4A further depicts deactivating bath 204 containing deactivator solution 206, in which stamp 202 is immersed. Stamp 202 includes contact surface 208 having an embossed pattern 209 corresponding to a negative of a desired metal wiring pattern in an electronic device. The stamp 202 comprises materials selected for a particular use. Typically, after immersion in bath 204 and before stamping a substrate, stamp 202 is immersed in a rinsing bath containing the ionized water or solvent without deactivator, and in some embodiments also dried (e.g., by padding with a dry cloth, passing drying air), to remove excess entrained deactivator solution from surfaces of stamp 202 to prevent undesired, inadvertent application of deactivator species onto a substrate during stamping processes. FIG. 4B depicts schematically stamp 202 during processes of selectively applying deactivator to a globally accelerated substrate surface. FIG. 4B depicts cross-sectional view 210 of contact surface 208 of stamp 202 in contact with top surface 212 of substrate section 214. Typically, top surface 212 of substrate section 214 is substantially smooth, without a recessed or a raised feature. In some embodiments, the substrate surface is curved and the stamp 202 is designed to comply to a curved (albeit smooth) surface. As depicted in FIG. 4B, substrate 214 includes dielectric base layer 216 (which is substantially smooth, having no recessed or raised features) and metal seed layer 218 (which is substantially smooth, having no recessed or raised features). As depicted in FIG. 4B, accelerator 220 has been previously globally applied to substrate 214 in accordance with the invention. In accordance with the invention, stamp 202 selectively applies deactivator to globally accelerated substrate surface 212 in a modification pattern corresponding to a negative of a desired metal wiring pattern. A suitable contact time of stamp 202 to substrate surface 212 is about 30 seconds. FIG. 4C depicts substrate 214 on which plating deactivator has been selectively applied in a negative pattern in accordance with the invention, thereby selectively deactivating regions 222 of accelerator 220, while leaving accelerator in region 224 substantially unaffected. As a result, substrate surface 212 comprises accelerated (treated) pattern regions 224 corresponding to a desired metal wiring pattern, and deactivated (non-accelerated, non-treated) regions 222 corresponding to a negative of the desired metal wiring pattern. Accelerated regions 224 of substrate 214 are located on portions of substrate surface 212 where no deactivator was applied by stamp 202. A deactivator's mode of action is not meant to be specifically limited by any implication of the schematic layers of FIG. 4C. For example, in some embodiments, the deactivator acts in one or more of the following ways: reacts with the accelerator (transforming it); co-deposits onto the surface along with the accelerator; covers and blocks the accelerator; or displaces the accelerator altogether. It is understood that in some embodiments, the order of application of global accelerator (or other pre-deposition agent) and accelerator-deactivator (or other pre-deposition modifier) is reversed; that is, the deactivator is first applied in a negative pattern to the substrate, and the accelerator is globally applied above it. FIG. 4D shows cross-sectional view 230 of substrate section 214 after selective accelerated plating in accordance with the invention. As depicted in FIG. 4D, unaffected (non-deactivated) accelerator attached in accelerated regions 224 increased a rate of metal plating in accelerated pattern region 224 relative to a rate of metal plating in deactivated (non-accelerated) negative pattern regions 222. As a result, deposited metal 231 on substrate 214 has an embossed topography, with thinly deposited metal 232 corresponding to deactivated regions 222, and with metal protrusions 234 corresponding to accelerated regions 224. FIG. 4E depicts cross-sectional view 236 after metal has been removed from deactivated negative pattern regions 222 of substrate 214, resulting in isolation of metal features 238 on dielectric layer 216 having a desired metal wiring pattern. In some embodiments, an isotropic, kinetically-controlled wet-etching technique is used to remove deposited metal (FIG. 4D) substantially completely from deactivated regions 222, thereby forming metal structures 238 (FIG. 4E) in accordance with the invention. In contrast to conventional techniques known in the art, metal wirings 238 were formed without using photoresist processes. It is understood that embodiments in accordance with the invention may include other intervening or follow-up steps, such as heating, irradiation, annealing, chemical activation using vapor or liquid phase, rinsing and drying. For example, in some embodiments, a deactivating agent solution is dried after application, and the deactivator is activated by heating.

In another embodiment (not depicted in the drawings), a global layer of accelerator precursor is applied to a substrate, and precursor activator is selectively applied in a modification pattern that is a positive pattern of a desired metal pattern.

Figure 5A:
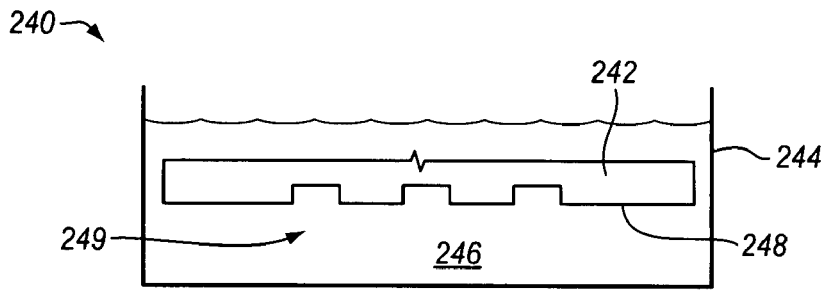
FIGS. 5A-5E depict schematically a sequence of process phases of another basic embodiment in accordance with the invention in which plating inhibitor is selectively applied by a stamp to a substrate surface in a negative of pattern corresponding to a desired metal wiring pattern, thereafter selective electroplating is conducted, followed by isotropic metal removal to isolate conductive metal features on the substrate.
Figure 5B:
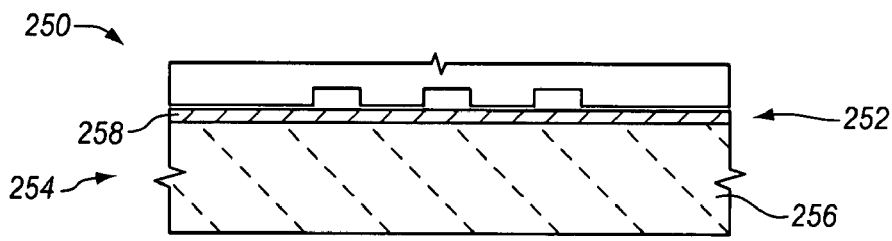
Figure 5C:
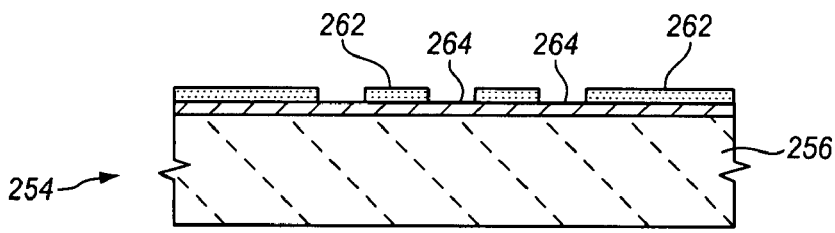
Figure 5D:
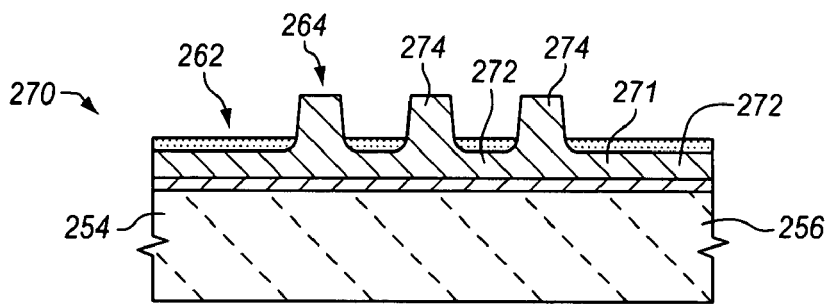
Figure 5E:
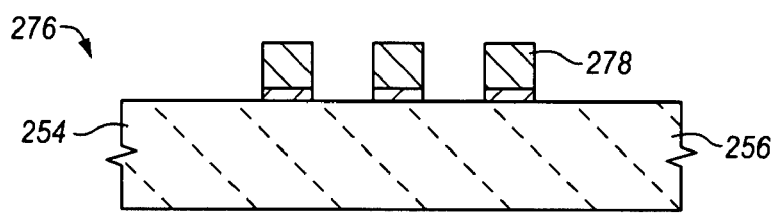

As described herein with reference to FIGS. 5A-5E, in another basic embodiment in accordance with the invention, plating inhibitor is selectively applied by a stamp to a substrate surface in a negative of a desired metal pattern. Selective electroplating is conducted, followed by isotropic metal removal to isolate conductive metal features on the substrate. FIG. 5A depicts schematically a cross-sectional view 240 of a section 242 of a stamp in accordance with the invention that is operable to apply selectively a pattern of inhibitor species onto a substrate surface. FIG. 5A further depicts inhibitor bath 244 containing inhibitor solution 246, in which stamp 242 is immersed. Stamp 242 includes contact surface 248 having an embossed pattern 249 corresponding to a negative of a desired metal pattern in an electronic device. Stamp 242 comprises materials selected for a particular use. Typically, after immersion in bath 244 and before stamping a substrate, stamp 242 is immersed in a rinsing bath containing deionized water or solvent without inhibitor, to remove excess inhibitor solution from surfaces of stamp 242 to prevent undesired, inadvertent application of inhibitor species onto a substrate during stamping processes. FIG. 5B depicts schematically stamp 242 during processes of selectively applying inhibitor to a substrate surface. FIG. 5B depicts cross-sectional view 250 of contact surface 248 of stamp 242 in contact with top surface 252 of substrate section 254. Typically, top surface 252 of substrate section 254 is substantially smooth over the scale of the features to be created, without a recessed or a raised feature, but as indicated above, in some embodiments, some curvature in the substrate is accommodated by making the stamp flexible. In some embodiments, the stamp material is flexible. In some embodiments, the stamp is specially constructed to be flexible (e.g., by being elastic, or, by being composed of blocks of regions connected by relatively thin connecting regions) and to comply with the substrate. In some embodiments, the substrate is flexible and complies to a more rigid stamp.. Generally, either the stamp or the substrate possesses some degree of compliance to accommodate minor variations in height, which commonly are found in practical circumstances due to smoothness tolerances inherent in the construction of hardware and in IC fabrication. The balance between accommodating height variations and avoiding loss of line resolution is accomplished by using stamp materials and chemical species that balance these considerations. As depicted in FIG. 5B, substrate 254 includes dielectric base layer 256 (which is shown substantially smooth, and having no recessed or raised features) and metal seed layer 258 (which is substantially smooth, having no recessed or raised features). In accordance with the invention, stamp 242 selectively applies inhibitor to substrate surface 252 in a pattern corresponding to a negative of a desired metal pattern. A suitable contact time of stamp 242 to substrate surface 252 is typically about 30 seconds, but depends on process parameters, such as the concentration of inhibitor in the stamp and its diffusion coefficient. FIG. 5C depicts substrate 254 on which plating inhibitor 260 has been selectively applied in a negative pattern in accordance with the invention, thereby forming inhibited regions 262, while leaving non-inhibited regions 264 substantially unaffected. As a result, substrate surface 252 comprises non-inhibited (non-treated) regions 264 corresponding to a desired metal pattern, and inhibited (treated) regions 262 corresponding to a negative of the desired metal pattern. Non-inhibited regions 264 of substrate 254 are located on portions of substrate surface 252 where no inhibitor was applied by stamp 242. FIG. 5D shows cross-sectional view 270 of substrate section 254 after selectively inhibited plating in accordance with the invention. As depicted in FIG. 5D, the presence of inhibitor in inhibited regions 262 inhibits the rate of metal plating in inhibited (treated) negative pattern regions 262 relative to the rate of metal plating in non-inhibited (non-treated) regions 264. As a result, deposited metal 271 on substrate 254 has an embossed topography, with thinly deposited metal 272 corresponding to inhibited regions 262, and with metal protrusions 274 corresponding to non-inhibited regions 264. FIG. 5E depicts cross-sectional view 276 after metal has been removed from inhibited negative pattern regions 262 of substrate 254, resulting in isolation of metal features 278 on dielectric layer 256 having a desired metal pattern. In some preferred embodiments, an isotropic, kinetically-controlled wet-etching technique is used to remove deposited metal (FIG. 5D) substantially completely from inhibited regions 262, thereby forming metal structures 278 (FIG. 5E) in accordance with the invention. In contrast to conventional techniques known in the art, metal features 278 are formed without using conventional photoresist processes.

Figure 5F:
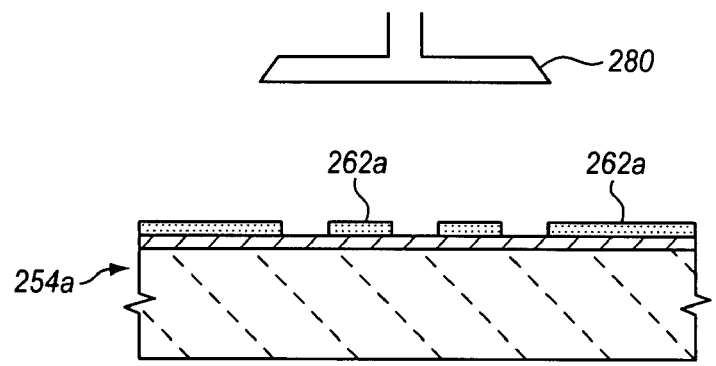
FIG. 5F depicts schematically a selectively patterned inhibitor precursor deposited on the top surface of a substrate, which inhibitor precursor is converted to inhibitor (FIG. 5C) in accordance with the invention by radiant energy directed from a lamp at the substrate.

A variation of an embodiment described with reference to FIGS. 5A-5E involves selective patterning of a substrate with inhibitor precursor, followed by activation of the precursor to make an inhibitor species. In some embodiments, activation of a inhibitor precursor is conducted by exposing the inhibitor precursor to another chemical that transforms it through chemical reaction to an active inhibitor form; or, for example, by applying heat, radiation (microwaves, UV light, X-rays) or some other form of energy to convert/decompose the inhibitor precursor to an inhibiting species. Alternatively, the combinations of the use of an additional chemical species and directed energy can be utilized. FIG. 5F depicts schematically selectively patterned inhibitor precursor 262a deposited on the top surface of substrate 254a. In accordance with the invention, inhibitor precursor 262a is converted to inhibitor 262 (FIG. 5C) by radiant energy directed from lamp 280 at substrate 254a.

It is understood that embodiments in accordance with the invention may include other intervening or follow-up steps, such as heating, irradiation, annealing, chemical activation using vapor and liquid phase, rinsing and drying.

Other embodiments (not depicted in the drawings) involve global application of an inhibitor precursor (a pre-deposition agent) on a substrate, followed by selective application of an inhibitor-precursor-activator (a pre-deposition modifier) in a modification pattern that is a negative of the desired metal pattern. Other embodiments (not depicted in the drawings) involve global application of an inhibitor (a pre-deposition agent) on a substrate, followed by selective application of an inhibitor-deactivator (inhibitor poison) (a pre-deposition modifier) in a modification pattern that is a positive of the desired metal pattern. In some embodiments, a pre-deposition modifier is applied to the substrate before application of a pre-deposition agent.

Figure 6A:
FIGS. 6A-6E depict schematically a preferred sequence of processes of a generalized method of forming a stamp in accordance with the invention suitable for selectively applying a substrate-treating species to a substrate surface, particularly for applying a species that regulates metal deposition on a substrate surface in a positive or a negative of a desired metal pattern.
Figure 6B:
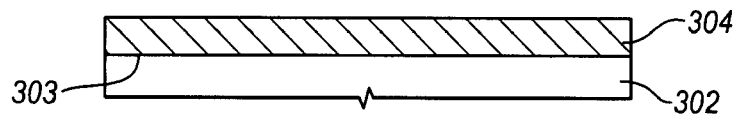
Figure 6C:
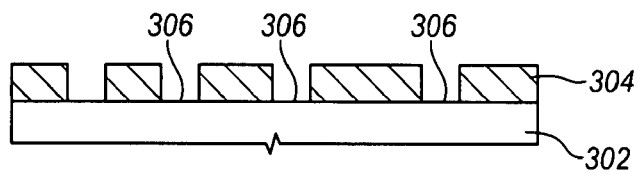
Figure 6D:
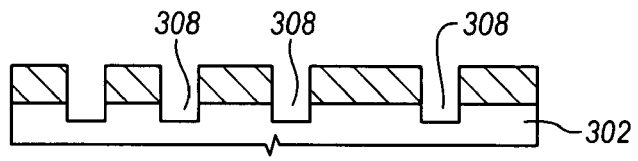
Figure 6E:

FIGS. 6A-6E depict schematically a preferred sequence of processes laying out a generalized method of forming a stamp in accordance with the invention suitable for selectively applying a substrate-treating species to a substrate surface, particularly for applying a species that regulates metal deposition on a substrate surface in a positive or negative of a desired metal pattern. FIG. 6A depicts a cross-sectional view 300 of stamp blank section 302 having stamping surface 303. FIG. 6B depicts an intermediate stage of fabrication after depositing a layer of photoresist 304 on stamping surface 303 of stamp blank 302. FIG. 6C depicts an intermediate stage after patterning and etching of resist layer 304 to expose surface portions 306 of stamping surface 303 of stamp blank 302. The choice of materials for the photoresist mask depends on the material choice of the stamp. FIG. 6D depicts an intermediate stage after etching of exposed portions 306 (FIG. 6C) to form recessed cavities 308 in stamping surface 303. The method and chemical used to perform the material removal (the "etching" of the stamp material) also depend on the specific stamp material. Examples of etching methods include plasma etch, reactive ion etching (e.g., in an oxidizing atmosphere), ion milling, wet etching, selective dissolution with a solvent of the stamp material, or other suitable methods known in the art. FIG. 6E depicts a further stage in which the remnants of patterning resist 304 have been removed from stamping surface 303, thereby forming stamp 310 having embossed contact surface 312, which is suitable for selectively applying a substrate-treating species to a substrate surface in accordance with the invention.

Figure 7A:
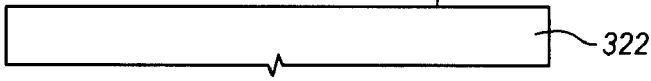
FIGS. 7A-7G depict schematically a sequence of process phases of a generalized method of forming a stamp die and using the die as a negative to impress a stamp blank and thereby fabricate a stamp for selectively applying a substrate-treating species to a substrate surface, particularly for applying a species that regulates metal deposition to a substrate surface in a positive or a negative of a desired metal pattern.
Figure 7B:
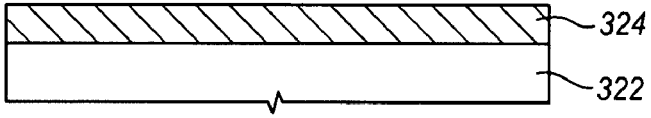
Figure 7C:
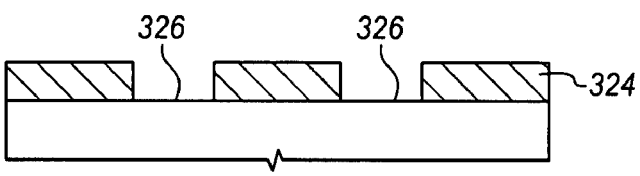
Figure 7D:
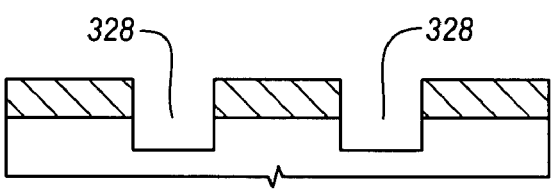
Figure 7E:
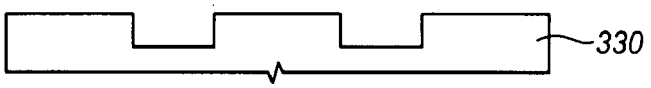
Figure 7F:
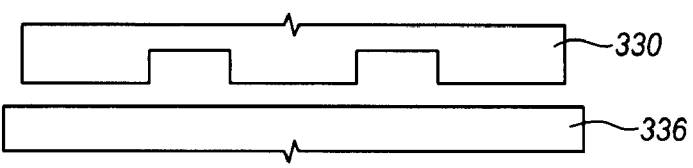
Figure 7G:
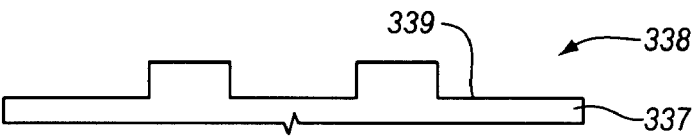

FIGS. 7A-7G depict schematically a sequence of process phases of a generalized method of forming a stamp die and using the die as a negative to impress a stamp blank and thereby fabricate a stamp for selectively applying a substrate-treating species to a substrate surface, particularly for applying a species that regulates metal deposition on a substrate surface in a positive or negative of a desired metal pattern. The stamp die is typically composed of a strong, stiff, material (e.g., metal, ceramic) to be durable and not to deform during the stamp fabrication process. FIG. 7A depicts a cross-sectional view 320 of die blank section 322 having die surface 323. FIG. 7B depicts an intermediate stage of fabrication after deposition of a layer of photoresist 324 on die surface 323 of die blank 322. FIG. 7C depicts an intermediate stage after patterning and etching of resist layer 324 to expose surface portions 326 of die surface 323 of die blank 322. FIG. 7D depicts an intermediate stage after etching of exposed portions 326 (FIG. 6C) to form recessed cavities 328 in die surface 323. FIG. 7E depicts a further stage in which the remnants of resist 324 have been removed from die surface 323, thereby forming stamp die 330 having embossed die surface 332. Stamp die 330 is suitable as a negative to impress a stamp blank and thereby fabricate a stamp for selectively applying a substrate-treating species to a substrate surface. Alternative methods of creating a stamp die include (but are not limited to): precision mechanical milling, electrochemical milling, laser ablation, and other fine feature creation techniques known in the art. The stamp may be molded to the shape of the stamp die by various means, including injection molding, deformation under pressure to conform to the shape of the stamp die, and other suitable means. FIG. 7F depicts stamp die 330 poised above stamp blank 336 before impressing stamp blank 336. FIG. 7G depicts resulting stamp 337 having an embossed pattern 338 in stamp surface 339. Embossed pattern 338 is a negative of die surface 332. Stamp 337 is operable to selectively apply a substrate-treating species to a substrate surface, particularly to apply a species that regulates metal deposition on a substrate surface in a positive or negative of a desired metal pattern.

In another embodiment in accordance with the invention, a stamp die (e.g., stamped die 330) is used as a positive to impress a stamp blank and thereby fabricate a stamp for selectively applying a substrate-treating species to a substrate surface. FIG. 8A depicts stamp die 330 poised above stamp blank 340 before impressing stamp blank 340. FIG. 8B depicts resulting stamp 342 having an embossed pattern 343 in stamp surface 344. Embossed pattern 343 is a positive of die surface 332. While not shown, in some embodiments, a die of the form shown in FIG. 8A is created by a process wherein the material of the die is forced into the shape of die stamp 330 by applying physical pressure (e.g., pneumatically) to an elastic backing substrate (e.g., high temperature silicon rubber). Also, in some embodiments, die stamp 330 contains small holes in the feature region to allow the release of gas so that the stamp material conforms to the stamp die shape within the features. Stamp 342 is operable to apply selectively a substrate-treating species to a substrate surface, particularly to apply a species that regulates metal deposition on a substrate surface in a positive or a negative of a desired metal pattern.

FIG. 9 depicts schematically a system 352 that is operable to use a stamp in accordance with the invention to apply selectively a substrate-treating species to a substrate surface, particularly to apply a species that regulates metal deposition on a substrate surface in a positive or negative of a desired metal pattern. System 352 includes a substrate holder 354 for holding a substrate 356. System 352 also includes a stamp assembly 358, which comprises: stamp 360; stamping head 362; stamp mounting plate 364 on which stamp 360 is mounted; liquid reservoir 366 and substrate-treating solution 368 located in reservoir 366; and liquid delivery ports for conveying substrate-treating solution 368 from reservoir 366 to stamp 360 in a controlled manner. Stamp assembly 358 is operable to be moved vertically up and down and to apply desired stamping pressure when stamping surface 372 of stamp 360 is in physical contact with top surface 374 of substrate 356. System 352 is particularly useful for applying selectively a species that regulates metal plating; for example, an accelerator, an inhibitor, and activators and deactivators.

Figure 10A:
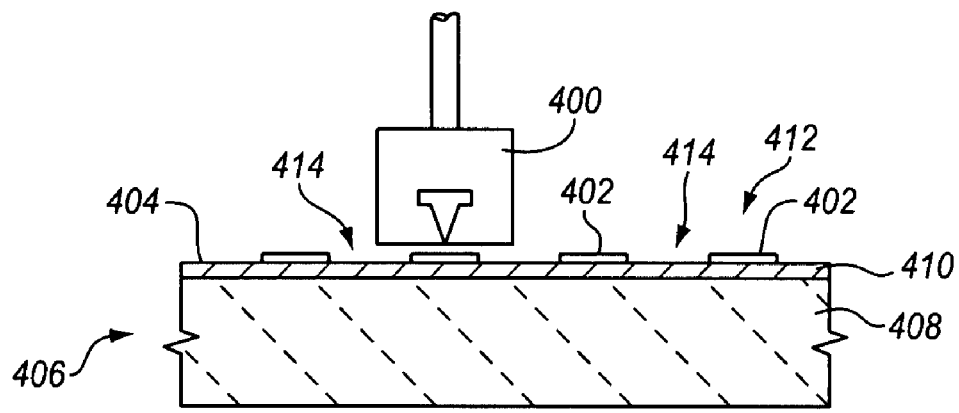
FIGS. 10A-10C depict schematically a sequence of process phases of a generalized method in accordance with the invention in which an inkjet-type device is used to apply selectively a substrate-treating species to a substrate surface, particularly to apply a species that accelerates metal deposition on a substrate surface in a positive of a desired metal wiring pattern.

Some embodiments in accordance with the invention utilize an inkjet-type device to apply selectively a substrate-treating species to a substrate surface, particularly to apply a species that regulates metal deposition on a substrate surface in a positive or negative of a desired metal pattern. FIG. 10A depicts schematically an inkjet printer 400 during processes of selectively applying accelerator species 402 to top surface 404 of substrate 406. Typically, top surface 404 of substrate section 214 is substantially smooth, without a recessed or a raised feature. Substrate 406 includes base dielectric layer 408 and metal seed layer 410, which is located on dielectric layer 408. As depicted in FIG. 10A, accelerator 402 (a pre-deposition agent) has been selectively applied to substrate 406 in a pattern corresponding to a desired metal pattern in electronic device. The selective application of accelerator formed accelerated (treated) pattern regions 412 on substrate surface 404. Non-accelerated (non-treated) regions 414 of substrate 406 are located on portions of substrate surface 404 on which no accelerator was applied with inkjet printer 400.

Figure 10B:
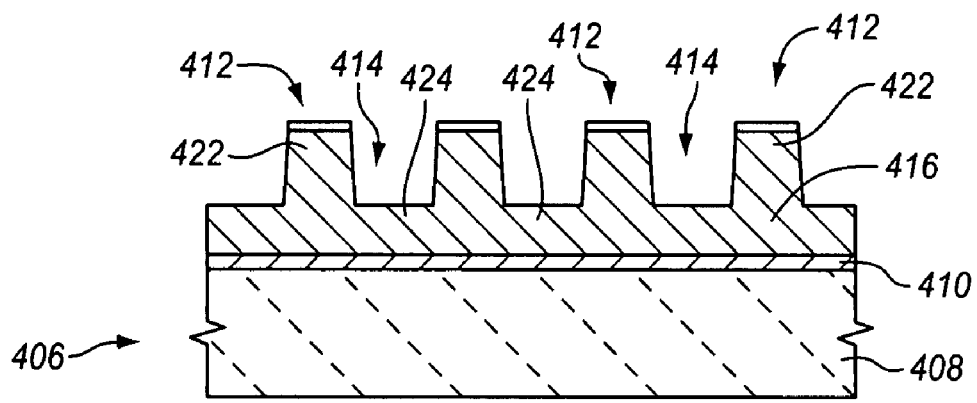
Figure 10C:
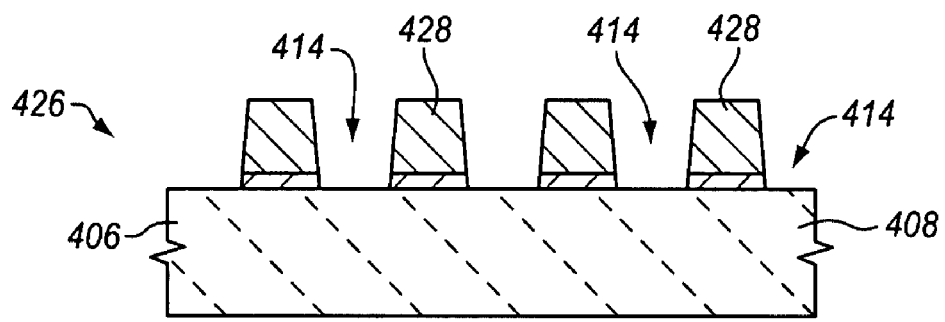

FIG. 10B depicts a cross-sectional view of substrate section 406 after selective accelerated plating in accordance with the invention. As depicted in FIG. 10B, accelerator selectively attached in accelerated regions 412 increased a rate of metal plating in accelerated pattern region 412 relative to a rate of metal plating in non-accelerated regions 414. As a result, deposited metal 416 on substrate 406 has an embossed topography, with metal protrusions 422 corresponding to accelerated regions 412, and thinly deposited metal 424 corresponding to non-accelerated regions 414. FIG. 10C depicts cross-sectional view 426 after metal has been substantially completely removed from non-accelerated regions 414 of substrate 406, resulting in isolation of metal features 428 (e.g., conductive plugs) on dielectric layer 408 in a desired metal pattern. In some embodiments, an isotropic, kinetically-controlled wet-etching technique is used to remove deposited metal (FIG. 10B) substantially completely from non-accelerated regions 414, thereby forming metal structures 428 (FIG. 10C) in accordance with the invention. In contrast to conventional techniques known in the art, metal wirings 428 were formed without using photoresist processes.

Figure 11A:
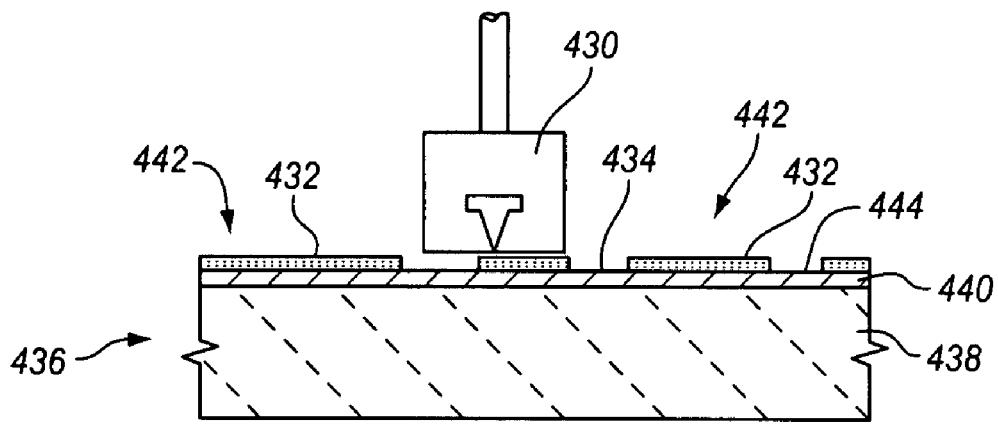
FIGS. 11A-11C depict schematically a sequence of process phases of a generalized method in accordance with the invention in which an inkjet-type device is used to apply selectively a substrate-treating species to a substrate surface, particularly to apply a species that inhibits metal deposition a substrate surface in a negative of a desired metal wiring pattern.

FIG. 11A depicts schematically an inkjet printer 430 during processes of selectively applying inhibitor species 432 to top surface 434 of substrate 436. Typically, top surface 434 of substrate section 434 is substantially smooth, without a recessed or a raised feature. Substrate 436 includes base dielectric layer 438 and metal seed layer 440, which is located on dielectric layer 438. As depicted in FIG. 11A, inhibitor 432 (a pre-deposition agent) is being selectively applied to substrate 436 in a pattern corresponding to a negative of a desired metal pattern in an electronic device. The selectively applied inhibitor forms inhibited (treated) pattern regions 442 on substrate surface 434. Non-inhibited (non-treated) regions 444 of substrate 436 are located on portions of substrate surface 434 on which no inhibitor was applied with inkjet printer 430.

Figure 11B:
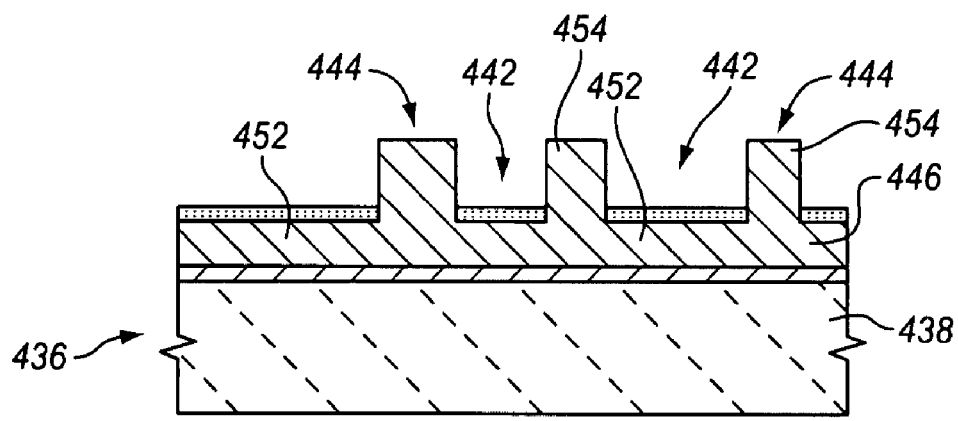
Figure 11C:
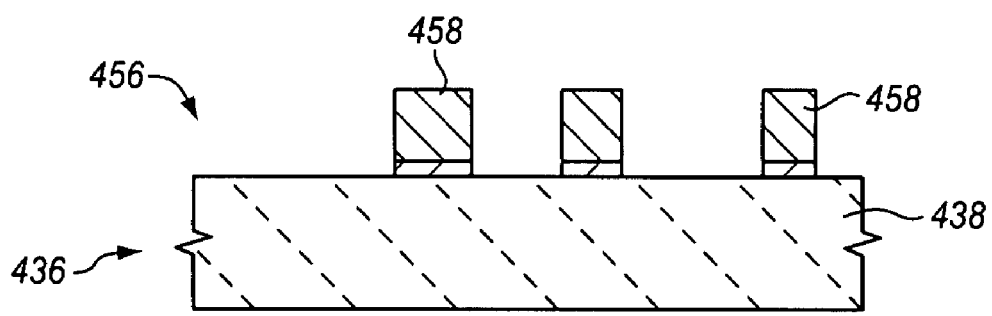

FIG. 11B depicts a cross-sectional view of substrate section 436 after selectively inhibited plating in accordance with the invention. As depicted in FIG. 11B, inhibitor selectively attached in inhibited regions 442 inhibited a rate of metal plating in inhibited (treated) regions 442 relative to a rate of metal plating in non-inhibited (non-treated) regions 444. As a result, deposited metal 446 on substrate 436 has an embossed topography, with thinly deposited metal 452 corresponding to inhibited regions 442, and thicker metal protrusions 454 corresponding to non-inhibited regions 444. FIG. 11C depicts cross-sectional view 456 of substrate 436 after metal has been substantially completely removed from inhibited regions 442 of substrate 436, resulting in isolation of metal features 458 (e.g., conductive plugs) on dielectric layer 436 in a desired metal pattern. In some embodiments, an isotropic, kinetically-controlled wet-etching technique is used to remove deposited metal (FIG. 11C) substantially completely from inhibited regions 442, thereby forming metal structures 458 (FIG. 11C) in accordance with the invention. In contrast to conventional techniques known in the art, metal wirings 458 were formed without using photoresist processes.

Figure 12A:
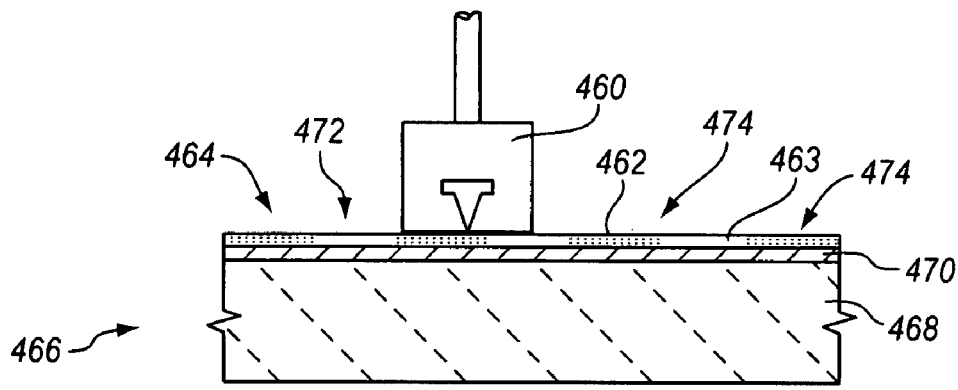
FIGS. 12A-12C depict schematically a sequence of process phases of a generalized method in accordance with the invention in which an inkjet-type device is used to apply selectively a deactivating species to a substrate surface in a negative of a desired metal wiring pattern, particularly to apply a species that deactivates accelerator globally present on the substrate surface.

FIG. 12A depicts schematically an inkjet printer 460 during processes of selectively applying deactivating species (pre-deposition modifier) to accelerator (pre-deposition agent) globally present on a substrate surface. Inkjet printer 460 selectively applies deactivating species 462 to global accelerator layer 463 at top surface 464 of substrate 466. Typically, top surface 464 of substrate section 466 is substantially smooth, without a recessed or a raised feature. Substrate 466 includes base dielectric layer 468 and metal seed layer 470, which is located on dielectric layer 468. As depicted in FIG. 12A, deactivator species 462 has been selectively applied to substrate 466 in a pattern corresponding to a negative of a desired metal pattern in an electronic device. The selective application of deactivator resulted in accelerated pattern regions 472 at portions of substrate surface 464 at which accelerator 463 was not deactivated. Selective application of deactivator also resulted in deactivated regions 474 located on portions of substrate surface 464 on which deactivator was applied with inkjet printer 460.

Figure 12B:
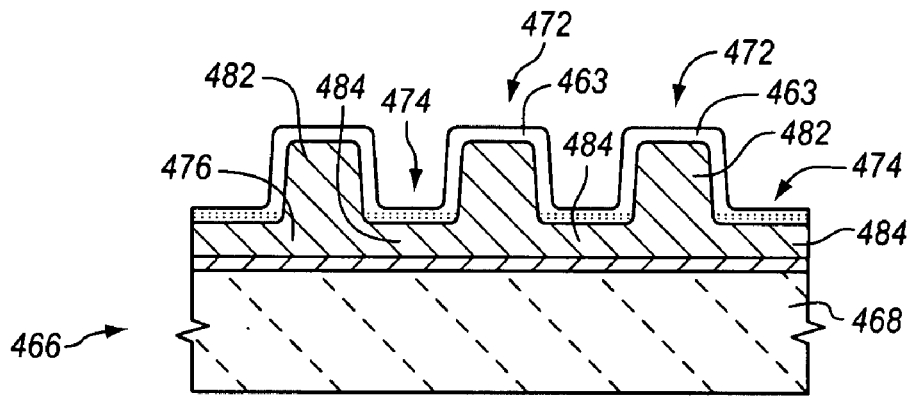
Figure 12C:
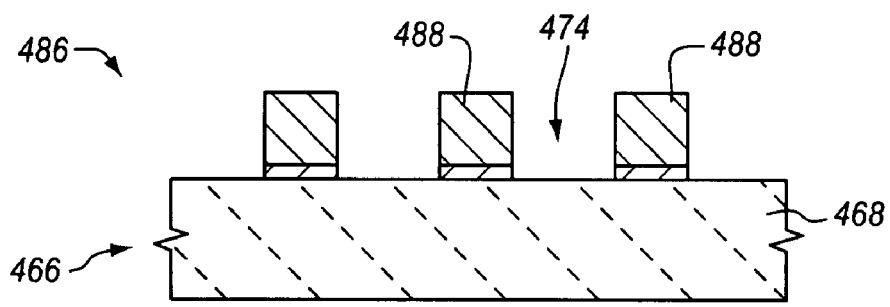

FIG. 12B depicts a cross-sectional view of substrate section 466 after selective accelerated plating in accordance with the invention. As depicted in FIG. 12B, accelerator selectively attached in accelerated regions 472 increased a rate of metal plating in accelerated pattern regions 472 relative to a rate of metal plating in non-accelerated (deactivated) regions 474. As a result, deposited metal 476 on substrate 466 has an embossed topography, with metal protrusions 482 corresponding to accelerated regions 472, and thinly deposited metal 484 corresponding to deactivated regions 474. FIG. 12C depicts cross-sectional view 486 after metal has been substantially completely removed from deactivated regions 474 of substrate 466, resulting in isolation of metal features 488 (e.g., conductive plugs) on dielectric layer 468 in a desired metal pattern. In some embodiments, an isotropic, kinetically-controlled wet-etching technique is used to remove deposited metal (FIG. 12C) substantially completely from deactivated regions 474, thereby forming metal structures 488 (FIG. 12C) in accordance with the invention. In contrast to conventional techniques known in the art, metal wirings 488 were formed without using photoresist processes.

Figure 13:
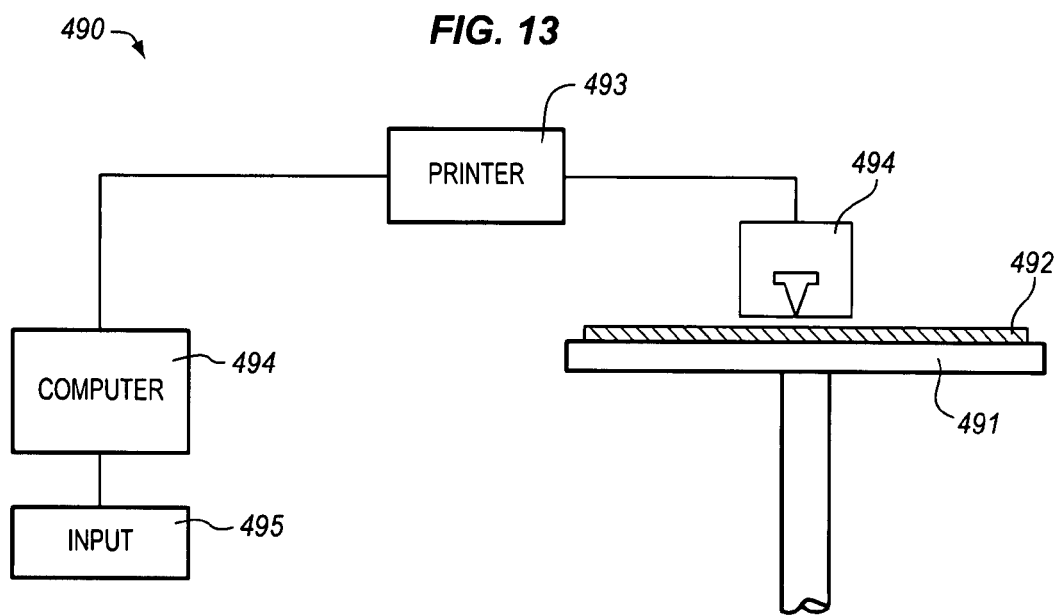
FIG. 13 depicts schematically an inkjet system that is operable to apply selectively a substrate-treating species to a substrate surface, particularly to apply a species that regulates metal deposition on a substrate surface in a positive or a negative pattern corresponding to a desired metal pattern.

FIG. 13 depicts schematically an inkjet system 490 that is operable to apply selectively a substrate-treating species to a substrate surface, particularly to apply a species that regulates metal deposition on a substrate surface in a positive or a negative pattern corresponding to a desired metal pattern. System 490 includes substrate holder 491 for holding a substrate 492 during inkjet application of a substrate-treating species in a desired pattern. System 490 further includes inkjet printer position control unit 493, which comprises inkjet printer head 494. While system 490 shows a single nozzle, some embodiments include an array of nozzles mounted on a single movable head assembly, or a plurality of nozzles, each separately operable in space and time, so as to reduce the time to imprint the surface. System 490 further comprises computer 494 that includes driver software for controlling printer unit 493. System 490 also typically includes one more input devices 495 operable to input pattern design information and inkjet printing instructions.

Some embodiments in accordance with the invention apply a pattern of a selected form of electromagnetic radiation to a global layer of a substrate-treating species (including a precursor of a substrate-treating species) to create a pattern of corresponding substrate-treating species on the substrate. In some embodiments, energy applied to the substrate activates or alternatively deactivates a patterned portion of the global layer. In some embodiments, the energy removes, or ablates, substrate-treating species or precursor from the substrate. Generally, radiation is directed through a patterned mask towards the substrate. Techniques for making patterned masks operable to selectively irradiate and to shield a substrate are known in the field of photolithography. Alternatively, in some embodiments, radiation is applied to various portions of the surface by scanning a focused beam of energy along and across the surface to activate, deactivate, or remove/ablate substrate-treating species, such as by a focused laser.

Techniques in accordance with the invention for global application of substrate-treating species, such as an accelerator or an inhibitor (or precursor species), to a substrate surface include one or more of a variety of means including, but not limited to: dipping the surface in a solution containing substrate-treating species species; spraying the surface with a solution containing dissolved substrate-treating species; drying a surface of a liquid containing dissolved substrate-treating species or precursors of substrate-treating species; depositing a film from a vapor containing the substrate-treating species; electrochemically transforming precursors of substrate-treating species to form a chemically active substrate-treating species, and electrolessly forming a substrate-treating species.

Figure 14A:
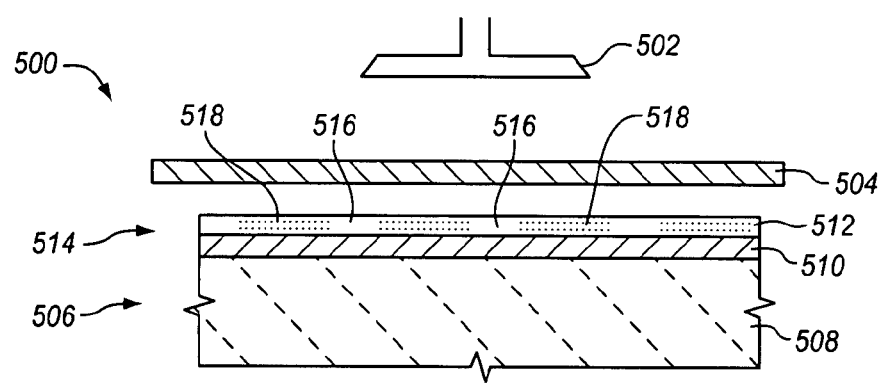
FIG. 14A depicts schematically a system in accordance with the invention during patterned irradiation of a substrate to activate selectively a global layer of accelerator precursor, thereby producing a pattern of activated accelerator.

FIG. 14A depicts schematically a system 500 during patterned irradiation of a substrate to activate selectively a global layer of accelerator precursor, thereby producing a pattern of activated accelerator. System 500 includes lamp 502 (or other radiation source) and patterned mask 504. Mask 504 is located between radiation lamp 502 and substrate 506. Substrate 506 comprises base dielectric layer 508 and metal seed layer 510 covering dielectric layer 508. Typically (though not necessarily), substrate 506 is substantially smooth, having no raised or recessed features. As depicted in FIG. 14A, a layer of accelerator precursor 512 has been selectively irradiated in accordance with the invention to generate a desired pattern of plating accelerator species on substrate 506. As a result, the top surface 514 of substrate 506 has patterned accelerated regions 516 located where radiation from lamp 502 passing through patterned mask 504 activated accelerator precursor. Accelerated patterned regions 516 correspond to a desired metal pattern of an electronic device. Non-accelerated regions 518 are located on top surface 514 on areas that were substantially masked against the radiation by mask 504. Typically, selective accelerated plating is conducted on selectively accelerated substrate 506 using processes in accordance with the invention (e.g., processes analogous to electroplating and metal-removal processes described with reference to FIGS. 2E-2G and FIGS. 3C-3E) to form isolated metal wiring structures on dielectric base layer 508, typically without using photoresist processes.

Figure 14B:
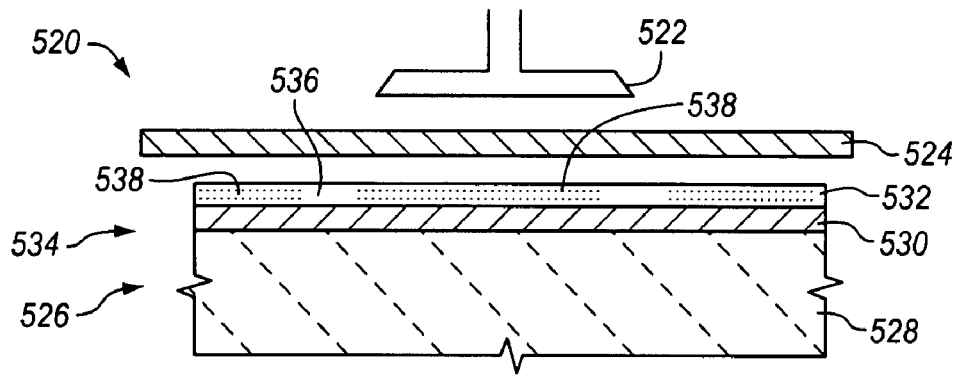
FIG. 14B depicts schematically a system in accordance with the invention during patterned irradiation of a substrate to deactivate selectively a global layer of accelerator.

FIG. 14B depicts schematically a system 520 during patterned irradiation of a substrate to deactivate selectively a global layer of accelerator. System 520 includes lamp 522 (or other radiation source) and patterned mask 524. Mask 524 is located between radiation lamp 522 and substrate 526. Substrate 526 comprises base dielectric layer 528 and metal seed layer 530 covering dielectric layer 528. Typically (though not necessarily), substrate 526 is substantially smooth, having no raised or recessed features. As depicted in FIG. 14B, a layer of electroplating accelerator 532 has been selectively irradiated in accordance with the invention to deactivate portions of accelerator 532, thereby generating a desired positive pattern of plating accelerator species and a negative pattern of deactivated accelerator on substrate 526. As a result, the top surface 534 of substrate 526 has patterned accelerated regions 536, and a pattern of non-accelerated (deactivated) regions 538 located where radiation from lamp 522 passing through patterned mask 524 deactivated accelerator 532. Accelerated patterned regions 536 correspond to a desired metal pattern of an electronic device and are located on areas of substrate 506 that were substantially masked by mask 524 against deactivating radiation. Deactivated regions 538 are located on top surface 534 of substrate 506 on areas that were not substantially masked against deactivating radiation. Typically, selective accelerated plating is conducted on accelerated, selectively deactivated substrate 526 using processes in accordance with the invention (e.g., processes analogous to electroplating and metal-removal processes described with reference to FIGS. 4C-4E) to form isolated metal wiring structures on dielectric base layer 528, typically without using photoresist processes.

Figure 15A:
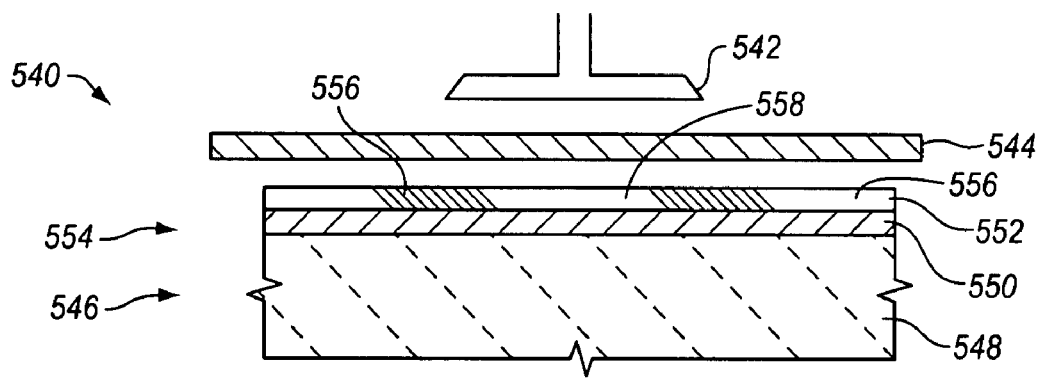
FIG. 15A depicts schematically a system in accordance with the invention during patterned irradiation of a substrate to activate selectively a global layer of inhibitor precursor.

FIG. 15A depicts schematically a system 540 during patterned irradiation of a substrate to activate selectively a global layer of inhibitor precursor. System 540 includes lamp 542 (or other radiation source) and patterned mask 544. Mask 544 is located between radiation lamp 542 and substrate 546. Substrate 546 comprises base dielectric layer 548 and metal seed layer 550 covering dielectric layer 548. Typically (though not necessarily), substrate 546 is substantially smooth, having no raised or recessed features. As depicted in FIG. 15A, a layer of inhibitor precursor 552 has been selectively irradiated in accordance with the invention to generate a desired pattern of plating inhibitor species on substrate 546. As a result, the top surface 554 of substrate 546 has inhibited pattern regions 556 located where radiation from lamp 542 passing through patterned mask 544 activated inhibitor precursor 552. Non-inhibited regions 558 are located on top surface 554 on areas that were substantially masked against radiation by mask 544. Non-inhibited regions 558 correspond to a desired metal pattern of an electronic device. Typically, selective inhibited deposition is conducted on selectively inhibited substrate 546 using processes in accordance with the invention (e.g., processes analogous to electroplating and metal-removal processes described with reference to FIGS. 5C-5E) to form isolated metal wiring structures on dielectric base layer 548, typically without using photoresist processes.

Figure 15B:
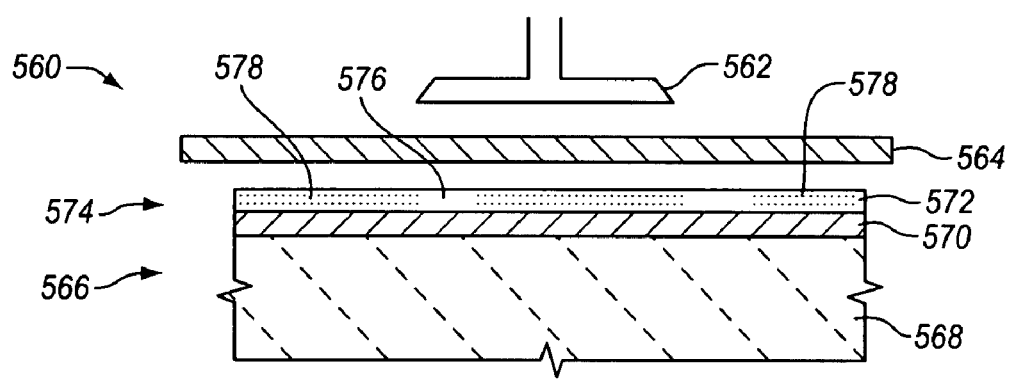
FIG. 15B depicts schematically a system in accordance with the invention during patterned irradiation of a substrate to deactivate selectively a global layer of inhibitor.

FIG. 15B depicts schematically a system 560 during patterned irradiation of a substrate to deactivate selectively a global layer of inhibitor. System 560 includes lamp 562 (or other radiation source) and patterned mask 564. Mask 564 is located between radiation lamp 562 and substrate 566. Substrate 566 comprises base dielectric layer 568 and metal seed layer 570 covering dielectric layer 568. Typically (though not necessarily), substrate 566 is substantially smooth, having no raised or recessed features. As depicted in FIG. 15B, a layer of electroplating inhibitor 572 has been selectively irradiated in accordance with the invention to deactivate portions of inhibitor 572, thereby generating a desired positive pattern of deactivated inhibitor species and a negative pattern of inhibitor on substrate 566. As a result, the top surface 574 of substrate 566 has non-inhibited pattern regions 576 (where radiation from lamp 562 passing through patterned mask 564 deactivated inhibitor 572) and a inhibited (non-deactivated) regions 578. Non-inhibited pattern regions 576 correspond to a desired metal pattern of an electronic device. Inhibited regions 578 are located on top surface 574 of substrate 566 on areas that were not substantially masked against deactivating radiation. Typically, selective inhibited metal deposition is conducted on selectively inhibited substrate 566 using processes in accordance with the invention (e.g., processes analogous to electroplating and metal-removal processes described with reference to FIGS. 5C-5E) to form isolated metal wiring structures on dielectric base layer 568, typically without using photoresist processes.

Figure 16A:
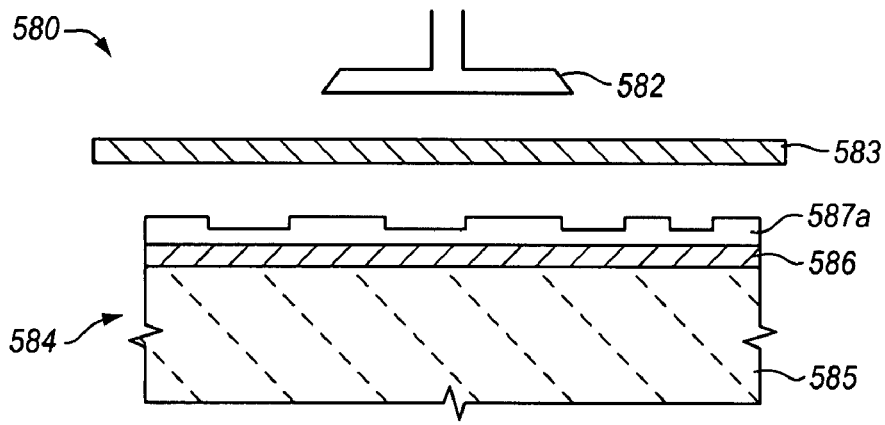
FIGS. 16A-16B depict schematically stages of patterned irradiation of a substrate to ablate selectively a global layer of a substrate-treating species (including a precursor of a substrate-treating species) to create a pattern of corresponding substrate-treating species on the substrate.
Figure 16B:
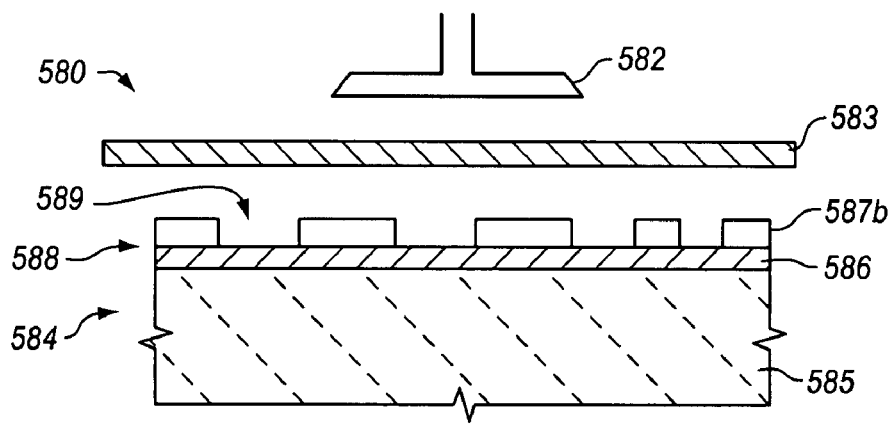

FIG. 16A depicts schematically a system 580 in an intermediate stage of patterned irradiation of a substrate to ablate selectively a global layer of a substrate-treating species (including a precursor of a substrate-treating species) to create a pattern of corresponding substrate-treating species on the substrate. System 580 includes lamp 582 (or other radiation source) and patterned mask 583. Mask 583 is located between radiation lamp 522 and substrate 584. Substrate 584 comprises base dielectric layer 585 and metal seed layer 586 covering dielectric layer 585. Typically (though not necessarily), substrate 584 is substantially smooth, having no raised or recessed features. As depicted in FIG. 16A, a layer of substrate-treating species or a substrate-treating precursor species 587a has been selectively irradiated in accordance with the invention to ablate portions of species layer 587a. FIG. 16B depicts schematically a later stage of patterned ablation in which substrate-treating species or substrate-treating precursor has been substantially completely removed by ablation from portions of the substrate 584, resulting in a desired positive pattern of substrate-treating species (or precursor) 587b. As a result, the top surface 588 of substrate 584 has exposed regions 589 (where ablating energy from lamp 582 passing through patterned mask 583 removed portions of layer 587a) and a pattern of substrate-treating species (or precursor) 587b. In some embodiments, patterned layer 587b comprises accelerator species or accelerator precursor. In other embodiments, patterned layer 587b comprises inhibitor species or inhibitor precursor.

In some embodiments, energy applied to the substrate in additional steps activates the patterned portion of substrate-treating precursor species.

Figure 17:
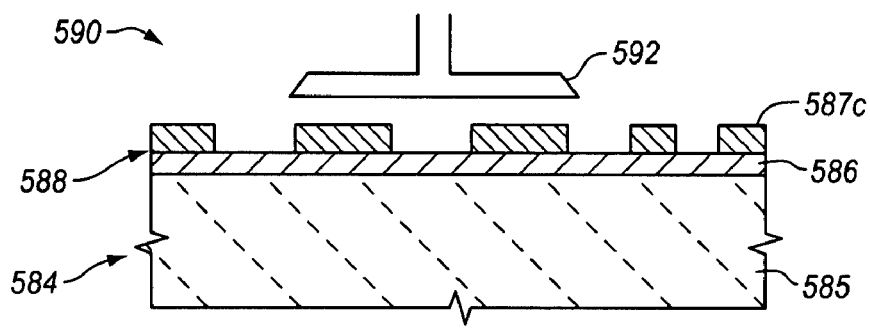
FIG. 17 depicts schematically a system and a process stage in which a selective pattern of substrate-treating precursor has been converted through irradiation to an activated plating accelerator or plating inhibitor.

FIG. 17 depicts schematically a system 590 in which a selective pattern of substrate-treating precursor (e.g., a precursor pattern 587b in selected embodiments of system 580 depicted in FIG. 16B) has been converted through irradiation by lamp 592 to an activated plating accelerator or plating inhibitor 587c. In embodiments in which patterned layer 587b or 587c comprise plating accelerator, selective accelerated deposition is conducted on selectively accelerated substrate 584 using processes in accordance with the invention (e.g., processes analogous to electroplating and metal-removal processes described with reference to FIGS. 4C-4E) to form isolated metal wiring structures on dielectric base layer 584, typically without using photoresist processes. In other embodiments in which patterned layer 587b or 587c comprise plating inhibitor, selective inhibited deposition is conducted on selectively inhibitied substrate 584 using processes in accordance with the invention (e.g., processes analogous to electroplating and metal-removal processes described with reference to FIGS. 5C-5E) to form isolated metal wiring structures on dielectric base layer 584, typically without using photoresist processes.

A lamp 164, 502, 522, 542, 562, 592 that is operable to a irradiate a substrate in accordance with the invention typically supplies radiation selected from a group including, among others: UV radiation, microwave, X-ray, excimer laser light, and infrared. It is understood that various other techniques in addition to irradiation are suitable to convert a precursor species to an active species, and to deactivate an active species, such as particle and ion bombardment. Still other techniques include, among others: oven heating; and addition of chemical reactants to cause chemical reaction.

Laser ablation is similar to conventional photolithography in that light is projected through a patterned mask onto a substrate or focuses and scans over the surface. Techniques for making dielectric masks suitable for use with constant-source, pulsed, and excimer laser ablation are known in the art. Exemplary mask materials include chrome coated glass. Exemplary specification and operating ranges are: laser wavelength, 200 to 800 nanometer (nm); pulse width, 1 ps to continuous (1% to 100% duty cycle); pulse frequency, 1 to 100000 per second; intensity, 10 mW to 100 W; 0.3 to 1000 μm spot size).

Figure 1D:
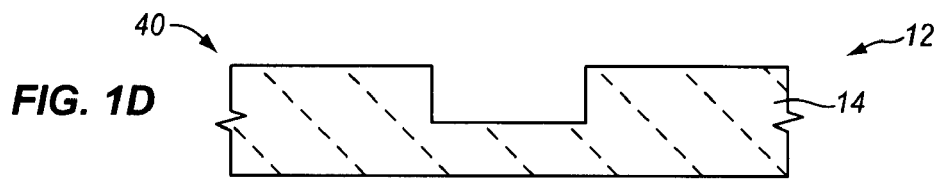
Figure 1E:
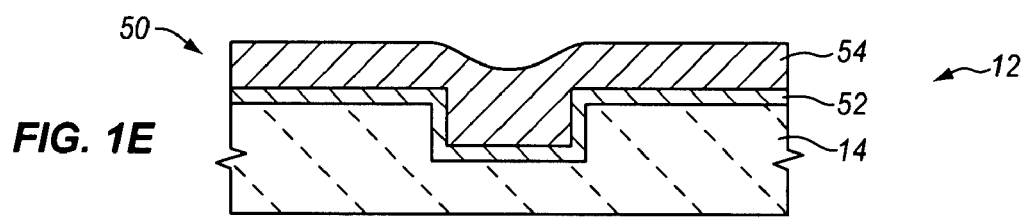
Figure 1F:
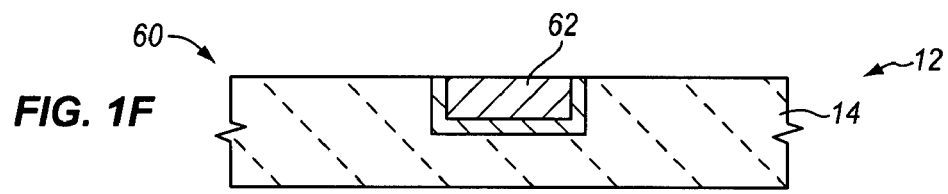

Some embodiments in accordance with the invention combine some of the techniques of classical damascence feature filling and a global inhibition of the raised (field) surface with inhibitor or inhibitor precursor species to achieve improved damascene feature filling. Such techniques are able to enhance the relative rates of plating within and outside the features, allowing filling of features that could not be accomplished by more classical means. Generally, a structure similar to that shown in FIG. 1D is achieved by damascene patterning methods known in the art, and a seed layer of metal (optionally over a barrier/adhesion layer) is globally deposited over the flat field and the recessed regions. Next, accelerator is deposited into the feature recesses. Various methods of accomplishing this are available, such as spraying the surface with an accelerator globally (e.g., with mercaptoethane sulphonic acid), or initiating electrodeposition in a plating bath containing electrochemically active accelerator (e.g., dimercaptopropane sulphonic acid). An objective of the pre-inhibition phase of the process is to avoid saturating the inside of the features with accelerator, because a curvature-enhanced bottom-up filling mechanism is desired. Note that the accelerator in some embodiments is selectively placed within the features, though this is not a requirement of the invention. No matter how accelerator is provided in the features, a following step includes pressing a stamp containing inhibitor or inhibitor precursor onto the surface, as described above. But, in these embodiments, the stamp is substantially flat, rather than having raised (embossed) features. The role of the flat stamp is to transfer inhibitor to the raised portions of the surface while not transferring material to the recessed regions. In some embodiments, the inhibitor has a preferential or stronger interaction with the surface than accelerator, thereby displacing the accelerator from the field regions. In other embodiments, the applied plating agent chemically reacts with the accelerator, deactivating it or making it an inhibitor.

Because in some embodiments the recessed region may be quite wide and narrow (i.e., it can have a very low aspect ratio), it is important that the stamp used be of considerable stiffness to avoid bending it into the wider features, thereby avoiding contacting the stamp with the bottom of the features and imparting inhibitor into a region where it is not desired. In some cases, the damascene surface is not perfectly flat (due to mechanical construction tolerances or underlying topography of a multilayered device), so some degree of compliance is required on a longer length scale. Therefore, a balancing between having the stamp not penetrate certain features, but not having it be too rigid to make good contact, is often required. In some embodiments, this balancing is done by, among other techniques: choosing a stamp material that does not touch the bottom of the widest features with the target applied pressure; by dividing the stamp into sub-sections connected by very thin regions, allowing a group of relatively stiff blocks to comply to the surface independently.

Once the inhibitor has been applied to the surface (or inhibitor precursor has been applied and converted by appropriated means to an inhibitive species), metal deposition on the substrate surface is performed. Due to the relative polarization of the recess accelerated regions and the inhibited raised regions, extremely large relative rates of electroplating can be achieved. In other embodiments, accelerator is not applied to the recessed areas. Inhibitor or inhibitor precursor is applied by stamping or other technique to the field areas or other exposed raised areas of the substrate as explained above. Thereafter, metal deposition in the untreated (recessed) regions is faster than in the inhibited (treated) regions of the exposed field and raised areas.

Some embodiments in accordance with the invention include systems and methods for selective anodic dissolution of metal corresponding to a desired metal pattern of an electronic device. Generally, in preferred embodiments, a cationic membrane having an embossed pattern is pressed against the top surface of a substrate which is subsequently anodized. The raised surfaces of the patterned membrane displace, or make less accessible, electrolyte liquid from portions of the substrate surface in physical contact with the membrane. Because there is little or no fluid/electrolyte between the membrane and portions of the substrate surface in contact with the membrane, this substantially prevents anodic dissolution. Electrolyte liquid is present, however, in the hollows, or pockets, of the membrane between raised membrane surfaces. This electrolyte liquid is in contact with the anodized substrate surface. While not wanting to be limited by any particular theory or mechanism, it is suggested that in at least some cases, the electrolyte is a necessary component for the complexing of the anodically formed metal ions, for the formation of protons to enable the dissolution of metal ions, and for other mechanisms. Osmotic drag of the solvent bound to the metal and to protons created during the anodic processes often accompanies the transport of cations through a cationic membrane to maintain its transport properties. Therefore, in some cases, the lack of solvent/electrolyte in between the embossed sections of the membrane and the surface directly or indirectly hinders the anodic dissolution process. In some embodiments, the solvent is a highly resistive electrolyte, or simply pure solvent (e.g., water). In some embodiments, the anodic reaction that removes metal is accompanied by electrolysis of the solvent (e.g., water), which forms protons.

$$2H_2O \rightarrow 4H^+ + O_2 + 4e^-$$

In such embodiments, the formation of protons decreases the pH (i.e., makes the electrolyte more acidic), which facilitates dissolution of a soluble form of metal ion (rather than formation or precipitation of an oxide).

Figure 18A:
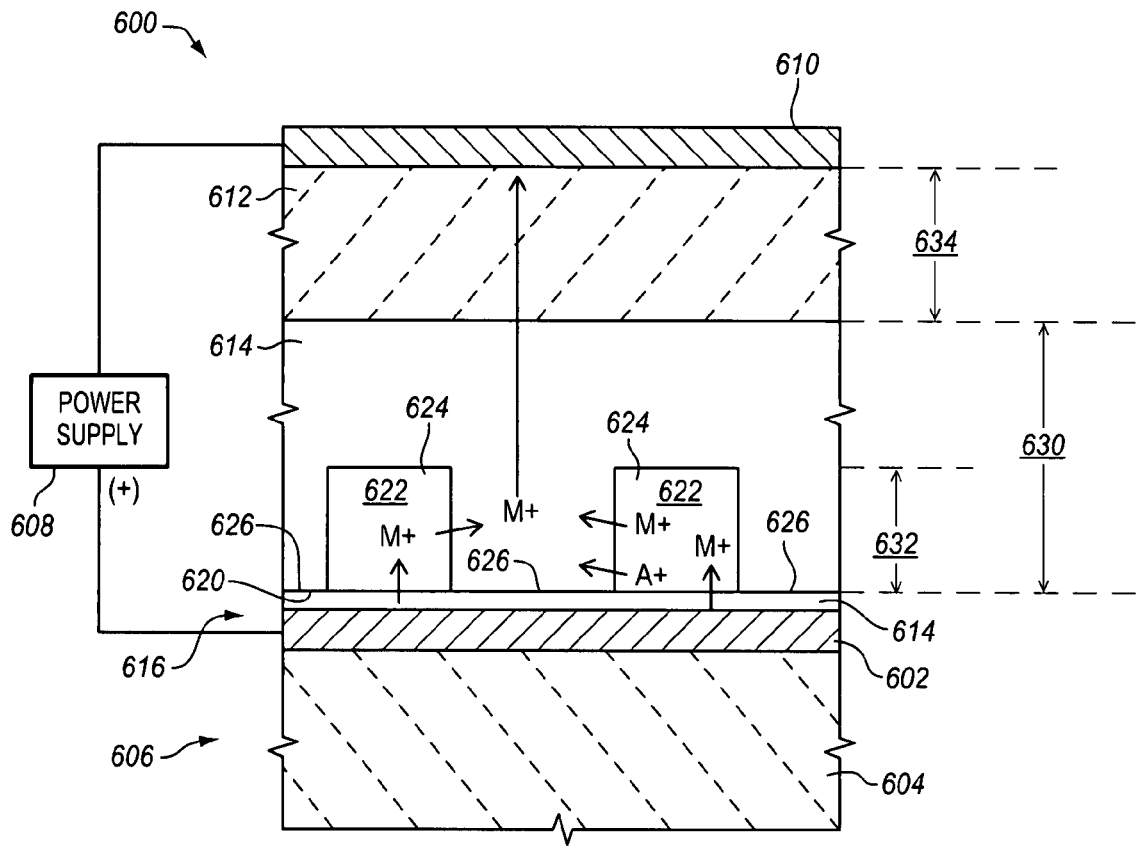
FIG. 18A depicts schematically a system in accordance with the invention that is operable to conduct anodic dissolution of a substrate surface.

FIG. 18A depicts schematically a system 600 in accordance with the invention that is operable to conduct anodic dissolution of a substrate surface. In system 600, metal seed layer 602 located on base dielectric layer 604 of substrate 606 functions as an anode. Power supply 608 generates a positive bias on metal seed layer 602 relative to counterelectrode 610. Tonically conductive electrolyte liquid 612 is located between counterelectrode 610 and cationic membrane 614. As depicted in FIG. 18A, a layer of electroplating accelerator 614 is globally present above metal seed layer 602 on top surface 616 of substrate 606. Cationic membrane 614 having contact surface 620 is pressed against top surface 616 of substrate 606. Electrolyte liquid (typically highly resistive solvent; e.g., deionized water) 622 is present in pockets 624 located between adjacent raised surfaces 626 of patterned membrane 614. Raised surfaces 626 of membrane 614, however, displace or otherwise dispel highly-resistive electrolyte liquid 622 away from top surface 616 of substrate 606. As a result, anodic dissolution of metal in metal seed layer 602 occurs primarily under membrane pockets 624, but anodic dissolution is highly impeded or does not occur at all under raised surfaces 626 of membrane 614 that are in contact with top surface 616 of substrate 606. In exemplary embodiments in accordance with the invention, cationic membrane 614 has a thickness indicated by double-arrow 630 of FIG. 18A of about 0.25 mm. Pockets (or hollows) 624 typically have a depth, indicated by double-arrow 632, in a range of about from 100 nm to 0.1 mm. The layer of electrolytic solution 612 between counterelectrode 610 and cationic membrane 614 typically has a thickness, indicated by double-arrow 634, in a range of about from 1 mm to 100 mm.

Cationic membranes, also known as proton exchange membranes, are known in the fields of fuel cell technology, medical dialysis and the chloro-alkali industry. A characteristic of the cationic membrane in accordance with the invention is the ability to transport protons and smaller cations ($A^+$), particularly small metal cations ($M^+$), away from the anodized substrate surface towards the counterelectrode, while substantially preventing the migration and diffusion of electrolyte anions from electrolyte solution 612 towards anodic substrate 606. The action of the electric field in combination with the properties of the membrane enable positive charge species to carry nearly all their current and enable substantially one-way transport of positive ions from anode to cathode, while simultaneously substantially preventing the migration of cations towards the anode due to migration (which would occur in the absence of the membrane). Hence, these membranes allow a cationic transference number approaching unity. The combination of the membrane properties and a large electric field generated from a highly resistive electrolyte allow maintains a substantial difference in ionic strength between the electrolyte side of the membrane and the anode side. See FIG. 18A.

Figure 18B:
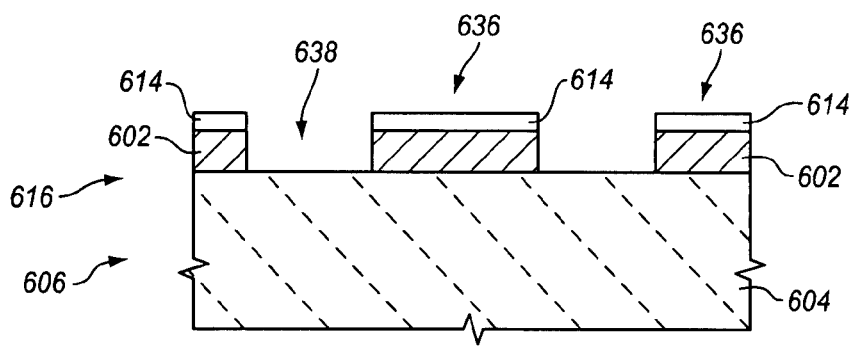
FIGS. 18B-18D depict schematically a sequence of process phases in which continuation of selective, patterned anodic dissolution and removal of portions of metal layer down towards the base dielectric layer produce a substrate with a top surface having a pattern of seed metal covered by accelerator, selectively accelerated plating is performed, and thereafter metal is removed from non-accelerated regions, resulting in isolation of metal features on the dielectric layer having a desired metal pattern.

As a result of anodic dissolution of metal as described with reference to FIG. 18A, portions of a previously deposited metal layer 602 (sometime referred to as a metal "seed" layer when it is quite thin) under pockets 624 are oxidized, dissolved in the electrolyte and are removed under the influence of the large electric field from substrate surface 616. In some embodiments, the electrolyte near the anode surface contains complexing or oxidizing agents to aid in the oxidation and dissolution of the metal ions. Also, portions of accelerator 614 adsorbed to metal seed layer 602 under pockets 624 are dislodged or otherwise freed from top surface 616 of substrate 606 along with the dissolved metal. When the accelerator or accelerator fragment is positively charged, it migrates though the membrane. Alternatively, the accelerator may complex with the metal ions or protons formed at the surface and be "dragged" across the membrane with them. As depicted in FIG. 18B, continuation of selective, patterned anodic dissolution and removal of portions of metal layer 602 down towards the base dielectric layer 604 produce a substrate 606 with a top surface 616 having an accelerated pattern region 636 of seed metal covered by accelerator 614. In some embodiments not all of the metal seed layer under pockets 624 is removed, rather only enough seed layer is removed (e.g., 10 nm) to dislodge the accelerator attached to it. Accelerated pattern regions 636 mirror the positive pattern of contact surface 620 of membrane 614, which corresponds to a desired metal pattern of an electronic device. Non-accelerated regions 638 are located on portions of substrate surface 616 at which selective patterned anodic dissolution occurred.

Figure 18C:
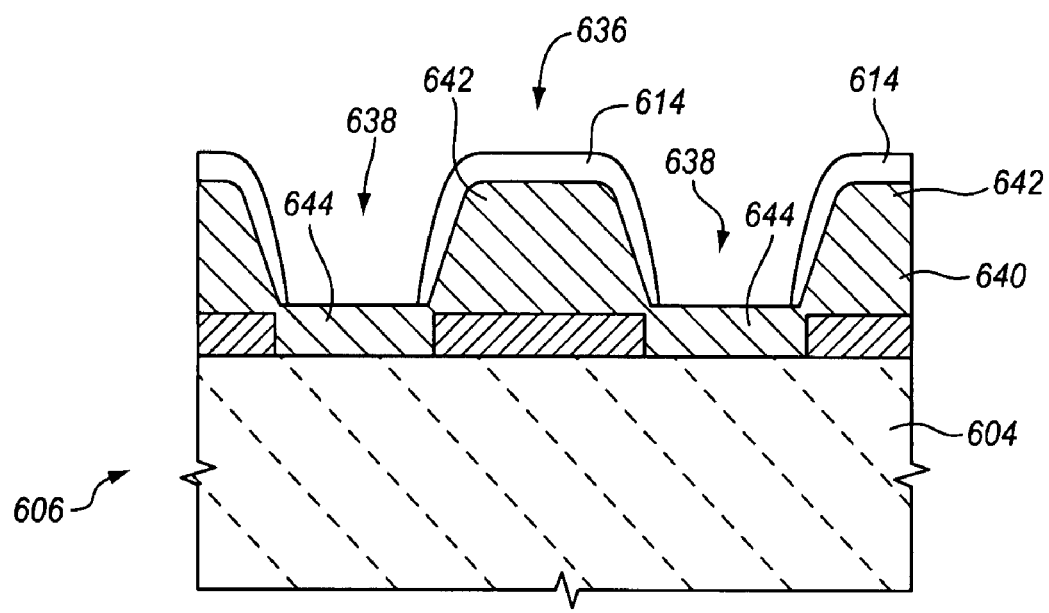
Figure 18D:
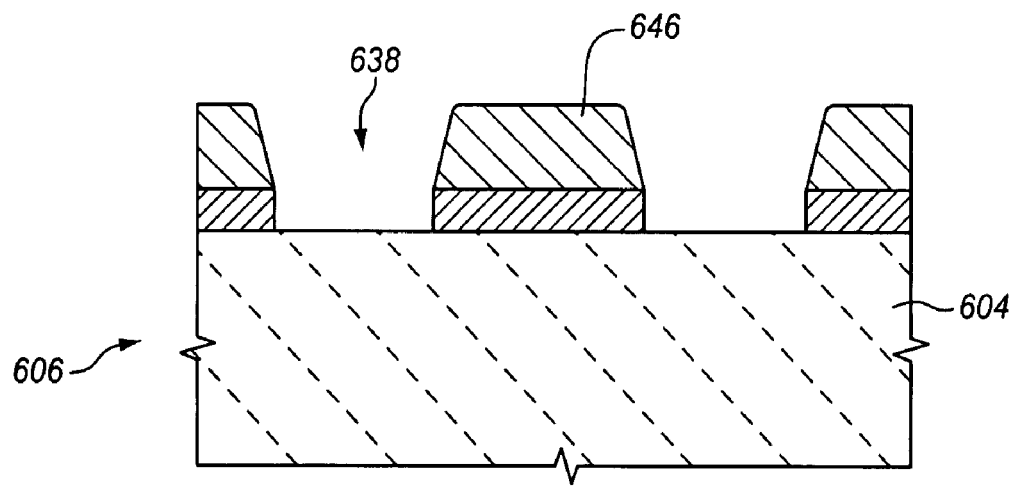

FIG. 18C shows a cross-sectional view of substrate section 606 after selective accelerated plating in accordance with the invention. As depicted in FIG. 18C, accelerator selectively attached in accelerated regions 636 increased a rate of metal plating in accelerated pattern region 636 relative to a rate of metal plating in non-accelerated regions 638. As a result, deposited metal 640 on substrate 606 has an embossed topography, with metal protrusions 642 corresponding to accelerated regions 636 of FIGS. 18B and 18C. Compared to metal protrusions 642, the thickness of the thinly deposited metal 644 in non-accelerated regions 638 is relatively thin. FIG. 18D depicts cross-sectional view of substrate 606 after metal has been removed from non-accelerated regions 638 of substrate 606, resulting in isolation of metal features 646 (e.g., conductive plugs) on dielectric layer 604 having a desired metal pattern. In some embodiments, an isotropic, kinetically-controlled wet-etching technique is used to remove deposited metal (FIG. 18C) substantially completely from non-accelerated regions 638, thereby forming metal structures 646 (FIG. 18D) in accordance with the invention.

Selective, patterned anodic dissolution and selective, patterned plating were discussed with reference to FIGS. 18A-18D to describe selective patterning of a global acceleration layer. It is understood that similar techniques are used in other embodiments to pattern selectively a global accelerator precursor, which is thereafter activated to form patterned accelerated regions. In other embodiments, selective, patterned anodic dissolution is conducted to pattern selectively a global layer of inhibitor, and the resulting selectively inhibited substrate is further processed by selectively inhibited electroplating techniques, as described above. In still other embodiments, a global layer of inhibitor precursor is selectively patterned by anodic dissolution, and thereafter the patterned inhibitor precursor is activated to form inhibitor regions.

Figure 19A:
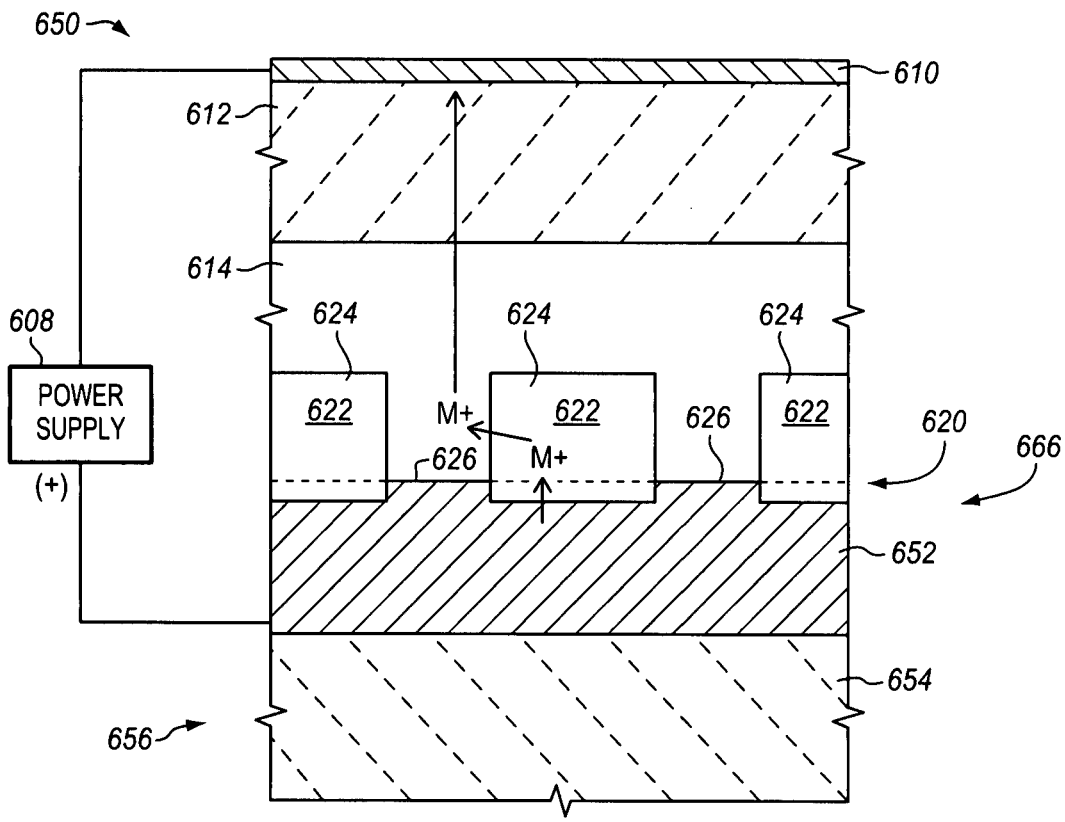
FIGS. 19A-19C depict schematically a sequence of process phases in accordance with the invention in which patterned anodic dissolution of a metal layer is performed to produce a metal layer having embossed topography on the substrate, thereafter metal is further removed from anodic-dissolution regions, resulting in isolation of metal features having a desired metal pattern.

In some embodiments, selective, patterned anodic dissolution of a global metal layer on a substrate is conducted to form a desired pattern of metal features directly. FIG. 19A depicts schematically a cross-sectional view of a system 650 in accordance with the invention during processes of anodic dissolution of a metal layer.

In system 650, global metal layer 652 located on base dielectric layer 654 of substrate 656 functions as an anode. Power supply 608 generates a positive bias on metal layer 652 relative to counterelectrode 610. Conductive electrolyte liquid 612 is located between counterelectrode 610 and cationic membrane 614. Cationic membrane 614 having contact surface 620 is pressed against top surface 666 of substrate 656. Highly-resistive electrolyte liquid (e.g., deionized water) 622 is present in pockets 624 located between adjacent raised surfaces 626 of membrane 614. Raised surfaces 626 of membrane 614, however, dispel highly-resistive electrolyte liquid 622 away from top surface 666 of substrate 656. As a result, anodic dissolution of metal in metal layer 652 occurs under membrane pockets 624, but anodic dissolution is suppressed or does not occur at all under raised surfaces 626 of membrane 614 that are in contact with top surface 666 of substrate 656. As a result of anodic dissolution of metal as described with reference to FIG. 18A, portions of metal layer 652 under pockets 624 are dissolved and removed from substrate surface 666.

Figure 19B:
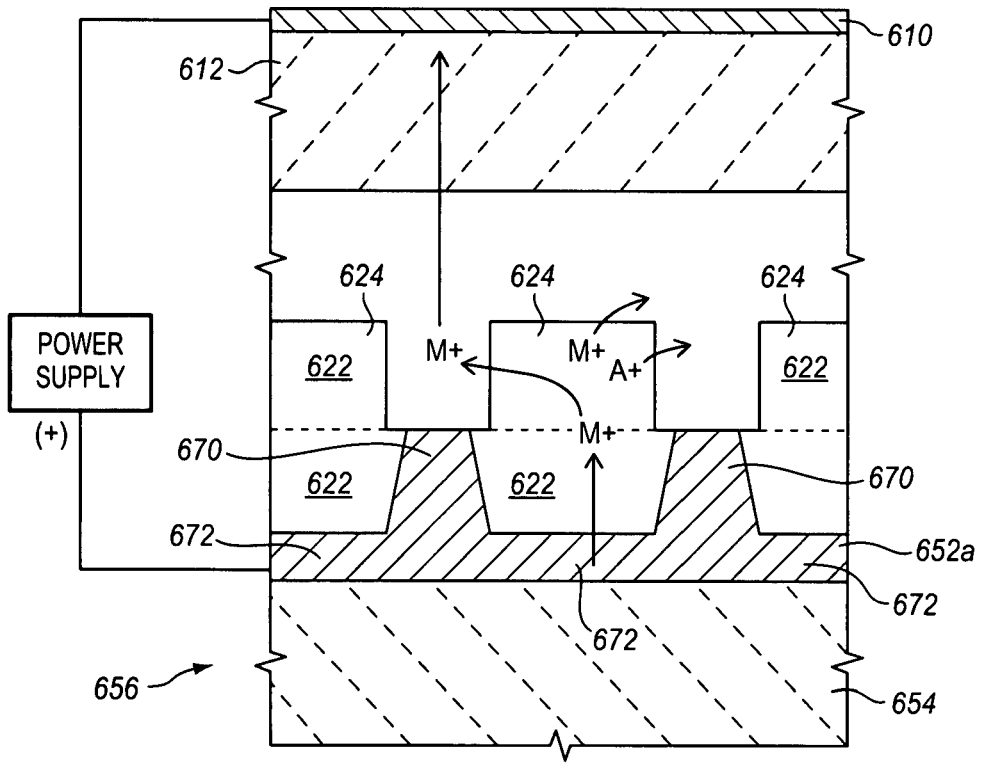

As depicted in FIG. 19B, continuation of selective, patterned anodic dissolution and removal of portions of metal layer 652 down towards base dielectric layer 654 produce a metal layer 652a having embossed topography on substrate 666. Metal layer 652a comprises metal protrusions 670 and thin metal regions 672. Thin metal regions 672 are located substantially under pockets 624, where the presence of highly-resistive electrolyte 622 allowed anodic dissolution. Thick metal protrusions 670 are located substantially under raised surfaces 626 of membrane 614, where the absence of highly-resistive electrolyte 622 substantially prevented anodic dissolution of metal. The topography of medal 652a mirrors approximately the positive pattern of contact surface 620 of membrane 614, which corresponds to a desired metal pattern of an electronic device.

Figure 19C:
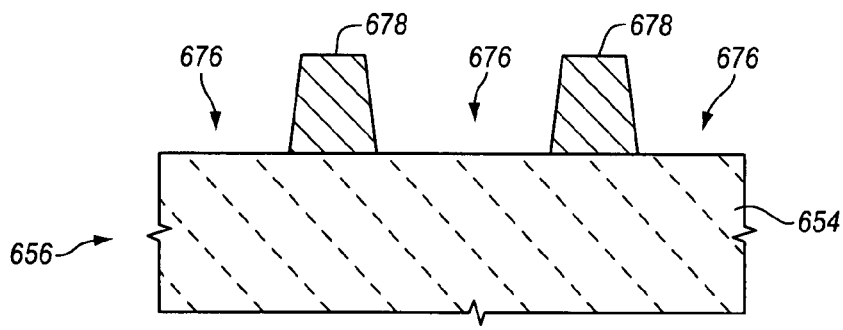

FIG. 19C depicts a cross-sectional view of substrate 656 after metal has been removed from anodic-dissolution regions 676 of substrate 656, which were located under pockets 624 (FIG. 19B). Removal of metal from anodic-dissolution regions 676 results in isolation of metal features 678 (e.g., conductive plugs) on dielectric layer 654 having a desired metal pattern. In some embodiments, an isotropic, kinetically-controlled wet-etching technique is used to remove a final, relatively small amount of deposited metal still connecting the features (FIG. 19B) substantially completely from anodic-dissolution regions 676, thereby completing the formation of metal structures 678 (FIG. 19C) in accordance with the invention.

Figure 20A:
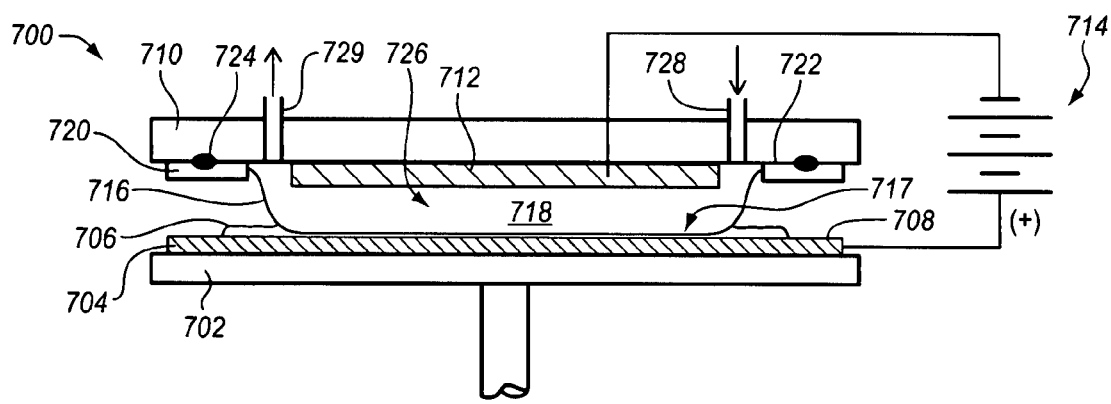
FIG. 20A depicts schematically a cross-sectional view of a system operable to conduct selective, patterned anodic dissolution in accordance with the invention.

FIG. 20A depicts schematically a cross-sectional view of a system 700 operable to conduct selective, patterned anodic dissolution in accordance with the invention. System 700 includes substrate holder 702 for holding a substrate 704. The substrate 704 contains metal (not shown), typically a global layer of metal, which functions as an anode during anodic dissolution (e.g., metal seed layer 602 in FIG. 18A and metal layer 652 in FIG. 19A). During anodic dissolution processes, preferably a layer of highly-resistive electrolyte 706 (e.g., deionized water) is located on at least a portion of top surface 708 of substrate 704 that is undergoing anodic dissolution. System 700 further includes mounting plate 710 located above substrate holder 702. System 700 includes counterelectrode 712 mounted on mounting plate 710 and located substantially opposite a substrate 704 on substrate holder 702. During anodic dissolution processes, a power supply 714 generates a positive bias in anode substrate 704. System 700 further includes cationic (proton exchange) membrane 716 located between counterelectrode 712 and anode substrate 704. Membrane 716 has a pattern-embossed contact surface 717, which contains a pattern (typically a positive) corresponding to a desired metal pattern of an electronic device. System 700 further includes conductive electrolyte 718 located between counterelectrode 712 and contact surface 717 of membrane 716. System 700 further includes clamp 720 located at the periphery of mounting plate 710 and which serves to clamp peripheral edges of membrane 716 to the bottom surface 722 of mounting plate 710. System 700 typically includes peripheral seal 724, which forms a liquid-tight seal of the inside space 726 between mounting plate 710 and membrane 716. As depicted in FIG. 20A, conductive electrolyte 718 is contained in liquid-tight space 726 between mounting plate 710 and membrane 716. System 700 also typically includes electrolyte inlet 728 and electrolyte outlet 729 communicating with inside space 726 through mounting plate 710.

During anodic dissolution processes, contact surface 717 is in contact with top surface 708 of anode substrate 704. As explained above with reference to FIGS. 18A-18C and 19A-19C, raised surfaces of contact surface 717 of membrane 716 substantially dispel highly-resistive electrolyte 706 away from substrate surface 708, while pockets between adjacent raised surfaces of contact surface 717 contain highly-resistive electrolyte liquid that is in contact with top surface 717. As a result, anodic dissolution of metal substrate surface 708 of substrate 704 occurs under membrane pockets, but anodic dissolution does not occur under raised surfaces of membrane 716 that are in contact with top surface 708 of substrate 704.

Figure 20B:
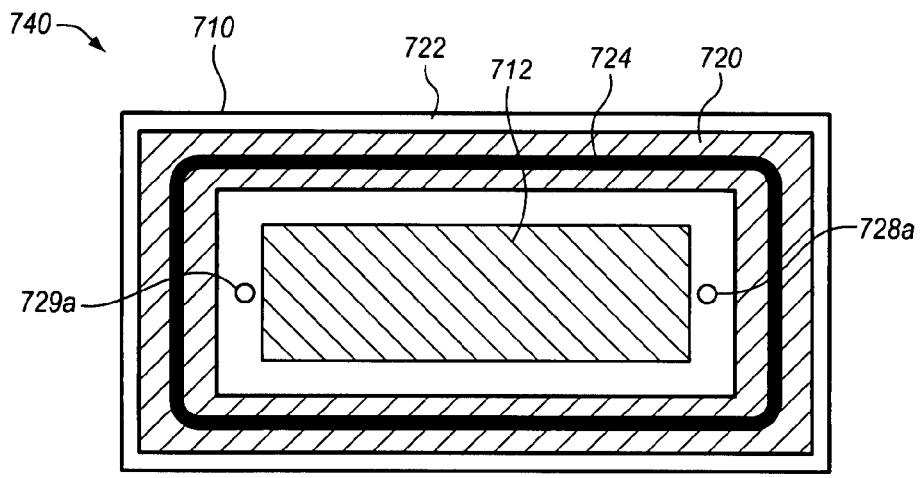
FIG. 20B depicts schematically a bottom-up view of the mounting plate and associated elements of the system depicted in FIG. 20A.

FIG. 20B depicts schematically a bottom-up view of mounting plate 710 and associated elements of system 700. FIG. 20B shows clamp 720 extending around the periphery of bottom surface 722 of mounting plate 710. Seal 724, as well as the periphery of a membrane 716 (not shown), is held against bottom surface 722 by clamp 720. Counterelectrode 712 is attached to bottom surface 722. FIG. 20B shows inlet hole 728a and outlet hole 729a, corresponding to inlet 728 and outlet 729, respectively, of FIG. 20A.

In some alternative embodiments, chemical oxidation (etching) is utilized in place of electrochemical oxidation, that is, in place of anodic dissolution. This approach offers certain advantages over electrochemical techniques because of the even further simplified apparatus required. On the other hand, a chemical oxidation technique typically requires more careful control. In an exemplary method that utilizes chemical oxidation, a microporous or nanoporous material, suitably processed to create a patterned stamp, or membrane, as described above, is impregnated with an etching solution. In some embodiments, this is accomplished by taking a dry piece of porous material and immersing it in an etching solution. In some embodiments, the porous material is exposed to the etching solution and allowed to exchange with the active chemical composition of the solution over an appropriate time period. Thereafter, the patterned stamp, or membrane, is placed onto the surface of the substrate and metal is preferentially oxidized at the locations where the stamp makes direct contact with the substrate surface. Due to the microporous nature of the stamp and associated surface tension effects, etching fluid does not appreciably flow outside of the stamp pattern itself, but rather is retained within the stamp and its patterned surfaces. Hence, only in the areas where actual physical contact is made is the etching agent delivered to the surface, where it reacts with metal to remove the metal.

In some embodiments, the functional part of the chemical oxidation stamp consists essentially of a cationic membrane material, such as NAFION®. Typically, one of the last steps in manufacturing a cationic membrane is to make the membrane acidic by treating it with a strong acid solution. Protons are thereby complexed to the polymer-bound tethered negative ions located within the membranes pores. In the case of NAFION®, sulphonic acid groups are tethered to a fluorinated polymeric backbone. Water used in the acidification step is removable by evaporation/drying, leaving the protons behind. This is the state in which most commercial cationic membranes are manufactured and supplied to customers. In some embodiments in accordance with the invention, the membrane is hydrated with solution containing an oxidizer and the membrane soaks up the solvent and oxidizer. Preferably, the oxidizer molecule is non-ionic and has a relatively small molecular size. An exemplary solution suitable for this step is a water/hydrogen peroxide solution. Hydrogen peroxide, neutral, very small and similar in size to water, enters into the pores of the membrane, hydrating the ions. When a patterned stamp containing the oxidizer is thereafter placed in contact with a substrate, oxidizer and protons are supplied to the surface from the membrane pores. While not bound by any theory, it is believed that the process progresses more or less by the following sequence of events. The oxidizer (e.g., hydrogen peroxide) oxides the surface to a surface oxide (e.g., copper forms cuprous and/or cupric oxide), preferentially, but not necessarily exclusively specific to the areas under the location of the "lands" (actual areas of contact by membrane to substrate); that is, some oxidizer may creep away from a land-contact area. Next, protons from the membrane react with the oxide, to form water and metal ion. As the metal reacts (i.e., etches), water and metal cations are produced. The protons for driving this reaction are spatially confined and limited because, being positively charged, they cannot easily diffuse very far from the membrane without leaving a large net negative charge behind in the membrane. Hence, they are substantially "bound" to the general vicinity of the membrane stamp, and more specifically to the vicinity of the stamp surface area that makes direct contact with the substrate surface. After protons have reacted with the oxide, the metal cations produced tend to diffuse into the membrane. The cations, being positively charged, are tethered to the general vicinity of the membrane and generally enter the membrane pores to maintain charge neutrality.

Typically, the techniques utilized to make a membrane ready for continuous use or for reuse include ion-exchange. The membrane is replenished with oxidizer and protons by exposure to one or more refreshing solutions; for example, one or more fresh solutions containing hydrogen peroxide and acid. Alternatively, the back of the membrane is exposed to a refreshing solution continuously, and a replenishment process occurs substantially in parallel with the etching process, only the replenishment is occurring through the backside of the membrane. The rate of replenishment and the amount of replenishment required depends on the membrane's capacity, thickness, temperature, and amount of metal being etched, along with other process-dependent parameters, as understood by one skilled in the field of chemical engineering.

Similar to electrochemical oxidation (anodic dissolution) approaches described above, several groups of approaches are suitable for using an etching membrane stamp to create isolated metal features, such as interconnect lines. In some embodiments, a membrane is used to remove substantially all metal of a metal layer, down to an underlying dielectric material, from areas in actual contact with the membrane. In such embodiments, metal remains in areas in which no actual contact is made; that is, metal remains between the areas where the patterned stamp-membrane features make contact with the surface. This technique has the advantage of not requiring a subsequent isotropic etching procedure. Nevertheless, due to the finite capacity of a membrane to supply etching reactants and to remove products (e.g., in the case of cation membranes, a finite capacity to supply oxidizer and protons and a finite capacity to hold metal-ion product), the reaction rate slows continuously as the membrane becomes depleted of reactants and full of reaction products. For similar reasons, some time is required to replenish a membrane after its use to make it ready for reuse.

Some embodiments include initially applying a global layer of substrate-treating species, particularly a pre-deposition agent, such as a deposition accelerator or deposition inhibitor, to a substrate surface. Thereafter, the substrate-treating species is removed selectively by placing an oxidizer-containing cationic patterned membrane in contact with the substrate surface. The substrate-treating species is dislodged selectively from the substrate surface where the oxidative etching occurs. Typically, only about 10 Å to 100 Å of metal need be removed to remove most or all of a surface-active pre-deposition agent in accordance with the invention. In embodiments involving a pre-electroplating agent, metal is thereafter selectively deposited on the workpiece substrate using an electroplating bath containing metal ions and other appropriate components as needed, such as suppressors, accelerators, and/or levelers, halagon ions, and acid or metal complexing agents. In other embodiments, selective metal deposition is performed using a suitable electroless plating process. An example of a suitable inhibitor of electroless copper-plating is benzotriazol.

After selective metal deposition results in formation of a metal deposit having topography, metal is removed (e.g., using an isotropic etch) completely from regions having less thickness to isolate metal structures in a desired pattern.

Figure 21A:
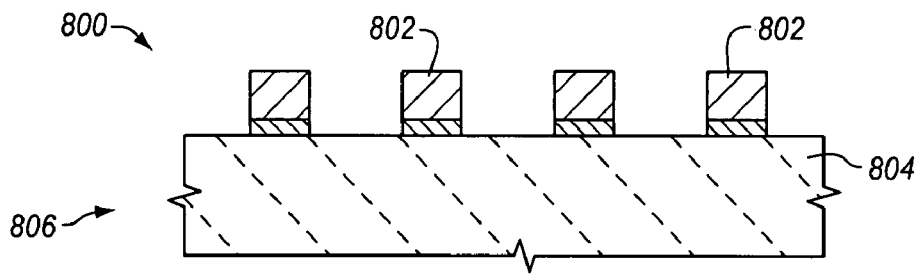
FIGS. 21A-21D depict schematically a sequence of intermediate process stages of a method of forming metal wiring in accordance with the invention without using photoresist processes.
Figure 21B:
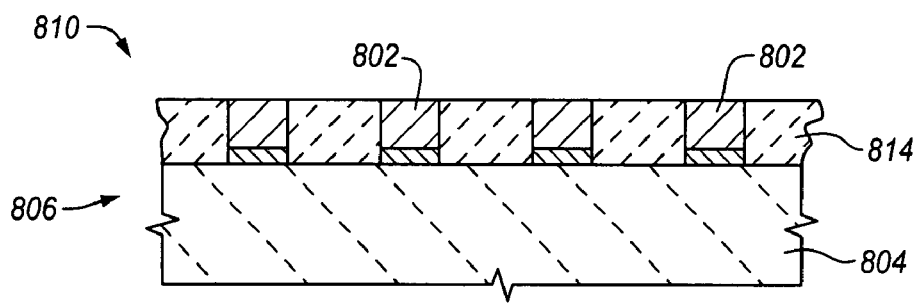
Figure 21C:
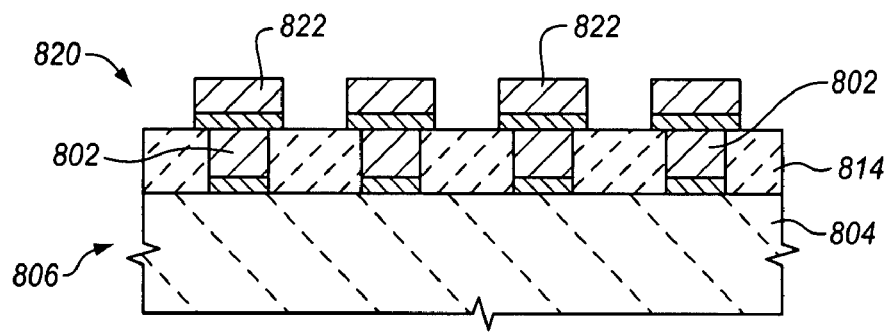
Figure 21D:
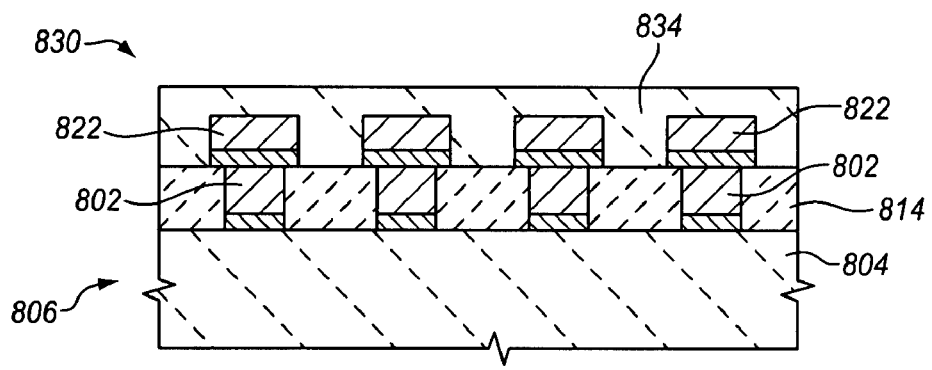

FIGS. 21A-D depict schematically a sequence of intermediate process stages of a method of forming metal wiring in accordance with the invention without using photoresist processes. FIG. 21A depicts an intermediate process stage 800 in which electrically isolated metal features (e.g., conductive plugs) of a desired metal pattern have been formed on a base dielectric layer 804 of a substrate 806 in accordance with the invention; for example, as described above with reference to FIGS. 2G, 3E, 4E, 5E, 10C, 11C, 12C, 18D, 19C. FIG. 21B depicts intermediate process stage 810 in which a second dielectric layer 814 has been deposited on substrate 806 to cover based dielectric layer 804 and to fill spaces between metal features 802. FIG. 21C depicts intermediate process stage 820 in which electrically isolated metal features 822 (e.g., metal lines) of a desired metal pattern have been formed on second dielectric layer 814 of a substrate 806 in electrical contact with metal features 802 in accordance with the invention. FIG. 21D depicts intermediate process stage 830 in which a third dielectric layer 834 has been deposited on substrate 806 to cover second dielectric layer 814 and to fill spaces between metal features 822.

Figure 22:
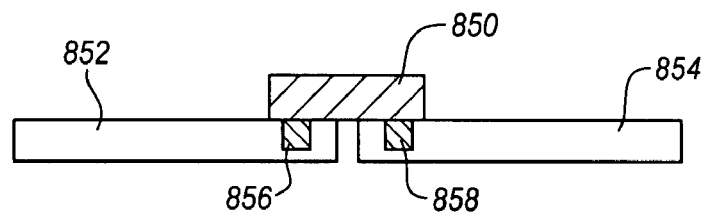
FIG. 22 depicts schematically a metal connector formed in accordance with the invention to connect electrically electronic devices having connector pads.

FIG. 22 depicts schematically metal connector 850 formed in accordance with the invention to connect electrically electronic device 852 with electronic device 854. Device 852 comprises connector pad 856 and device 854 comprises connector pad 858. Metal connector 850 electrically joining connector pads 856 and 858 is formed using one or more techniques in accordance with the invention, typically without using photoresist processes.

Figure 23A:
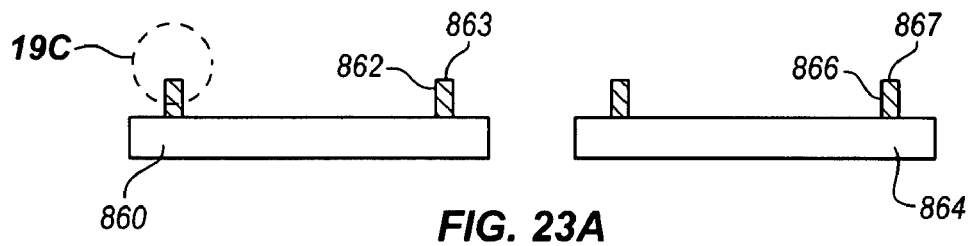
FIGS. 23A-23C depict schematically electrical connectors utilized to connect electronic devices and formed using one or more techniques in accordance with the invention, typically without using photoresist processes.
Figure 23B:
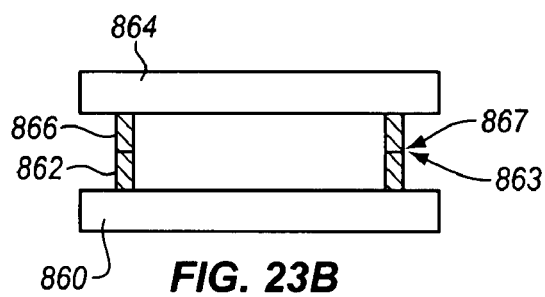
Figure 23C:
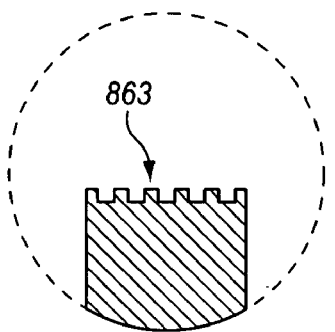

FIG. 23A depict schematically electronic device 860 having electrical connector 862 with pillar end 863, and electronic device 864 having electrical connector 866 with pillar end 867, of which electrical connectors 862, 866 have been formed using one or more techniques in accordance with the invention, typically without using photoresist processes. FIG. 23B depicts devices 860 and 864 being electrically connected through joining of electrical connector 862 with electrical connector 866. FIG. 23C depicts a blown-up view of connector end 863 (and 867) having a coarse, jagged pattern formed using techniques in accordance with the invention, typically without using photoresist processes. A patterned end 863 on a metal connector facilitates physical and electrical junctions between connectors 862 and 866.

FIG. 24A depict schematically a top view of an electronic device 876 having electrical connectors 872 with hollow space 873, and electronic device 874 having electrical rod-shaped connectors 876. Electrical connectors 872, 876 are formed using one or more techniques in accordance with the invention, typically without using photoresist processes. Electrical connectors 872 are formed in the shape of a hollow cylinder having hollow space 873. FIG. 24B shows a cross-sectional view of electronic device 870 having electrical connectors 872 with hollow space 873, and electronic device 874 having rod-shaped electrical connectors 876. FIG. 24C shows device 874 mounted on device 870. Rod-shaped connectors 876 of device 874 are inserted into hollow spaces 873 of connectors 872, resulting in coaxial electrical connections 878 between devices 870 and 874. In some embodiments, the outer diameter of the rod is slightly larger than the inner diameter of the hollow cylinders. Next, the hollow cylinders are heated to a temperature higher than their normal operating temperature to allow them to expand in diameter. This allows the rods to slide inside easily. Finally, the assembly is allowed to cool and the hollow cylinder inner diameter shrinks to make an electrical connection between rod and hollow cylinder that is permanent. This process does not require the use of lead or other solder, hence is environmentally benign, as well as providing a superior electrical connection.

As described with reference to FIGS. 23A-23C and 24A-24C, techniques in accordance with the invention of forming electrical connections between electronic devices provide alternatives to C4 chip mounting (Controlled Collapse Chip Connection), also known as "flip chip" mounting.

EXAMPLE 1

An exemplary embodiment of a method of forming a stamp in accordance with the invention suitable for selectively applying a substrate-treating species to a substrate surface is described herein with reference to FIGS. 6B-6E. It is understood that other embodiments in accordance with the invention are suitable for making a stamp.

A circular piece of blank (unpatterned) nanoporous material having a diameter of about 400 mm is fastened to a flat, circular polymeric support having a diameter of about 330 mm. The nanoporous membrane material is attached to the support by a circular ring that slides down around the outside edge of the circular support. One example of a suitable nanoporous membrane material is NAFION®, commercially available from Dupont. Another is resorcinol formaldehyde aerogel, as described in U.S. Pat. No. 4,873,218, issued Oct. 10, 1989, to Pekala, and in U.S. Pat. No. 4,997,804, issued Mar. 5, 1991, to Pekala, which are hereby incorporated by reference as if fully contained herein. NAFION® is prepared by the free radical copolymerization of tetrafluoroethylene and sulfonated comonomer. About 13 mole percent vinyl ether containing a pendant sulfonyl fluoride is utilized. The sulfonyl fluoride is hydrolyzed to the sulfonic acid once the polymer has been converted to membrane form. NAFION® has a wide range of pore sizes, with an average value on the order of 2 nm. A layer of RISTON® (DuPont) photoresist is applied to the blank surface of the membrane (FIG. 6B). A photolithographic mask having a desired metal wiring pattern for 300 mm integrated circuit wafer fabrication is used to expose the photoresist. Using conventional techniques, the layer of RISTON® is developed, the NAFION® is etched and the remaining RISTON® is stripped (FIGS. 6C-6E), thereby forming a patterned stamp in accordance with the invention.

Alternatively, an oxidative plasma etch as known in the art is used to pattern the blank stamp membrane.

EXAMPLE 2

A 300 mm semiconductor wafer is located face-up on a substrate holder. The wafer comprises a flat base dielectric $SiO_2$ layer covered by a smooth 40 nm copper seed layer. A patterned membrane stamp as described in Example 1 is attached by a circular clamp to a face-down stamping head having a diameter of 330 mm. The material composition of the stamping head is essentially porous polyvinylidene difluoride (PVDF). The stamping head contains an integral liquid reservoir having a total volume of about 200 ml containing 1 g/L MPSA in water accelerator solution. The stamping head is lowered so that the membrane make physical contact with the substrate with a pressure of approximately 1 psi for approximately 2 minutes to form an accelerated pattern region containing accelerator on the substrate (e.g., FIG. 2E).

Thereafter, the substrate surface is electrochemically plated in a copper plating apparatus for 60 seconds at 15 $mA/cm^2$ in a bath containing 50 ppm dimercaptopropane sulphonic acid, 50 g/L copper sulfate, 100 g/L sulfuric acid and 500 ppm L-92 polyetheylene oxide suppressor. The resulting plated substrate has an embossed metal layer containing protrusions in the accelerated pattern region and thinly-plated non-treated regions (e.g., FIG. 2F). Thereafter, isotropic wet etching of the substrate is conducted to remove metal from the thinly plated regions. The etching solution comprises about 3% by weight $H_2O_2$ and about 1% by weight glycine at a pH of about 8. After exposure to etching liquid for about 30 seconds, the substrate is rinsed with etch-quenching liquid (e.g., deionized water) for 10 seconds. The resulting structure has isolated metal wiring lines having a width of 30 μm and a height of about 2 μm located on the dielectric base layer (e.g., FIG. 2G).

EXAMPLE 3

A 300 mm semiconductor wafer is located face-up on a substrate holder. The wafer comprises a base dielectric $SiO_2$ layer covered by a 20 mm copper seed layer. A patterned membrane stamp as described in Example 1 is attached by a circular clamp to a face-down stamping head having a diameter of 330 mm, as described in Example 2. The stamping head contains an integral liquid reservoir having a total volume of about 600 ml containing 1 g/L 3-mercapto-1-butanol in water accelerator precursor solution. The stamping head is lowered so that the membrane make physical contact with the substrate with a pressure of approximately 1 psi for approximately 2 minutes to form a treated pattern region containing accelerator precursor on the substrate (e.g., FIG. 2H).

The accelerator precursor is converted to an active accelerator by converting the alcohol group to a sulfonic acid. This acidification is effected by exposing the substrate surface to 10% sulfuric acid at room temperature for about 1 minute.

Thereafter, the substrate surface is electrochemically plated in a copper plating apparatus for 60 seconds at 15 $mA/cm^2$ in a bath containing 50 ppm dimercaptopropane sulphonic acid, 50 g/L copper sulfate, 100 g/L sulfuric acid and 500 ppm L-92 polyetheylene oxide suppressor. The resulting plated substrate has an embossed metal layer containing protrusions in the accelerated pattern regions and thinly-plated non-accelerated regions (e.g., FIG. 2F). Thereafter, isotropic wet etching of the substrate is conducted to remove metal from the thinly plated regions. The etching solution comprises about 3% by weight $H_2O_2$ and about 1% by weight glycine at a pH of about 8. After exposure to etching liquid for about 30 seconds, the substrate is rinsed with etch-quenching liquid (e.g., deionized water) for 10 seconds. The resulting structure has isolated metal wiring lines having a width of 30 μm and a height of about 2 μm located on the dielectric base layer (e.g., FIG. 2G).

EXAMPLE 4

A 300 mm semiconductor wafer is located face-up on a substrate holder. The wafer comprises a base dielectric $SiO_2$ layer covered by a 20 mm copper seed layer. A patterned membrane stamp as described in Example 1 is attached by a circular clamp to a face-down stamping head having a diameter of 330 mm, as described in Example 2. The stamping head contains an integral liquid reservoir having a total volume of about 200 ml containing 1 g/L 6-mercapto-1-hexanol inhibitor in water solution. The stamping head is lowered so that the membrane make physical contact with the substrate with a pressure of approximately 1 psi for approximately 2 minutes to form an inhibited pattern regions containing inhibitor on the substrate (e.g., FIG. 5C).

Thereafter, the substrate surface is electrochemically plated in a copper plating apparatus for 60 seconds at 15 mA/cm2 in a bath containing 50 ppm dimercaptopropane sulphonic acid, 50 g/L copper sulfate, 100 g/L sulfuric acid and 500 ppm L-92 polyetheylene oxide suppressor. The resulting plated substrate has an embossed metal layer containing protrusions in the non-inhbited regions and thinly-plated regions in the inhibited pattern regions (e.g., FIG. 5D). Thereafter, isotropic wet etching of the substrate is conducted to remove metal from the thinly plated regions. The etching solution comprises about 3% by weight $H_2O_2$ and about 1% by weight glycine at a pH of about 8. After exposure to etching liquid for about 30 seconds, the substrate is rinsed with etch-quenching liquid (e.g., deionized water) for 10 seconds. The resulting structure has isolated metal wiring lines having a width of 30 μm and a height of about 2 μm located on the dielectric base layer (e.g., FIG. 5E).

EXAMPLE 5

To form a global layer of accelerator pre-deposition agent, a 300 mm wafer as described in Example 2 is sprayed with an accelerator solution containing 1 g/L MPSA in water for 1 minute. Then, the substratre is rinsed with deionized water.

Anodic dissolution is then utilized to modify the global layer of accelerator. The substrate is placed on the substrate holder of an anodic dissolution system as depicted in FIG. 20A. A layer of deionized water is applied to the substrate. A mounting plate having a counterelectrode and a patterned NAFION® cationic membrane as described with reference to FIGS. 20A and 20B is lowered to contact the top surface of the wafer substrate. An electrolyte solution containing 30 g/L copper sulfate and 10 g/L sulfuric acid is located in the space between the electrode and the cationic membrane.

Approximately 2 volts bias current is applied to the substrate for approximately 2 to 3 seconds, sufficiently to remove about 25 Å to 100 Å of metal seed layer. As described with reference to FIGS. 18A and 18B, the selective anodic dissolution removes both portions of the copper seed layer and accelerator attached to it, thereby creating accelerated pattern regions on the substrate, corresponding to the positive pattern of the cationic membrane.

Then, the substrate surface is electrochemically plated in a copper plating apparatus for 60 seconds at 15 mA/cm² in a bath containing 50 ppm dimercaptopropane sulphonic acid, 50 g/L copper sulfate, 100 g/L sulfuric acid and 500 ppm L-92 polyetheylene oxide suppressor. The resulting plated substrate has an embossed metal layer containing protrusions in the accelerated pattern regions and thinly-plated non-accelerated regions (e.g., FIG. 18C). Then, isotropic wet etching of the substrate is conducted to remove metal from the thinly plated regions. The etching solution comprises about 3% by weight $H_2O_2$ and about 1% by weight glycine at a pH of about 8. After exposure to etching liquid for about 30 seconds, the substrate is rinsed with etch-quenching liquid (e.g., deionized water) for 10 seconds. The resulting structure has isolated metal wiring lines having a width of 30 μm and a height of about 2 μm located on the dielectric base layer (e.g., FIG. 18D).

EXAMPLE 6

To form a global layer of accelerator, a 300 mm wafer as described in Example 2 is sprayed with an accelerator solution containing 1 g/L MPSA in water for 1 minute. Then, the substrate is rinsed with deionized water. The resulting substrate wafer with globally applied accelerator is placed on a substrate holder 1.0 cm beneath a patterned mask, as described with reference to FIG. 16A.

Parameters of a Xe—F excimer gas laser having a laser wavelength of 351 nm are selected to heat the substrate surface sufficiently to cause desorption of the accelerator from the substrate surface or to cause deactivation (destruction) of the accelerator present on the surface. The laser has a pulse width of 20 nanosecond (nsec) and a duty cycle of 90 percent. The laser beam has a 10 μm spot size and is applied at a power density of about $3\times10^{18}$ W/m³. The laser beam is scanned across the substrate surface to create a desired positive pattern of accelerator by selective laser ablation of the adsorbed accelerator. The relative movement of the laser beam relative to the substrate is controlled by a computer program. The laser pulses are overlapped to avoid undesired isolated missed spots.

Then, the substrate surface is electrochemically plated in a copper plating apparatus for 60 seconds at 15 mA/cm² in a bath containing 50 ppm dimercaptopropane sulphonic acid, 50 g/L copper sulfate, 100 g/L sulfuric acid and 500 ppm L-92 polyetheylene oxide suppressor. The resulting plated substrate has an embossed metal layer containing protrusions in the accelerated patern regions and thinly-plated regions in the non-accelerated regions from which accelerator was removed (e.g., FIG. 2F). Then, isotropic wet etching of the substrate is conducted to remove metal from the thinly plated regions. The etching solution comprises about 3% by weight $H_2O_2$ and about 1 % by weight glycine at a pH of about 8. After exposure to etching liquid for about 30 seconds, the substrate is rinsed with etch-quenching liquid (e.g., deionized water) for 10 seconds. The resulting structure has isolated metal wiring lines having a width of 30 μm and a height of about 2 μm located on the dielectric base layer (e.g., FIG. 3E).

The particular systems, designs, methods and compositions described herein are intended to illustrate the functionality and versatility of the invention, but they should not be construed to limit the invention to those particular embodiments. Systems and methods in accordance with the invention are useful in a wide variety of circumstances and applications to fabricate metal features embedded in a base layer of an electronic device. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. For example, a method involving global application of an accelerator precursor, selective application of a deactivator of an accelerator precursor to form a treated pattern region containing accelerator precursor, and subsequent activation of the accelerator precursor has not been explicitly described in this specification. Nevertheless, it is clear that such a method is within the scope of the invention as described above and defined in the claims below. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods and compositions described in the claims below and by their equivalents.

The invention claimed is:

1. A method of selectively removing portions of a metal layer from a substrate during fabrication of an electronic device, the method comprising:
    providing a counterelectrode above an additive layer above a metal layer located on a substrate surface, wherein the additive layer comprises accelerator;
    generating a positive voltage bias in said metal layer located on said substrate;
    providing a high-resistivity electrolyte liquid on said substrate surface;
    providing a cationic membrane;
    providing a low-resistivity electrolyte liquid between said cationic membrane and said counterelectrode;
    contacting said substrate surface with a contact surface of a cationic membrane, said contact surface comprising a membrane pattern comprising raised and recessed areas, the membrane pattern corresponding to said desired metal pattern, thereby substantially displacing said high-resistivity electrolyte liquid from said substrate surface and thereby forming a pocket of high-resistivity liquid electrolyte between said cationic membrane and said substrate corresponding to a negative portion on said membrane contact surface; and
    removing portions of the additive layer under the pocket by anodic dissolution.

2. The method of claim 1, wherein the additive layer comprises inhibitor.

3. The method of claim 1, wherein the additive layer comprises leveler.

4. The method of claim 1, further comprising, after removing the portions of the additive layer, plating metal on the substrate, thereby forming metal protrusions.

5. The method of claim 4, wherein topography of the metal protrusions mirrors topography of the contact surface.

6. The method of claim 4, wherein topography of the metal protrusions is inverse to topography of the contact surface.

7. The method of claim 4, further comprising removing metal between the metal protrusions.

8. The method of claim 7, wherein removing the metal between the metal protrusions comprises isotropic etching.

9. The method of claim 1, further comprising removing portions of the metal layer under the removed portions of the additive layer.

10. The method of claim 9, wherein removing the portions of the metal layer comprises anodic dissolution.

11. The method of claim 9, wherein removing the portions of the metal layer comprises isotropic etching.

12. The method of claim 9, wherein removing the portions of the metal layer continues until portions of a dielectric layer on the substrate under the metal layer are exposed.

13. A method of selectively removing portions of a metal layer from a substrate during fabrication of an electronic device, the method comprising:
    providing a counterelectrode above an additive layer above a metal layer located on a substrate surface;
    generating a positive voltage bias in said metal layer located on said substrate;
    providing a high-resistivity electrolyte liquid on said substrate surface;
    providing a cationic membrane;
    providing a low-resistivity electrolyte liquid between said cationic membrane and said counterelectrode;
    contacting said substrate surface with a contact surface of a cationic membrane, said contact surface comprising a membrane pattern comprising raised and recessed areas, the membrane pattern corresponding to said desired metal pattern, thereby substantially displacing said high-resistivity electrolyte liquid from said substrate surface and thereby forming a pocket of high-resistivity liquid electrolyte between said cationic membrane and said substrate corresponding to a negative portion on said membrane contact surface;
    removing portions of the additive layer under the pocket by anodic dissolution; and
    after removing the portions of the additive layer, plating metal on the substrate, thereby forming metal protrusions, wherein topography of the metal protrusions mirrors topography of the contact surface.

14. The method of claim 13, wherein the additive layer comprises inhibitor.

15. The method of claim 13, wherein the additive layer comprises leveler.

16. The method of claim 13, further comprising removing metal between the metal protrusions.

17. The method of claim 16, wherein removing the metal between the metal protrusions comprises isotropic etching.

18. The method of claim 13, further comprising removing portions of the metal layer under the removed portions of the additive layer.

19. The method of claim 18, wherein removing the portions of the metal layer comprises anodic dissolution.

20. The method of claim 18, wherein removing the portions of the metal layer comprises isotropic etching.

21. The method of claim 18, wherein removing the portions of the metal layer continues until portions of a dielectric layer on the substrate under the metal layer are exposed.

* * * * *